United States Patent
Takemura et al.

(10) Patent No.: US 7,495,943 B2
(45) Date of Patent: Feb. 24, 2009

(54) SEMICONDUCTOR MEMORY DEVICE

(75) Inventors: Riichiro Takemura, Tokyo (JP);
Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 97 days.

(21) Appl. No.: 11/655,945

(22) Filed: Jan. 22, 2007

(65) Prior Publication Data
US 2007/0268771 A1     Nov. 22, 2007

(30) Foreign Application Priority Data
Jan. 24, 2006    (JP) .................... 2006-014706

(51) Int. Cl.
*G11C 5/02*     (2006.01)
(52) U.S. Cl. .................... 365/51; 365/230.03; 365/63
(58) Field of Classification Search .................... 365/51, 365/230.03, 63, 49, 156, 189.03, 189.08, 365/92, 130, 132, 134
See application file for complete search history.

(56) References Cited

U.S. PATENT DOCUMENTS 5,966,316 A     10/1999   Tsukikawa
6,980,462 B1 *  12/2005   Ramesh et al. .............. 365/154
7,126,837 B1 *  10/2006   Banachowicz et al. ........ 365/63

FOREIGN PATENT DOCUMENTS

JP      11-145420 A     5/1999

* cited by examiner

*Primary Examiner*—Dang T Nguyen
(74) *Attorney, Agent, or Firm*—Miles & Stockbridge P.C.

(57) ABSTRACT

If memory cell blocks are laid out in a conventional manner to create a memory chip with a capacity of an odd power of 2 by using memory cells whose aspect ratio is 1:2, the chip will take a 1:1 shape and become difficult to enclose in a package of a 1:2 shape. In addition, such conventional layout of memory cell blocks to form the 1:2 shape causes the area of a peripheral circuit region to be limited by the memory blocks, pads to be arranged collectively in the central section of the chip, and wiring to become dense during the enclosure of the chip in the package.

In this invention, therefore, four memory blocks, BANK0, BANK1, BANK2, BANK3, BANK3, are constructed into an L shape and then these memory blocks are properly combined and arranged to construct a chip of nearly a 1:2 shape in terms of aspect ratio.

8 Claims, 41 Drawing Sheets

4BANK

8BANK

8BANK

SEMICONDUCTOR MEMORY DEVICE

CLAIM OF PRIORITY

The present application claims priority from Japanese application JP 2006-014706, filed on Jan. 24, 2006, the content of which is hereby incorporated by reference into this application.

BACKGROUND OF THE INVENTION

1. Field of the Invention

The present invention relates to semiconductor memory devices and, more particularly, to methods for arranging a memory array, and methods for controlling the memory array.

2. Description of the Related Art

A memory cell in a dynamic random-access memory (DRAM) is formed of a capacitor that stores information as an electrical charge and a transistor that is used as a selector switch disposed between the capacitor and a bit line. In a conventional memory array of a folded bit line scheme, the minimum size of the memory cell is $8F^2$, that is, 2F in a bit line direction multiplied by 4F in a word line direction, and the memory cell has a 1:2 shape in terms of the aspect ratio of the bit line direction to the word line direction. A character F in this case refers to the minimum process dimension and is expressed as ½ of a bit line pitch or a word line pitch, which is smaller one of the bit line pitch and the word line pitch. Conventionally, DRAMs having memory cells of the 1:2 shape have increased in capacity, from 4 Mbytes, 16 Mbytes, to 64 Mbytes, by a factor of four for each generation. These capacities, if expressed as 4 Mbytes=$2^{22}$, 16 Mbytes=$2^{24}$, and 64 Mbytes=$2^{26}$, respectively, in the format of a factorial of 2, have all been even powers of 2, that is, $2^{2n}$ (n: natural number). Since the memory cells themselves take the 1:2 shape in terms of aspect ratio, if the memory cells of a DRAM chip with a capacity of $2^{2m}$ are formed, the entire DRAM chip including memory arrays take the 1:2 shape, as shown in FIG. 45B. Accordingly, the 1:2 shape has been maintainable to obtain a capacity four times as large as that of the predecessor on a generation basis by finer-structuring.

The slowdown of the finer-structuring which has supported development of larger-capacity memory chips has come to reduce the development pace of these memory chips. At the same time, DRAMs improved in capacity by twice, that is, odd powers of 2, for each generation have come to be developed, and 128 Mbytes and 512 Mbytes are examples of such DRAMs. Memory chips with these capacities, unlike the above-mentioned chips of the even powers of 2, each have $2^{2n+1}$ memory cells arranged, so 128 Mbyte and 512 Mbyte memory chips have a 1:1 or 1:4 shape, as shown in FIGS. 48A and 48B. It is desirable that the capacity of a DRAM chip be increased without changing the external geometry of its package so that the capacity per dual-inline memory module (DIMM) can be increased and so that the number of memory cells mounted can be maintained.

However, since memory chips with a capacity of an even power of 2 have a 1:1 or 1:4 shape, these chips become twice as great as the conventional ones of the 1:2 shape in terms of short-side or long-side length. Accordingly, use of the most advanced processes causes package to be oversized in short-side or long-side length, and hence, difficulty in enclosing DRAM chips in a package that contains DRAM chips which are one generation older. In addition, if the miniaturization of processes is accelerated to a level that allows chip to be enclosed in the package, chips that are twice or more in capacity will be enclosable.

FIGS. 48A and 48B show examples of the layout of memory blocks in a memory chip similar to that whose memory blocks are arranged to obtain a capacity of an even power of 2. In these examples, as discussed above, the chip has a 1:1 shape in terms of the aspect ratio as shown in FIG. 48A, or a 1:4 shape as shown in FIG. 48B. The chip has the same capacity as a chip having a short-side or long-side length twice as long as that of the abovementioned chip, thus becoming difficult to package.

In contrast to the above, FIG. 47 shows a chip split into 3×3 regions with a peripheral circuit region disposed centrally therein and a memory block in each of the remaining eight regions around the peripheral circuit region in order to obtain a 1:2 chip shape (refer to Japanese Laid-Open Patent Application Publication No. Hei 11-145420 for further details). In this configuration, the chip has the peripheral circuit region concentratedly disposed centrally therein. Since the area of the peripheral circuit region is determined by the total area of the surrounding memory cell blocks, if the number of circuit elements in the peripheral circuit region is too small, an unnecessary region is included, whereas if the number of circuit elements is too much, not all of elements can be arranged in the central region of the chip and thus the need arises for part of the elements to be arranged between memory blocks. Since pads are also arranged concentratedly in the central region, when the chip is packaged, lead frame wiring and bonding wires to the package pins will be concentrated, resulting in complex wiring.

SUMMARY OF THE INVENTION

An object of the present invention is to realize a chip shape with an aspect ratio of 1:2 in a memory chip which uses memory cells with an aspect ratio of 1:2 and has a capacity of an odd power of 2, or to realize a chip shape with an aspect ratio of 1:2 in a memory chip which uses memory cells with an aspect ratio of 1:2 and has a capacity of an even power of 2.

Major techniques for fulfilling the above object of the present invention are described below.

The object of the present invention can be fulfilled by providing a semiconductor memory device that includes: a plurality of word lines; a plurality of bit lines each intersecting with one of the plurality of word lines; a plurality of memory cells each disposed at a desired crossing point between one of the plurality of word lines and one of the plurality of bit lines; first and second memory arrays of a rectangular shape, each including the plurality of memory cells, both the memory arrays having a first memory capacity; third and fourth memory arrays of a rectangular shape, each including the plurality of memory cells, both the third and fourth memory arrays having a second memory capacity smaller than the first memory capacity; a first memory block having the first and third memory arrays; a second memory block having the second and fourth memory arrays; and first and second bank addresses for selecting the first and second memory blocks, respectively.

In this configuration, the first memory block forms an L-shape by being disposed such that the third memory array has one side shorter than and opposed to one side of the first memory array, and the second memory block forms an L-shape by being disposed such that the fourth memory array has one side shorter than and opposed to one side of the second memory array. In addition, the third and fourth memory arrays are arranged between the first and second memory arrays such that respective long sides of the third and fourth memory arrays face each other, and the first and second memory blocks are arranged so as to be point-symmetrical with respect to each other.

That is to say, the object of the present invention can be fulfilled by constructing each of the plural memory blocks forming a memory chip and being formed into an L-shape, combining the L-shaped memory blocks, and disposing a peripheral circuit region in a central zone of the memory chip.

The present invention makes it possible to realize a chip shape with an aspect ratio of 1:2 in a memory chip having a memory cell with an aspect ratio of 1:2 and having a capacity of $2^{2n+1}$, and enclose this memory chip in a package having essentially the same shape as that obtained using the foregoing conventional technique. In addition, disposing a control circuit and the like in a central zone of the memory chip makes it possible to form a peripheral circuit region variable in area and thus to reduce the chip area.

DETAILED DESCRIPTION OF THE PREFERRED EMBODIMENTS

Embodiments of the present invention will be described in detail below using the accompanying drawings.

First Embodiment

Figure 1:
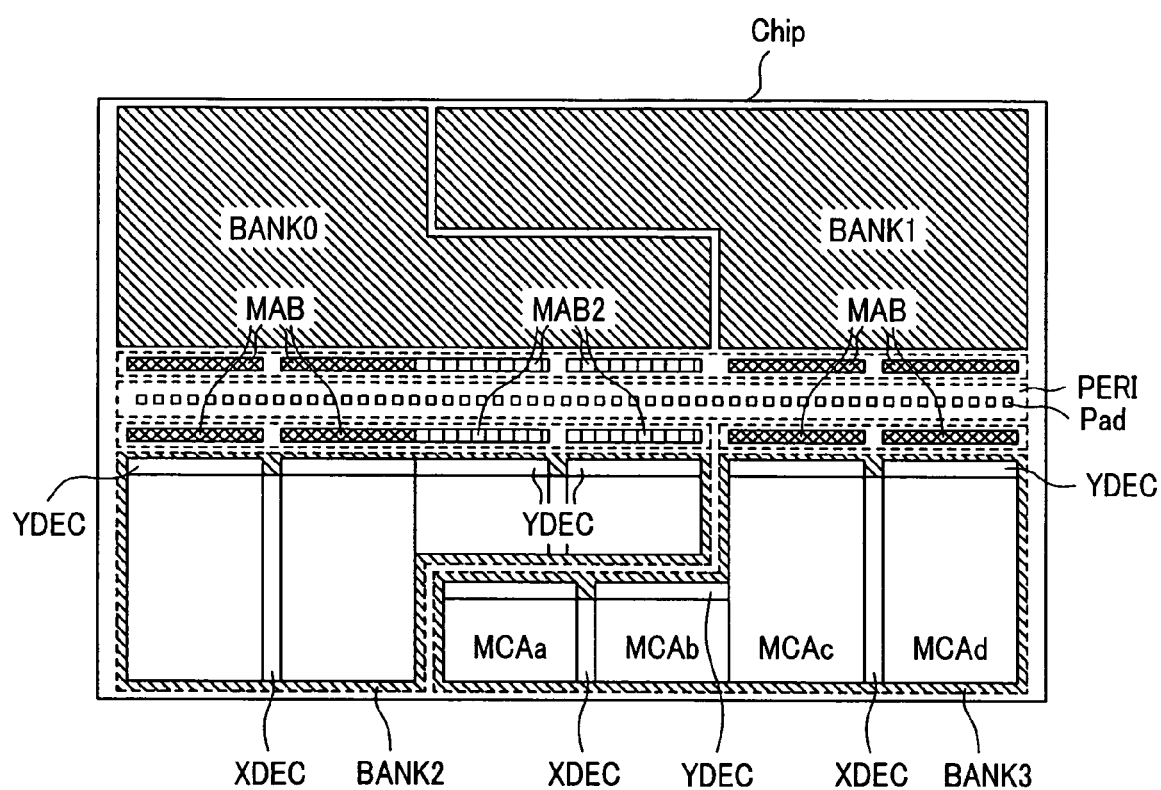
FIG. 1 is a layout view of memory blocks disposed in a chip according to a first embodiment of the present invention.

FIG. 1 is a diagram showing a first embodiment of the present invention. FIG. 1 assumes that a memory chip with a capacity of an odd power of 2, for example, 2 Gbytes ($=2^{31}$), is constructed using memory cells that take a memory cell layout aspect ratio of 1:2 and have an area of $8F^2$ when a minimum process dimension is taken as F (½ of a bit line pitch or a word line pitch, which is smaller one of the bit line pitch and the word line pitch). The same also applies when a memory chip with a capacity of an even power of 2, for example, 1 Gbytes ($=2^{30}$), 4 Gbytes ($=2^{32}$), is constructed using memory cells that take a memory cell layout aspect ratio of 1:1 and have an area of $4F^2$. A structural feature of the present embodiment is that under the above assumption, a chip shape close to that of a 1:2 aspect ratio which makes the chip easily enclosable in a package can be achieved by disposing one bank formed into an "L" shape. The chip shown in FIG. 1 includes four independent memory blocks, namely, BANK0, BANK1, BANK2, and BANK3. The chip also includes a peripheral circuit region PERI, in which an input/output block, a data control block, an internal power supply voltage output circuit, a clock synchronizing circuit, a test circuit, and more are arranged. In addition, the chip includes main amplifier blocks MAB1 and MAB2 adapted to output internal data of each memory block to the peripheral circuit region PERI. For the memory blocks BANK0 and BANK0, only shapes thereof are shown in FIG. 1.

Figure 39A:
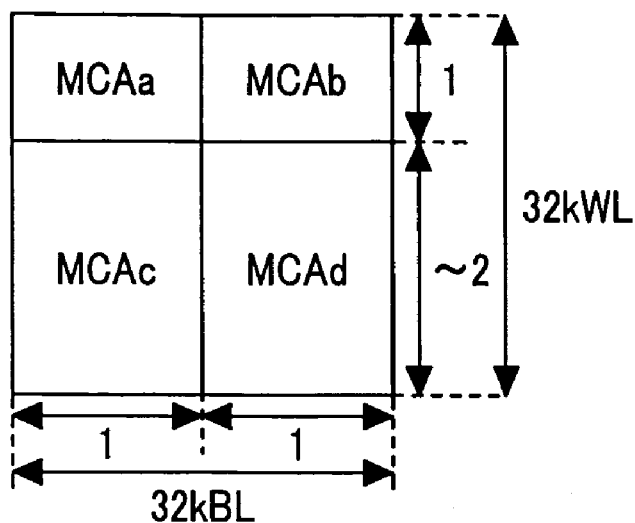
FIG. 39 is a diagram schematically showing another memory block splitting scheme.

Layout of internal memory cell arrays is shown for the memory blocks BANK2 and BANK3. Layout patterns of internal memory cell arrays in the memory blocks BANK0 and BANK0 are the same as those of the memory blocks BANK2 and BANK3. Each memory block is split into four memory cell arrays, MCAa, MCAb, MCAc, MCAd. How the memory blocks are each split into these memory cell arrays is shown in FIG. 39A. FIG. 39A shows a splitting method for a memory block having 32 k word lines (WLs) and 32 k bit lines (BLs). For a folded memory cell array of an $8F^2$ memory cell size, this memory block has a capacity of 32 k×32 k÷2=512 Mb. As shown, the memory cell arrays MCAa, MCAb have the same number of word lines.

The memory cell arrays MCAc, MCAd have about twice the number of word lines on the memory cell array MCAa, MCAb. The memory cell arrays MCAa, MCAb also have the same number of bit lines. In addition, the memory cell arrays MCAC, MCAd have the same number of bit lines. It becomes possible, by splitting one memory block at a rate of about 1:2 in this way, to form each of the memory blocks BANK0, BANK0, BANK2, and BANK3, into an L-shape (or into an inversed or rotated form of L). The region constituted by the memory blocks BANK0, BANK1 in this case takes a shape with an aspect ratio of about 1:4, and combining these memory blocks with the remaining memory blocks BANK2, BANK3 makes a chip shape of about 1:2 achievable.

Figure 2:
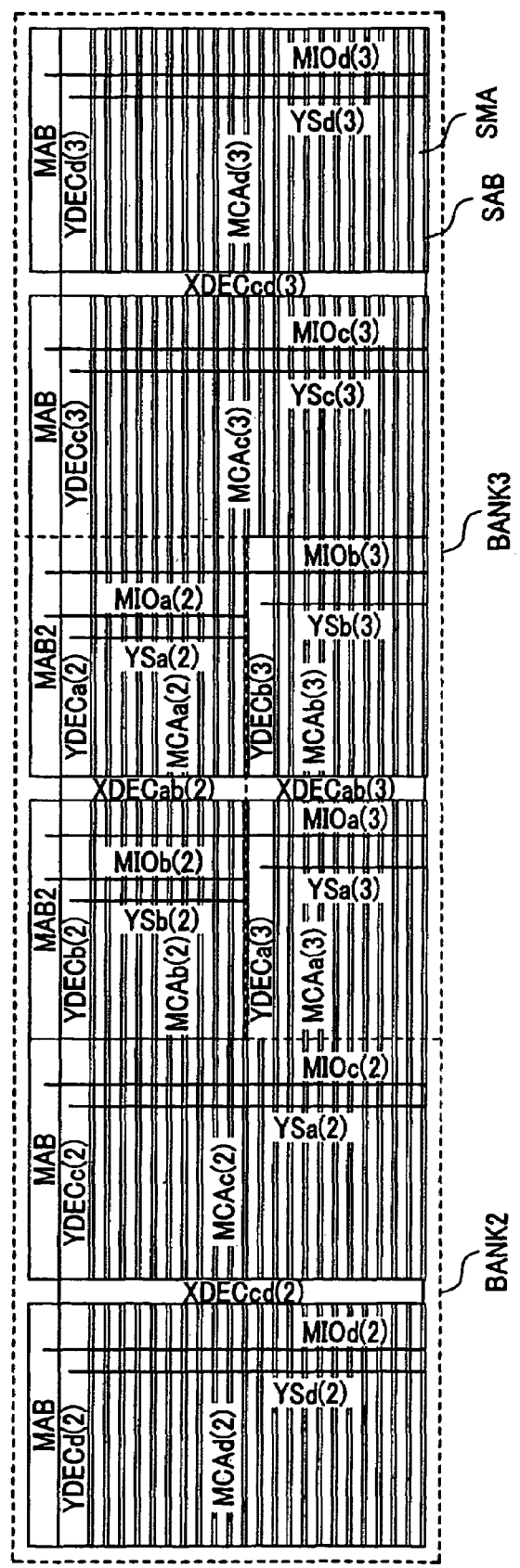
FIG. 2 is a diagram showing memory blocks 2, 3 according to the first embodiment of the present invention.

FIG. 2 shows an example of an array configuration which presupposes a multi-segment bit line arrangement of the memory blocks BANK2, BANK3 in the chip. As shown in FIG. 39A, the number of word lines in the memory arrays MCAa and MCAb is twice that of the memory arrays MCAc and MCAd. Accordingly, in the multi-segment bit line arrangement with the bit lines split so that each memory cell array is split into sub-memory arrays SMAs for each predetermined number of word lines, the number of sub-memory arrays in the memory cell arrays MCAc and MCAd each is also about twice that of the memory cell arrays MCAa and MCAb each. In FIG. 2, the number of sub-memory arrays SMAs in the memory cell arrays MCAc and MCAd each is 10, whereas that of the memory cell arrays MCAc and MCAd each is 22. The number of sub-memory arrays is not limited to these values. A bit line ratio of about 1:2 is one feature of the present embodiment. A sense amplifier block SAB in which a plurality of sense amplifiers each connected to each bit line or for each pair of bit lines are arranged is interposed between the sub-memory arrays SMAs.

Next, a description will be given with attention focused on the memory block BANK3. Other memory blocks are also of the same configuration.

An X-decoder XDECab(3) for selecting an associated word line from an X-address that has been input is disposed between memory cell arrays MCAa(3) and MCAb(3). The X-decoder XDECab(3) simultaneously activates the memory cell arrays MACa(3) and MACb(3) arranged at both sides of the X-decoder. Similarly, an X-decoder XDECcd(3) for selecting an associated word line from an X-address that has been input is disposed between memory cell arrays MCAc(3) and MCAd(3). The X-decoder XDECcd(3) simultaneously activates the memory cell arrays MCAc(3) and MCAd(3) arranged at both sides of the X-decoder XDECcd(3). At this time, since the memory cell arrays MCAa(3), MCAb(3), MCAc(3), MCAd(3) are of the same memory block, one specific word line WL is selected from XDECab(3) and XDECcd(3), for MCAa(3) and MCAb(3) or MCAc(3) and MCAd(3).

That is to say, a word line is not selected from both XDECab(3) and XDECcd(3) at the same time. A Y-decoders YDECa(3), YDECb(3), YDECc(3), and YDECd(3), each for selecting a Y-selection line YSa(3), YSb(3), YSc(3), and YSd (3), respectively, from a Y-address that has. been input, are disposed on one side of the memory cell array MCAa(3), MCAb(3), MCAc(3), and MCAd(3), respectively, the Y decoders being each adjacent to and orthogonal to the associated X-decoder. The Y-decoders YDECc(3) and YDECd(3) are arranged in one line (on one virtual line) common to Y-decoders YDECa(2) to YDECd(2) that are associated with the memory block BANK2. The Y-decoders YDECa(3) and YDECb(3) are arranged in one line different from that of the Y-decoders YDECa(2) to YDECd(2). The Y-decoders YDECa (3), YDECb(3) are activated only when any word line is selected from the X-decoder XDECab(3), and are not activated when a word line is selected from the X-decoder XDECcd(3). Conversely, the Y-decoders YDECc(3), YDECd (3) are activated only when any word line is selected from the X-decoder XDECcd(3), and are not activated when a word line is selected from the X-decoder XDECab(3). The main amplifier blocks MABs with main IO lines MIOc(3) and MIOd(3) respectively connected thereto for transferring, among all outgoing data from the memory cell arrays YDECd (3), YDECd(3) to the sense amplifiers SAs, only data that has been selected via a Y-selection line, are arranged on sides opposed to sides adjacent to the memory cell arrays.

Main IO lines MIOa(3) and MIOb(3) that are each connected at one end to the memory cell arrays MCAa(3) and MCAb(3), respectively, are each connected at the other end to the main amplifier block MAB2 adjacent to the main amplifier blocks MABs. In this case, wiring is conducted midway on the memory cell arrays MCAa(2), MCAb(2) of the adjacent memory block BANK2, and the wiring is provided simply as pass-through wiring. In this configuration, although a wiring load differs between the main IO lines MIOa(3), MIOb(3), and MIOc(3), MIOd(3), no problems occur since larger signals can be generated in the main IO lines MIOa(3) and MIOb(3) by driving the main amplifier in the timing that high enough signals are output through the main IO lines MIOc(3) and MIOd(3) that are large in wiring load. In the main amplifier blocks MABs and MAB2, as with those of the foregoing Y-decoder, the main amplifier block MAB2 is activated when a word line is selected from the X-decoder XDECab(3), and is not activated when a word line is selected from XDECcd(3). Conversely, the Y-decoder main amplifier blocks MABs are activated when a word line is selected from the X-decoder XDECcd(3), and are not activated when a word line is selected from XDECab(3). The main amplifier block MAB2 is likewise activated by selection of a word line associated with the memory cell array MCAa(2), MCAb(2) of the memory block BANK2 adjacent to the memory block BANK3.

Figure 3:
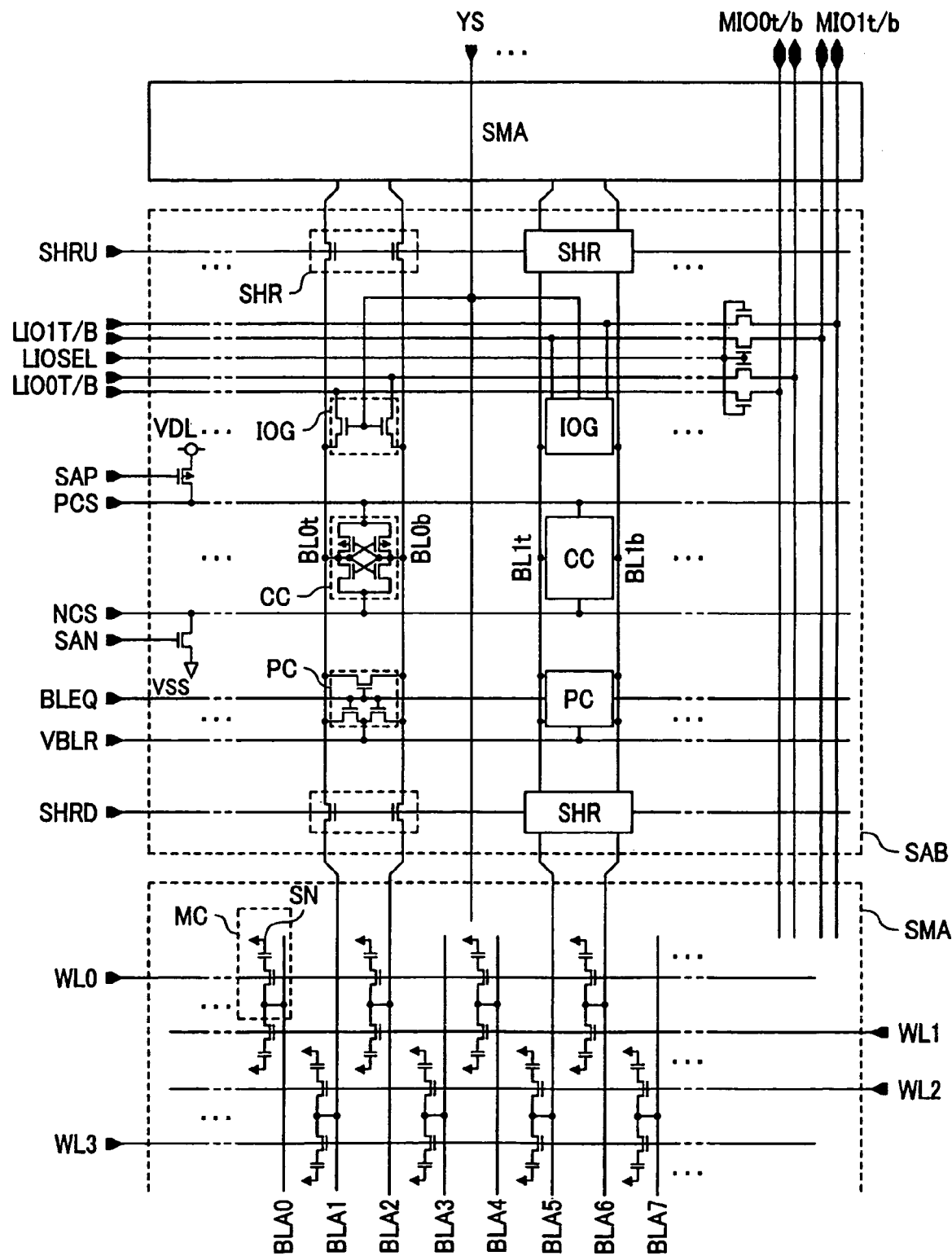
FIG. 3 is a main circuit diagram of the sense amplifier block according to the first embodiment of the present invention.

Next, a configuration of the sense amplifier block SAB is described below using FIG. 3. FIG. 3 shows a main section of the sense amplifier block disposed between the sub-memory arrays SMAs. In sense amplifiers of the sense amplifier block SAB, about half of bit lines (BLA0, BLA1, etc up to BLAn) of the sub-memory arrays SMAs are pulled out and connected to the sense amplifier block. In the sense amplifier block SAB, each of two of bit lines that have been read out are connected to each sense amplifier circuit. The sense amplifier section includes: shared gates SHR controlled by selection signals SHRU and SHRD and used to select bit lines of the sense amplifier circuit and of either one of two sub-memory arrays SMAs adjacent to the shared gates; prechargers PCs controlled by a bit line precharger signal BLEQ and used to set the bit lines to a desired precharging level; cross couplers CCs for amplifying very weak signal voltages between bit line pairs to an array voltage (VDL); and IO gates IOGs for reading out data held by the cross couplers CCs onto local IO lines LIO0t/b, LIO1t/b via a Y-selection line, the local IO lines LIO0t/b, LIO1t/b being connected to main IO lines MIO0t/b, MIO1t/b, respectively, by an LIO selection signal LIOSEL. Next, configuration of each circuit is described below by way of example. Each cross coupler CC includes one pair of NMOSs sharing a source electrode and having a gate and drain electrodes connected to a drain and gate electrodes of the other NMOS, respectively, and one pair of PMOSs sharing a source electrode and having a gate and drain electrodes connected to a drain and gate electrodes of the other PMOS, respectively. The source of the NMOS pair and that of the PMOS pair are connected to an NMOS common source line NCS and a PMOS common source line PCS, respectively, in common in each cross coupler CC of the sense amplifier block SAB. The common source lines NCS and PCS are connected to power supplies VSS and VDL through sense amplifier enable signal lines SAN and SAP, respectively. Each precharger PC includes a switch controlled by the precharger signal BLEQ and supplying the bit line precharging level to the bit lines, and a switch for providing an electrical short-circuit between bit line pairs. Each IOG includes a switch controlled by a column selection signal to establish connection between the input/output lines LIOt/b and the bit lines. Each shared gate SHR includes switches each controlled by shared gate signals SHRU and SHRD and arranged between a bit line of the sense amplifier block, such as BLI0t/b or BL1t/b, and a bit line of the array block, such as WLA0 or WLA1. The circuit configuration of the sense amplifier block SAB is not limited to the above and can be any other circuit configuration with substantially the same functionality.

Figure 31A:
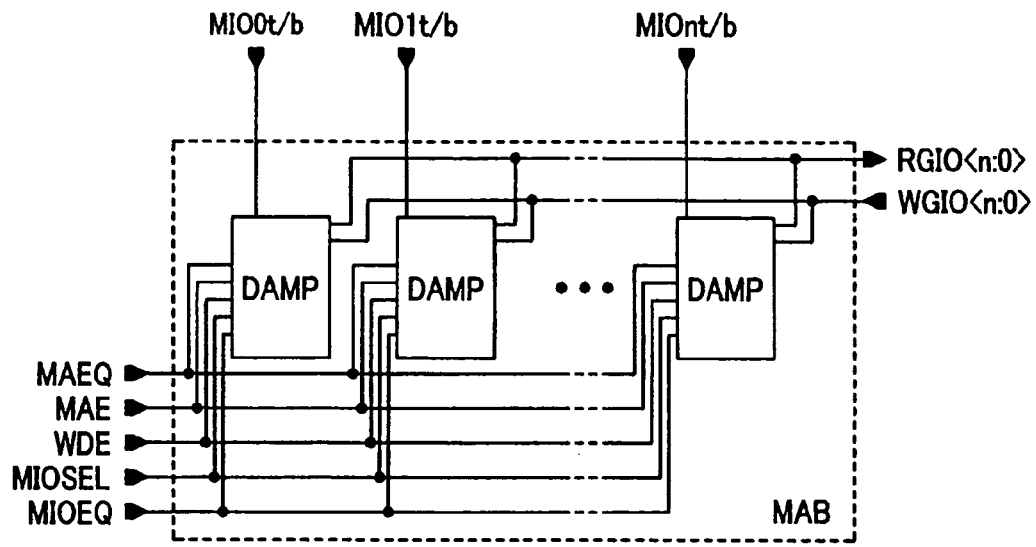
FIG. 31 shows an example of main circuit configuration of a main amplifier block.
Figure 33:
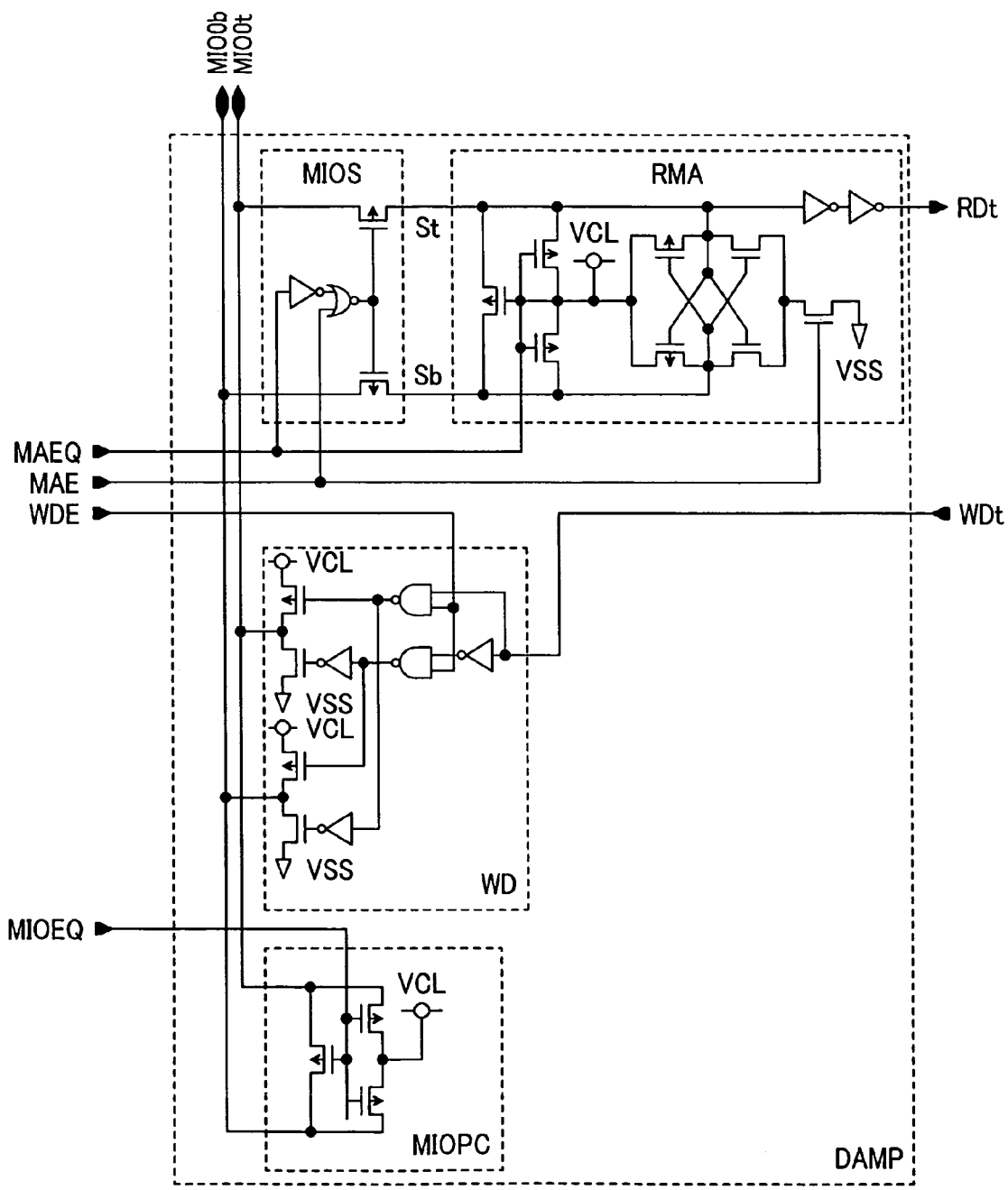
FIG. 33 shows an example of data amplifier circuit configuration.

Next, a configuration of the main amplifier block MAB to which the main IO lines MIOc(3) and MIOd(3) of the memory cell arrays MCAc(3) and MCAd(3) are connected is described below using FIG. 31A. The main amplifier block MAB shown in FIG. 31A has a plurality of data amplifiers DAMPs. More specifically, the main amplifier block MAB has data amplifiers as many as the number of data pins (DQ0 to DQn) through which data is input to and output from the chip, or in order to allow for internal data prefetching used in a double-datarate SDRAM and/or the like, the number of data amplifiers arranged is two, four, or eight times as great as the number of data pins. An example of a data amplifier DAMP configuration is shown in FIG. 33. The data amplifier section shown in this example includes a main amplifier connection switch MIOS, a read main amplifier RMA, a write amplifier WD, and a main IO precharger MIOPC. The main amplifier connection switch MIOS is for connecting the main IO lines MIOt/b and an internal node St/b of the read main amplifier RMA, and has PMOS transistors controlled using a main amplifier enable signal MAE and a main amplifier equalization signal MAEQ. The read main amplifier RMA includes a cross-couple type amplification circuit controlled by the main amplifier enable signal and amplifying to a power supply amplitude level VCL a very weak signal which has been read out into the internal node St/b of the read main amplifier via a main IO connection switch. The read main amplifier RMA also includes a main amplifier equalizing circuit controlled by the main amplifier equalization signal MAEQ, and an output buffer for data output. The write amplifier WD is a circuit controlled by a write amplifier enable signal and driving the main IO lines MIOt/b by use of externally input data. The main amplifier precharger MIOPC is a circuit controlled by a main IO equalization signal IOEQ. This circuit sets a voltage to a desired voltage level, for example, a peripheral circuit voltage level VCL, under a standby state in which the main IO lines MIOt/b are not being used for a read/write operation. In the present configuration, the main amplifier precharger MIOPC is constituted by an equalizing MOS based on a PMOS transistor for providing an electrical short-circuit between complementary main IO lines, and by PMOS precharging transistors connected between the complementary main IO lines and a desired power supply.

Figure 31B:
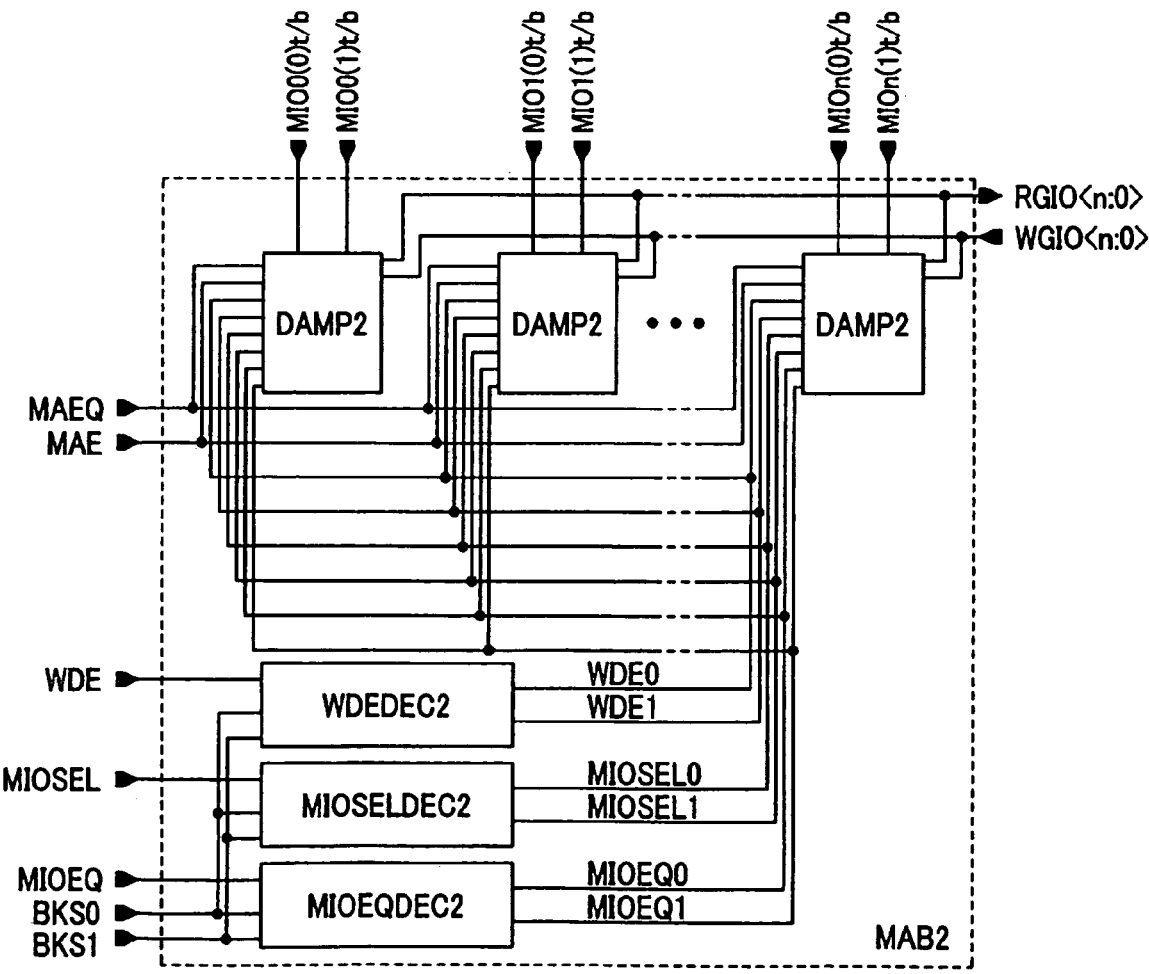
Figure 34:
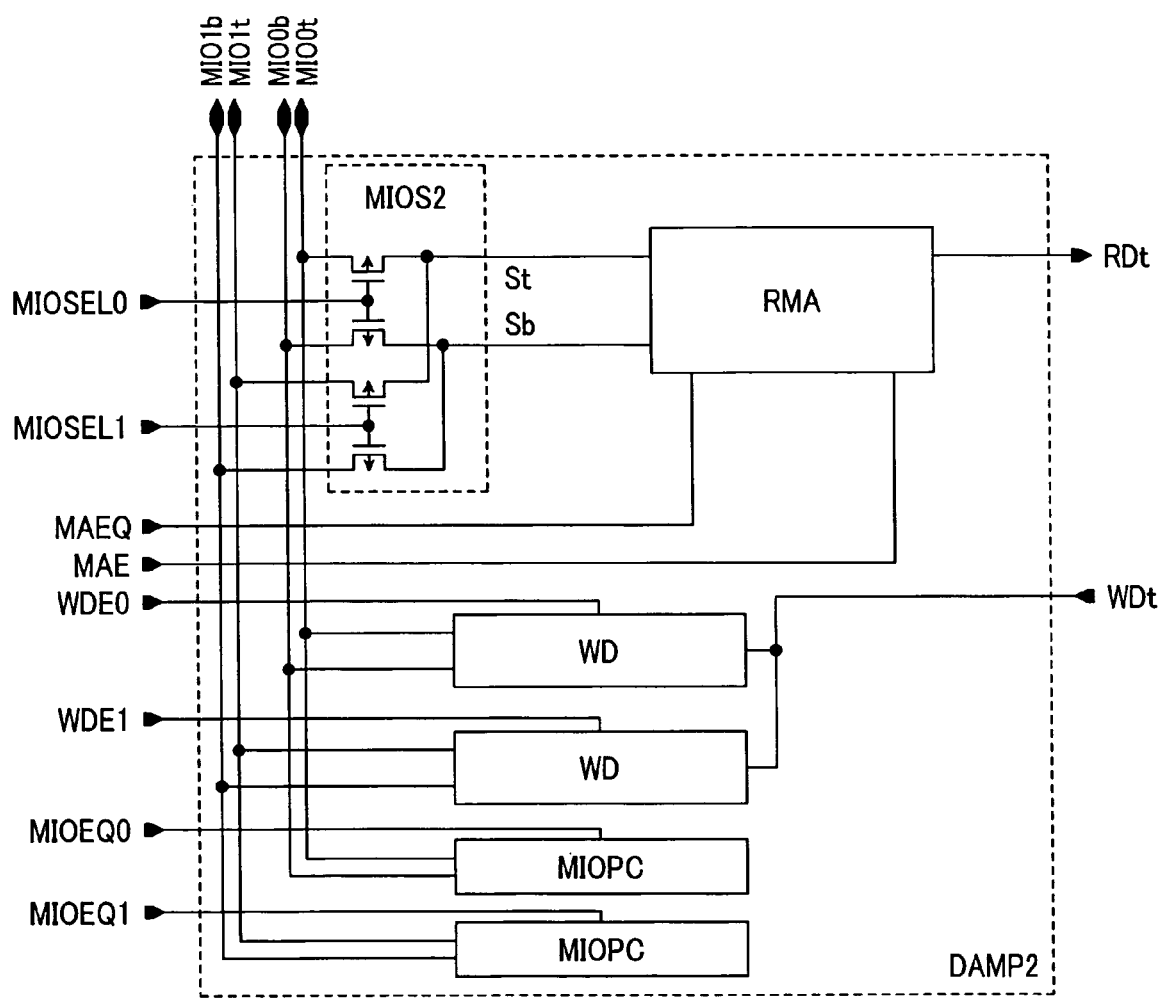
FIG. 34 shows another example of data amplifier circuit configuration.

Next, a configuration of the main amplifier block MAB2 to which the main IO lines MIOa(3) and MIOb(3) of the memory cell arrays MCAa(3) and MCAb(3) are connected is described below using FIG. 31B. The main amplifier block MAB2 shown in FIG. 31B has a plurality of data amplifiers DAMP2s. More specifically, the main amplifier block MAB2 desirably has data amplifiers as many as the number of the above-described data amplifiers DAMPs in the main amplifier block MAB. Next, circuit configuration of the data amplifier DAMP2 is described below using FIG. 34. This circuit has a main IO line selector MIOS2 for selecting one pair of main IO lines from two sets of main IO line pairs. The circuit also has one read data amplifier RMA connected to an output side of the main IO line selector, write amplifiers WDs each connected to one of the main IO lines, and main IO prechargers MIOPCs. The configuration of this circuit is characterized in that either one of the two sets of main IO line pairs, MIO0t/b, MIO1t/b is selected by the main IO line selector MIOS2 in accordance with a main IO line selection signal MIOSEL0, MIOSEL1, and connected to the internal node St/b of the read main amplifier RMA. To realize the configuration of sharing the data amplifier DAMP2, it is necessary that no reading or writing should occur simultaneously to the main IO line pair connected to the main IO line selector.

In FIGS. 1 and 2, not only the main IO lines MIOa(3) and MIOb(3) of the memory cell arrays MCAa(3) and MCAb(3) in the memory block BANK3, but also the main IO lines MIOb(2) and MIOa(2) of the memory cell arrays MCAb(2) and MCAa(2) in the memory block BANK2 are connected in the main amplifier block MAB2. Since both the Y-decoders of the memory blocks BANK3 and BANK2 are not activated at the same time, a common amplifier DAMP2 can be used for the main IO lines MIOa(3) and MIOa(2). For the same reason, a common data amplifier DAMP2 can be used for the main IO lines MIOb(3) and MIOa(2). The read main amplifier RMA, the write amplifier WD, and the main IO precharger MIOPC may be the same as those of FIG. 33 in terms of circuit configuration. However, those write amplifier enable signals WDE0, WDE1, and main IO equalization signals MIOEQ0, MIOEQ1 that are input to each such circuit, and the main IO line selection signals MIOSEL0, MIOSEL1 are output from such decoder circuits as shown in FIG. 35A to 35C.

Figure 35A:
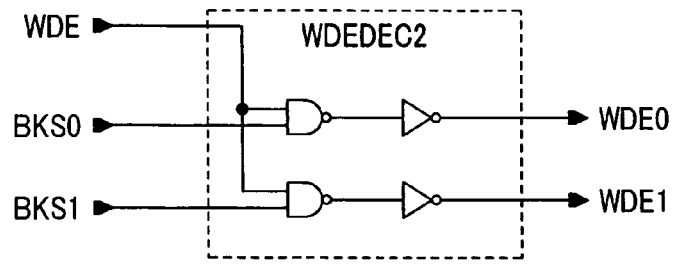
FIG. 35 shows an example of data amplifier control signal decoder circuit configuration.
Figure 35B:
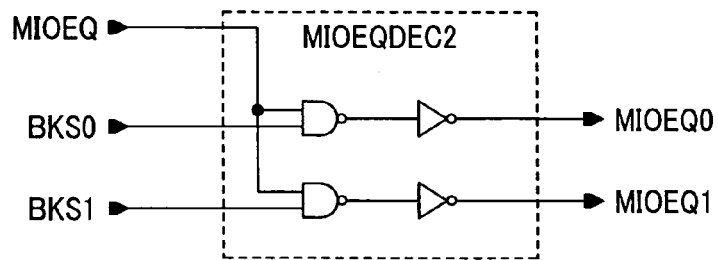
Figure 35C:
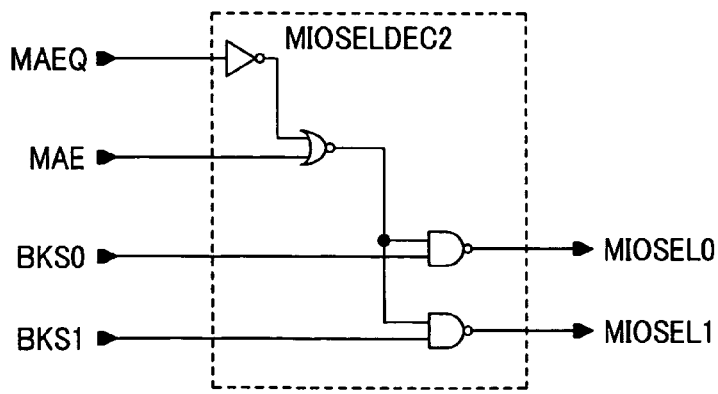

FIGS. 35A-35C respectively show examples of configuration of the write amplifier enable signal decoder circuit WDEDEC2 that outputs the write amplifier enable signals WDE0, WDE1, configuration of the main IO equalization signal decoder circuit MIOEQDEC2 that outputs the main IO equalization signals MIOEQ0, MIOEQ1, and configuration of the main IO line selection signal decoder circuit MIOSELDEC2 that outputs the main IO line selection signals MIOSEL0, MIOSEL1. The write amplifier enable signal decoder circuit WDEDEC2 takes a circuit configuration that outputs the write amplifier enable signal WDE0 or WDE1 according to particular results of logical ANDing between a write amplifier enable signal WDE and a memory block selection signal BKS0, BKS1.

The memory block selection signals BKS0, BKS1 here are selected when reading/writing occurs to the associated main IO lines MIO0t/b and MIO1t/b. For example, in FIG. 2, when a word line of the memory cell array MCAa(2), MCAb(2) in the memory block BANK2 is selected from the X-decoder XDECab(2) and the Y-selection lines YSa(2) and YSb(2) are further activated from the Y-decoders YDECa(2) and YDECb (2), the memory block selection signal BKS0 is activated by the above selection and activation. In FIG. 2, when a word line of the memory cell array MCAa(3), MCAb(3) in the memory block BANK3 is selected from the X-decoder XDECab(3) and the Y-selection lines YSa(3) and YSb(3) are further activated from the Y-decoders YDECa(3) and YDECb(3), the memory block selection signal BKS1 is activated by the above selection and activation. The configuration of this circuit can be realized since, as described above, the Y-decoders YDECa(2), YDECb(2) and Y-decoders YDECa(3), YDECb (3) of the memory blocks BANK2 and BANK3, respectively, are not activated at the same time. The main IO equalization signal decoder circuit MIOEQDEC2 outputs the main IO equalization signal MIOEQ0 or MIOEQ1 according to particular results of logical ANDing between the main IO equalization signal MIOEQ and the memory block selection signal BKS0, BKS1. The main IO line selection signal decoder circuit MIOSELDEC2 conducts a logical ANDing operation between the main amplifier equalization signal MAEQ, the main amplifier enable signal MAE, and the memory block selection signal BKS0, BKS1, and correspondingly outputs main IO line selection signal MIOSEL0, MIOSEL1. Sharing one data amplifier circuit among memory blocks adjacent to one another in this way enables reduction in circuit scale and hence, reduction in area.

Variations in transistor threshold voltage against an input signal become a problem in the amplifier circuit represented by a cross-coupling read amplifier. Sharing makes it possible to use such transistors of a large area that reduce the variations, even for the same area as obtained in a non-sharing state.

Figure 46:
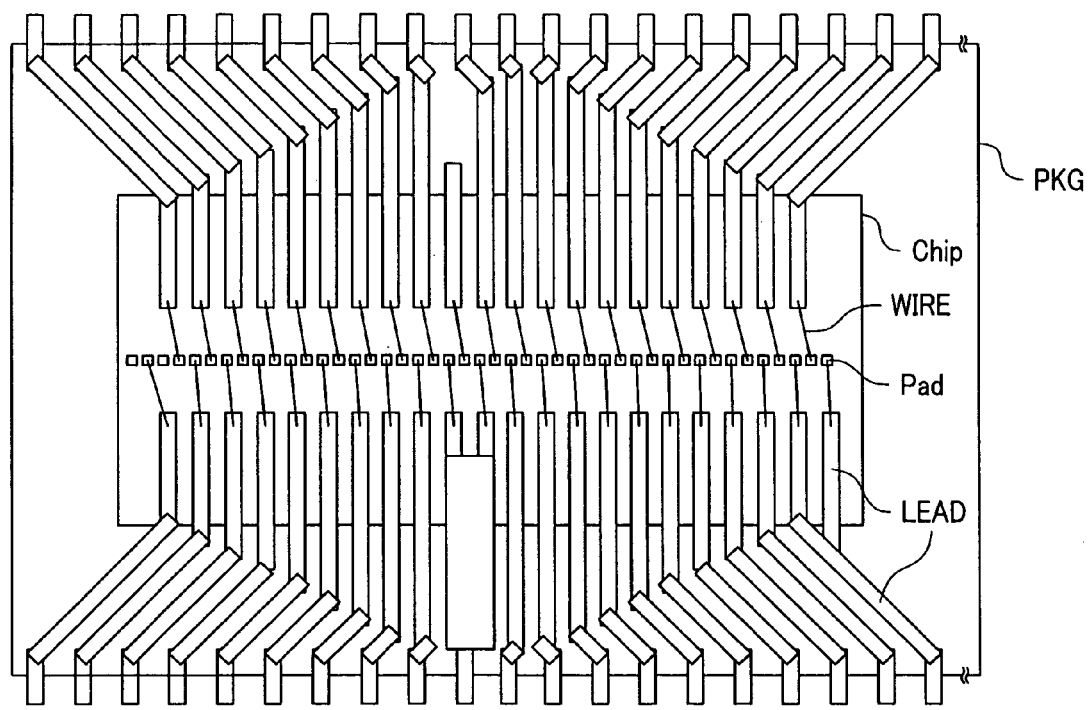
FIG. 46 is a diagram that shows a chip and a package configuration thereof.
Figure 47:
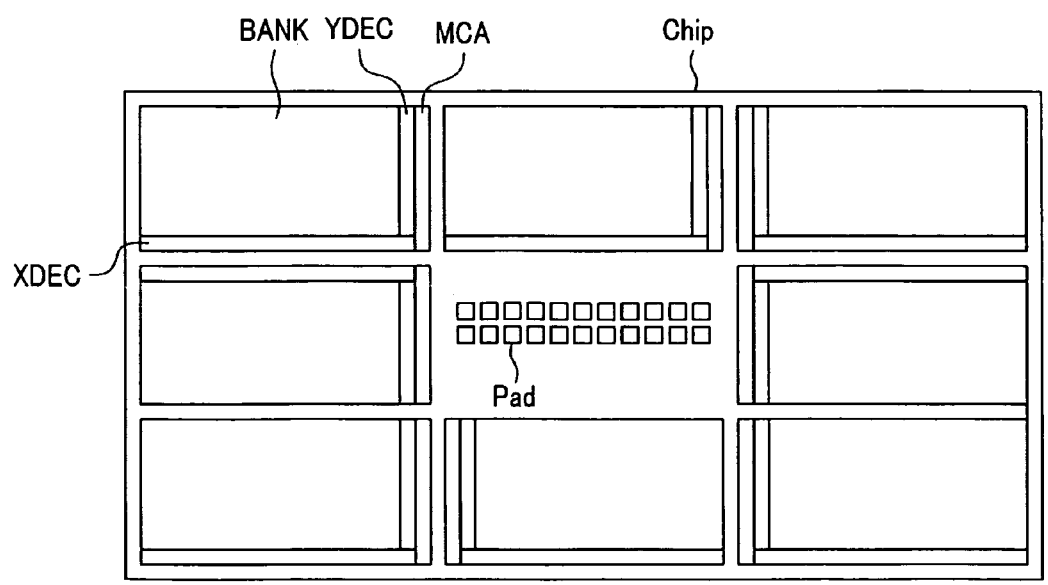
FIG. 47 shows an example of layout of memory blocks in a conventional chip.
Figure 48A:
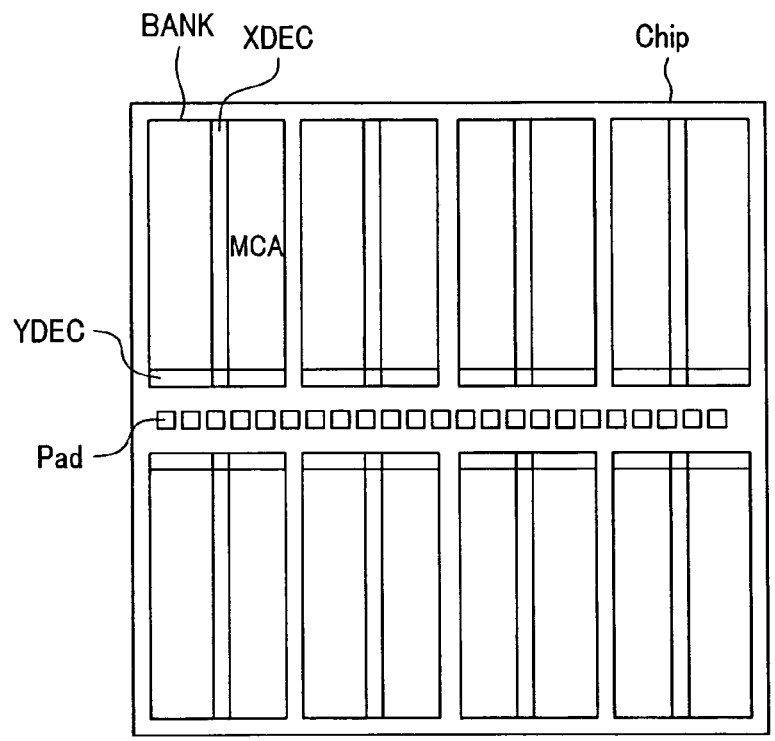
FIG. 48 shows an example of layout of memory blocks in another conventional chip.
Figure 48B:
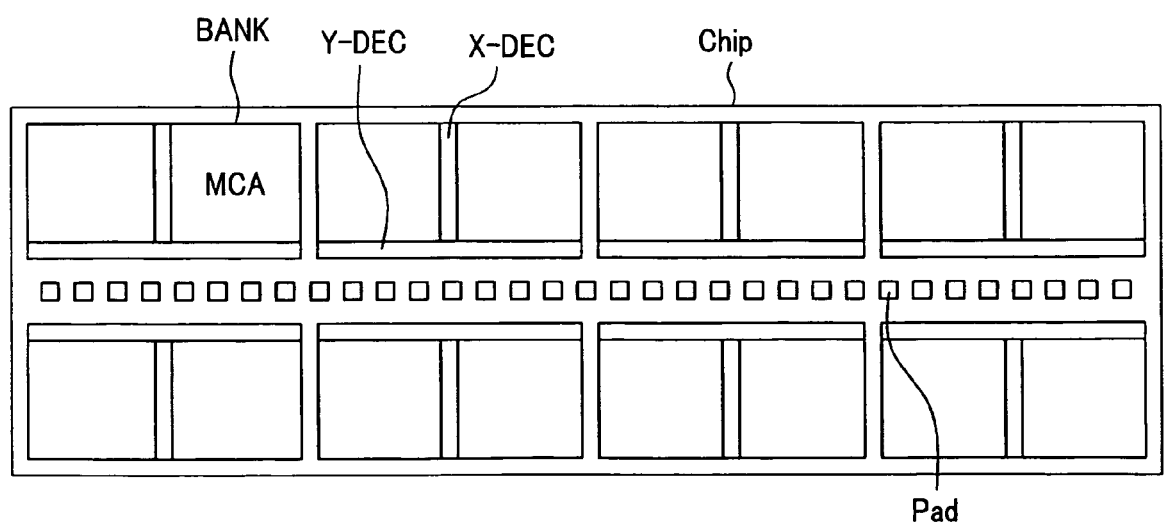

An example of a configuration with this chip enclosed in a package is shown in FIG. 46. Since pads for inputting/outputting data and addresses are arranged in a long-side direction of the chip, wiring pitches of bonding wires and of lead frames are not required to be narrowed for ease in wiring. Although the pads are arranged in one line in FIG. 46, the above also applies to a two-line arrangement of pads. If the pads are arranged in two lines, the pad arrangement pitch is not required to be narrowed and at the same time, the number of pads on the chip can be increased.

Advantages of this configuration are discussed below. Assume that a chip with a capacity of an odd power of 2, for example, 2 Gbytes ($=2^{31}$), is constructed using memory cells having a memory cell layout aspect ratio of 1:2 and an area of $8F^2$, or that a chip with a capacity of an even power of 2, for example, 1 Gbytes ($=2^{30}$) or 4 Gbytes ($=2^{32}$), is constructed using memory cells having a memory cell layout aspect ratio of 1:1 and an area of $4F_2$. Under the above assumptions, a chip shape close to that whose aspect ratio is 1:2 at which packaging is facilitated can be realized by disposing one bank formed into an "L" shape and combining this bank with another bank of the same shape. The number of circuit elements can be reduced and hence, area reduction becomes possible, by sharing one main amplifier block between or among memory array blocks adjacent to one another. Additionally, since peripheral circuits other than the memory cell array section can be arranged in zonal form centrally on the chip, an area of the peripheral circuit region can be determined according to the number of circuit elements constituting the peripheral circuits. There is a further advantage in that since the pads can be arranged in one line in the long-side direction of the chip, when the chip is enclosed in a package and connected to external lead wires, the pitches of the lead wires and bonding wires are not required to be narrowed in wiring pitch and are easily connected.

Figure 4:
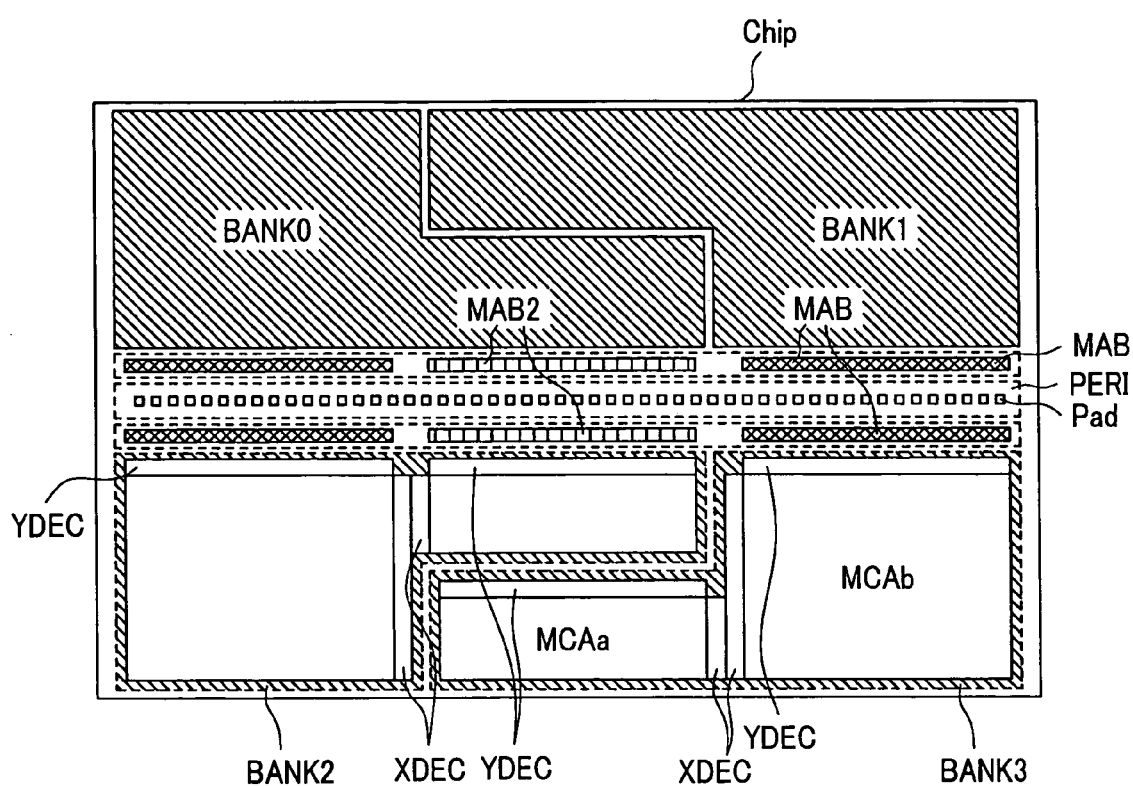
FIG. 4 is a layout view of memory blocks disposed in the chip according to a modification of the first embodiment of the present invention.
Figure 38A:
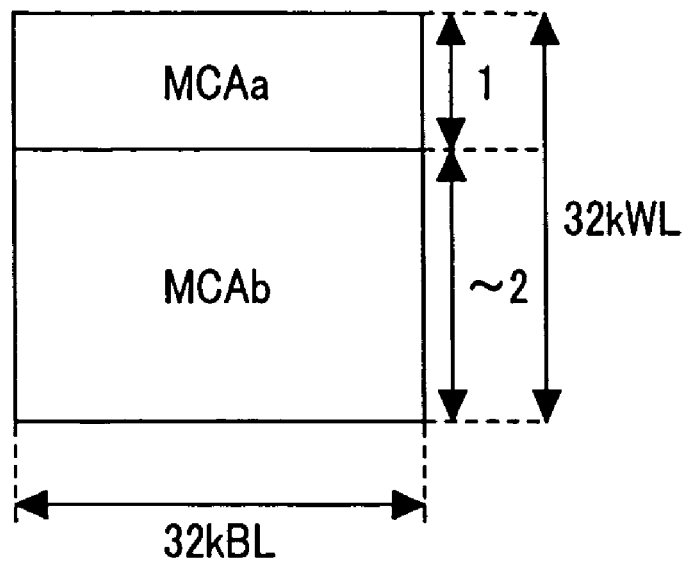
FIG. 38 is a diagram schematically showing a memory block splitting scheme.

Next, a modification of the first embodiment is shown in FIG. 4. In a configuration of the present modification, the number of splittings of each memory block shown in FIG. 1 is reduced from four to two. Wiring length of the word lines driven by the X-decoders is increased by so doing, and word line speed is thus reduced. The reduction in the number of splittings, however, has an advantage in that since the X-decoders can be reduced in circuit scale, the chip area can also be reduced. A method of splitting memory blocks BANK0, BANK1, BANK2, BANK3 in the present configuration is described hereunder using FIG. 38A. Each memory block in FIG. 1 is split vertically so that a ratio of the number of bit lines is 1:1. In the present configuration, however, each memory block is only split into two segments horizontally so that a ratio of the number of word lines is 1:2. Thus, the number of word lines on the memory cell array MCAb essentially doubles that of the memory cell array MCAa. FIG. 38A shows an example of arrangement of 32 k word lines. In the example, the memory cell array MCAa has 10 k word lines and the memory cell array MCAb has 22 k word lines.

Next, regions of the memory blocks BANK2, BANK3 of FIG. 4 are described. The description also applies to the memory blocks BANK0, BANK1. The memory cell arrays MCAa and MCAb of BANK3 are arranged with an X-decoder XDEC interposed between both the memory cell arrays. This gives an L-shape to the memory block BANK3 constructed of the asymmetrically split memory cell arrays MCAa and MCAb. Combining this memory block with the memory block BANK2 of the same construction forms a total region of the memory blocks BANK2, BANK3 into nearly a 1:4 shape. The chip can be formed into a 1:2 shape by further constructing the memory blocks BANK1, BANK0 into the same 1:4 shape. Other structural aspects are essentially the same as those of the embodiment relating to FIG. 1. Advantages of the present configuration are discussed below. In addition to the foregoing advantages of FIG. 1, the present configuration offers the advantage that since the number of X-decoders is small, the chip can be reduced in area.

Figure 5:
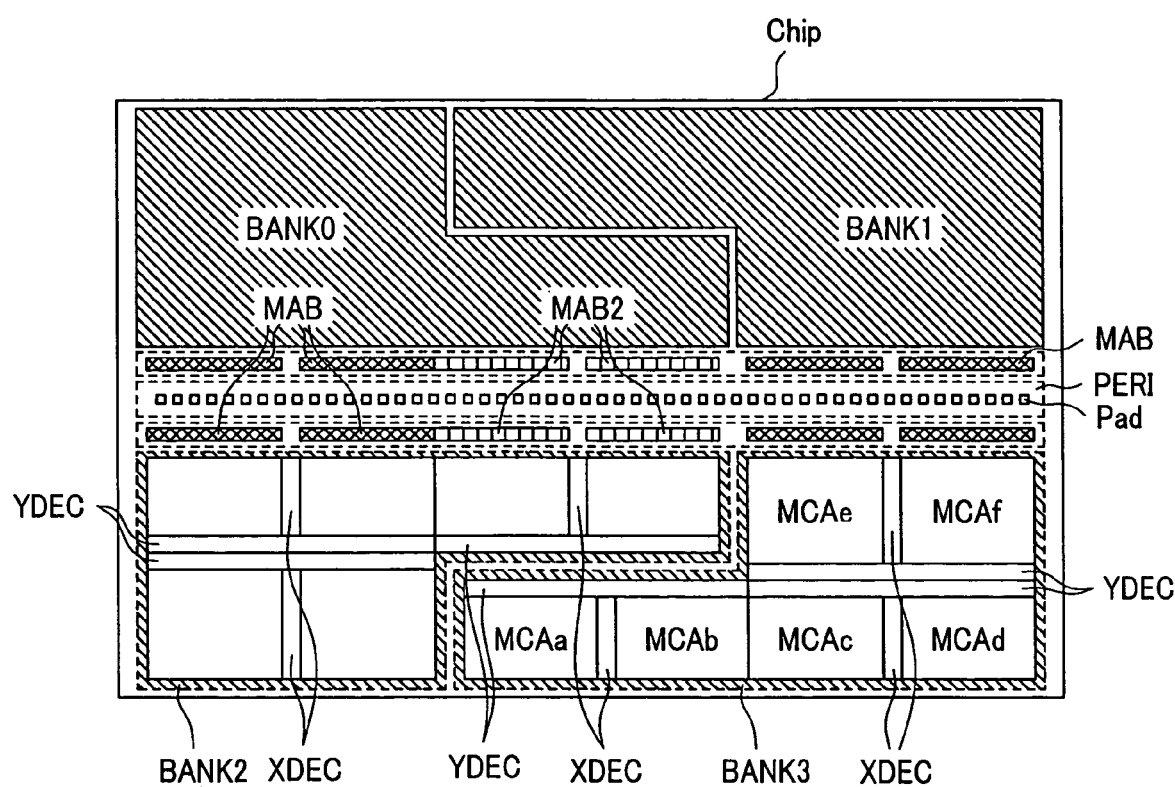
FIG. 5 is a layout view of memory blocks disposed in the chip according to another modification of the first embodiment of the present invention.

Next, another modification of the foregoing first embodiment is shown in FIG. 5. In a configuration of the present modification, the number of splittings of each memory block in the embodiment relating to FIG. 1 is increased from four to six, which are almost equal to one another in size. Wiring length of the Y-selection lines YS driven by Y-decoders is reduced by so doing, and columnar operation speed can thus be improved. In addition, although the configuration shown in FIG. 1 differs by a factor of two in Y-selection line length between memory cell arrays, the configuration in FIG. 5 becomes almost equal in Y-selection line length and can thus reduce variations in columnar operation cycle and hence achieve faster operation. A method of splitting memory blocks BANK0, BANK1, BANK2, BANK3 in the present configuration is described hereunder using FIG. 39B. In the embodiment relating to FIG. 1, each memory block is split vertically so that a ratio of the number of bit lines is 1:1 and further split into two segments horizontally so that a ratio of the number of word lines is 1:2. In the present configuration, however, each memory block is almost equally split into three segments horizontally so that a ratio of the number of the word lines is 1:1:1.

Figure 39B:
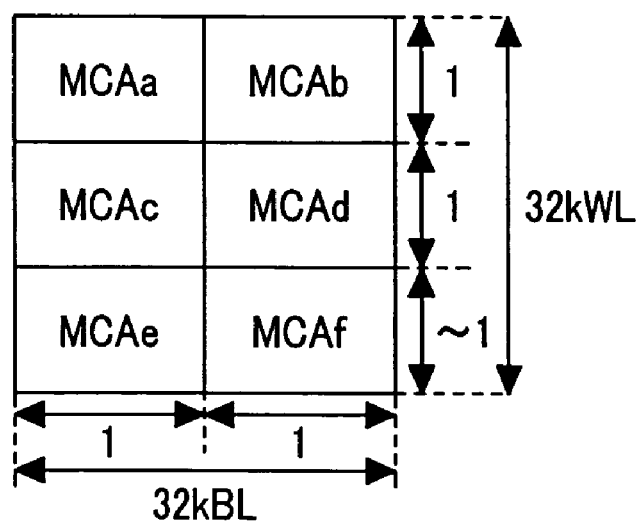

Thus, memory cell arrays MCAb, MCAC, MCAd, MCAe, MCAf become almost equal to one another in the number of word lines. FIG. 39B shows an example of arrangement of 32 k word lines. In the example, the memory cell arrays MCAa-MCAd are each constituted by 5 k word lines, and MCAe, MCAf, by 6 k word lines each.

Figure 6:
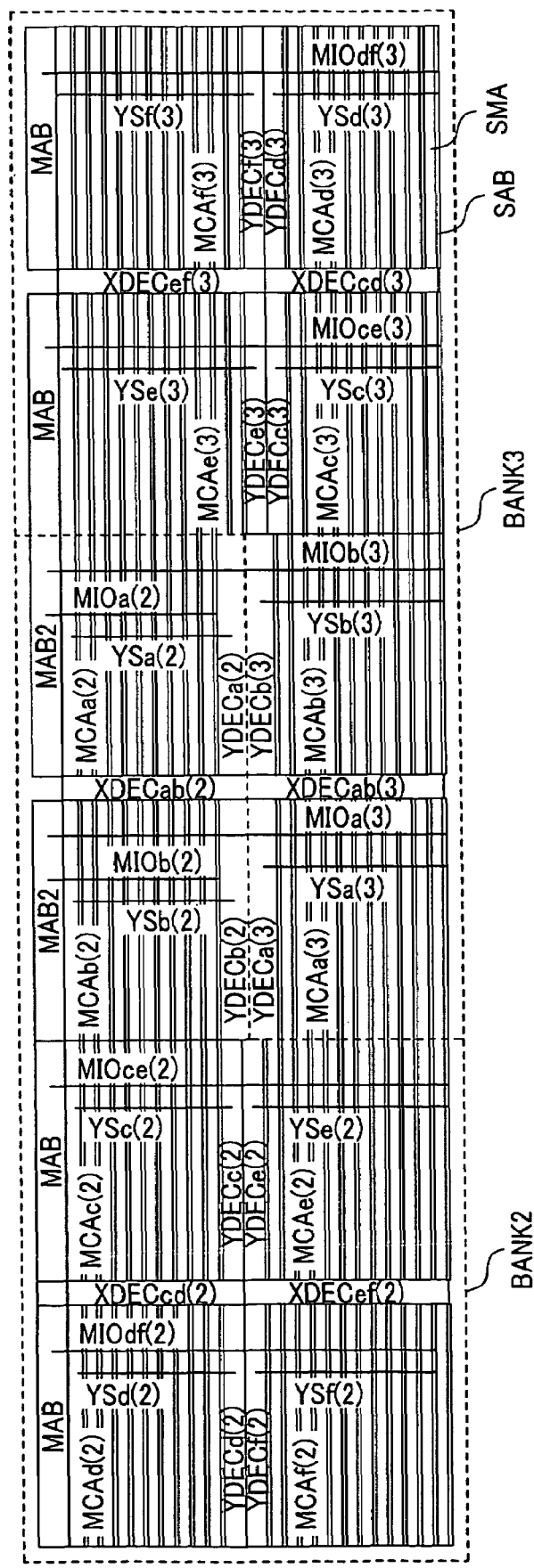
FIG. 6 is a diagram showing the memory blocks 2, 3 shown in FIG. 5.

FIG. 6 shows an example of an array configuration which presupposes a multi-segment bit line arrangement of the memory blocks BANK2 and BANK3 in the chip. The numbers of sub-memory arrays SMAs in the memory cell arrays MCAa, MCAb, MCAc, and MCAd are each 10, whereas those of the memory cell arrays MCAe and MCAf are each 12. Those numbers of sub-memory arrays are not limited to these values. Those numbers need to be roughly equal among the memory cell arrays. A sense amplifier block SAB in which a plurality of sense amplifiers each connected to a bit line or for each pair of bit lines are arranged is interposed between the sub-memory arrays. Circuit configuration of the sense amplifier block is as described per FIG. 3.

Next, a description will be given with attention focused on the memory block BANK3. Other memory blocks are also of the same configuration. An X-decoder XDECab(3) for selecting an associated word line from an X-address that has been input is disposed between memory cell arrays MCAa(3) and MCAb(3). The X-decoder XDECab(3) simultaneously activates the memory cell arrays MACa(3) and MACb(3) arranged at both sides of the X-decoder. Similarly, an X-decoder XDECcd(3) for selecting an associated word line from an X-address that has been input is disposed between memory cell arrays MCAc(3) and MCAd(3), and an X-decoder XDECef(3) is disposed between memory cell arrays MCAe(3) and MCAf(3). The X-decoders XDECcd(3) and XDECef(3) simultaneously activate word lines associated with the input X-addresses, these word lines belonging to the memory cell arrays MCAc(3), MCAd(3), or MCAe(3), MCAf(3), each arranged at both sides of the X-decoder XDECcd(3) or XDECef(3), respectively.

In this case, since the memory cell arrays MCAa, MCAb, MCAc, MCAd, MCAe, MCAf are of the same memory block, one specific word line WL is selected from XDECab(3), XDECcd(3), and XDECef(3), with respect to MCAa(3) and MCAb(3) or MCAc(3) and MCAd(3) or MCAe(3) and MCAf(3). That is to say, two or more word lines are not selected from XDECab(3), XDECcd(3), and XDECef(3) at the same time. A Y-decoders YDECa(3), YDECb(3), YDECc(3), YDECd(3), YDECe(3), and YDECf(3), each for selecting a Y-selection line YSa(3), YSb(3), YSc(3), YSd(3), YSe(3), and YSf(3), respectively, from a Y-address that has been input, are disposed on one side of the memory cell array MCAa(3), MCAb(3), MCAc(3), MCAd(3), MCAe(3), and MCAf(3), respectively, the Y decoders being each adjacent to and orthogonal to the associated X-decoder. The Y-decoders YDECa(3), YDECb(3) are activated only when any word line is selected from the X-decoder XDECab(3), and are not activated when a word line is selected from the X-decoder XDECcd(3) or XDECef(3).

Similarly, the Y-decoders YDECc(3), YDECd(3) are activated only when any word line is selected from the X-decoder XDECcd(3), and are not activated when a word line is selected from the X-decoder XDECab(3) or XDECef(3). Similarly, the Y-decoders YDECe(3), YDECf(3) are activated only when any word line is selected from the X-decoder XDECef(3), and are not activated when a word line is selected from the X-decoder XDECab(3) or XDECcd(3). Main amplifier blocks MABs with main IO lines MIOce(3) and MIOdf(3) respectively connected thereto for transferring, among all data going out from the memory cell arrays to the sense amplifiers SAs, only data that has been selected via a Y-selection line, are arranged on sides opposed to sides adjacent to the memory cell arrays.

The main IO lines MIOce(3) and MIOdf(3) are connected to local IO lines on the sense amplifier blocks SABs of the memory cell arrays MCAc(3), MCAe(3), and MCAd(3), MCAf(3), respectively. Since the memory cell arrays MCAc(3) and MCAe(3) are not activated at the same time, the respective main IO lines can be shared.

Similarly, since the memory cell arrays MCAd(3) and MCAf(3) are not activated at the same time, the respective main IO lines can be shared. Main IO lines MIOa(3) and MIOb(3) each connected at one end to the memory cell arrays MCAa(3) and MCAb(3), respectively, are connected at the other end to main amplifier blocks MAB2 adjacent to the main amplifier blocks MABs described above. At this time, wiring is conducted midway on the memory cell arrays MCAa(2), MCAb(2) of the adjacent memory block BANK2, and the wiring is provided simply as pass-through wiring. In this configuration, although a wiring load differs between the main IO lines MIOa(3), MIOb(3), and MIOc(3), MIOd(3), no problems occur since larger signals are generated in the main IO lines MIOa(3) and MIOb(3) by driving the main amplifier in the timing that high enough signals are output through the main IO lines MIOc(3) and MIOd(3) that are large in wiring load. The main amplifier blocks MABs and MAB2 are of the circuit configuration described in the relevant section of this Specification.

Figure 7:
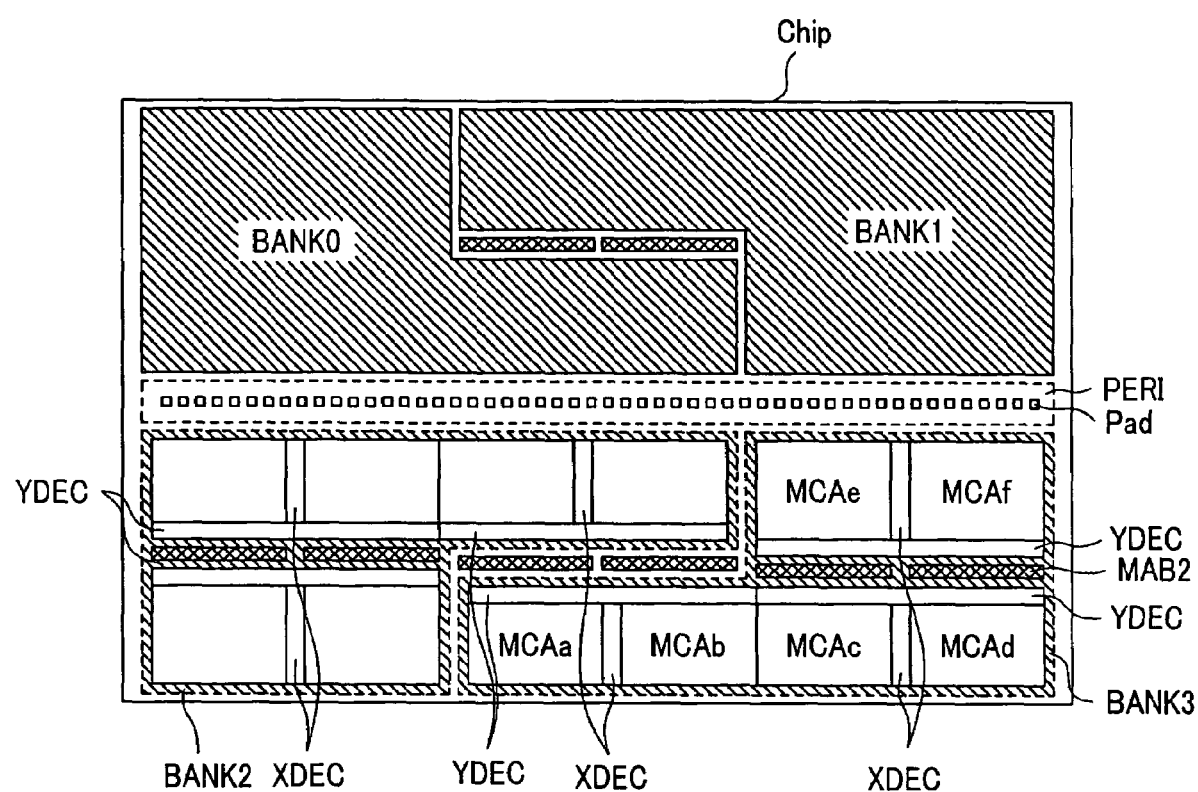
FIG. 7 is a layout view of memory blocks disposed in the chip according to yet another modification of the first embodiment of the present invention.

Next, yet another modification of the foregoing first embodiment is shown in FIG. 7. In FIG. 7, the Y-decoders arranged centrally in the memory blocks of FIG. 5 are likewise arranged centrally and the main amplifier blocks arranged adjacently to the peripheral circuit region PERI in a central section of the chip in FIG. 5 are each arranged between the Y-decoders. The configuration shown in FIG. 7, as with that of FIG. 5, is characterized in that length of Y-selection lines YS selected by the Y-decoders, and the number of transistors connected are almost equal between memory cell arrays, and in that variations in columnar cyclic operation between the memory cell arrays can be reduced and thus the columnar cyclic operation can be made even faster.

Figure 8:
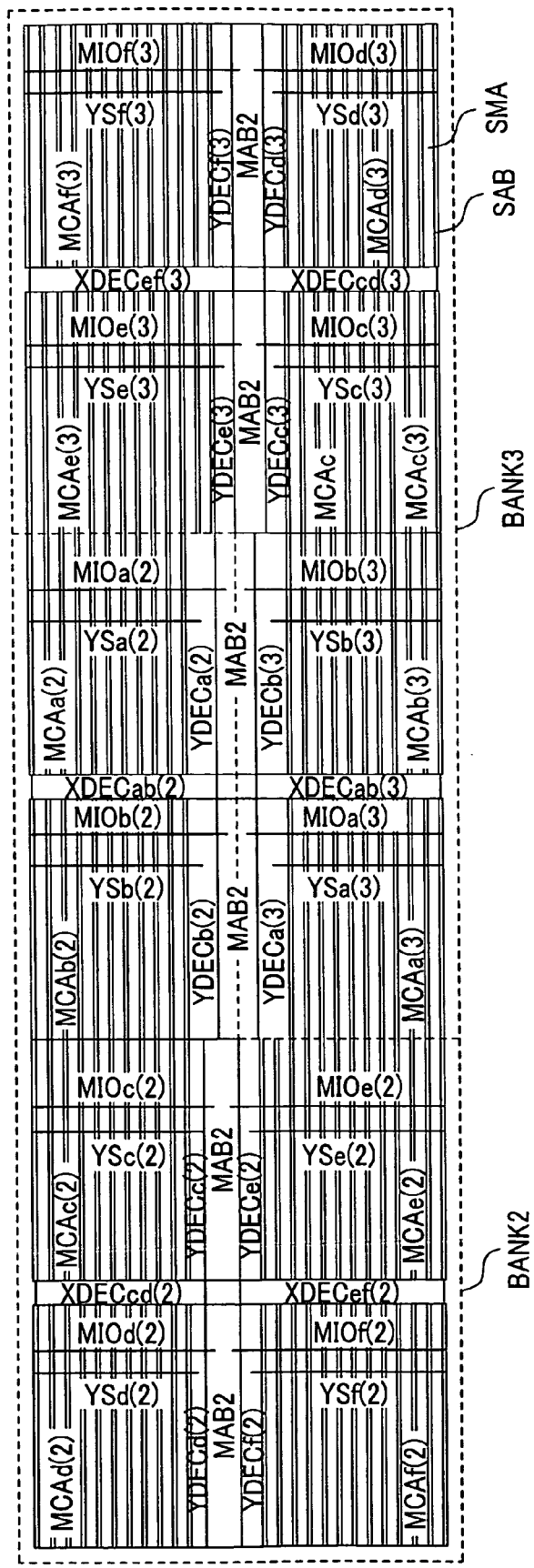
FIG. 8 is a diagram showing the memory blocks 2, 3 shown in FIG. 7.

FIG. 8 shows an example of an array configuration which presupposes a multi-segment bit line arrangement of memory blocks BANK2 and BANK3 in the chip. The numbers of sub-memory arrays SMAs in memory cell arrays MCAa, MCAb, MCAc, and MCAd are 10, whereas those of memory cell arrays MCAe and MCAf are each 12. The numbers of sub-memory arrays are not limited to these values. The numbers need to be roughly equal between the memory cell arrays. A sense amplifier block SAB in which a plurality of sense amplifiers each connected to a bit line or for each pair of bit lines are arranged is interposed between the sub-memory arrays. Circuit configuration of the sense amplifier block is as described in FIG. 5.

Next, a description will be given with attention focused on the memory block BANK3. Other memory blocks are also of the same configuration. An X-decoder XDECab(3) for selecting an associated word line from an X-address that has been input is disposed between memory cell arrays MCAa(3) and MCAb(3). The X-decoder XDECab(3) simultaneously activates the memory cell arrays MACa(3) and MACb(3) arranged at both sides of the X-decoder. Similarly, an X-decoder XDECcd(3) for selecting an associated word line from an X-address that has been input is disposed between memory cell arrays MCAc(3) and MCAd(3), and an X-decoder XDECef(3) is disposed between memory cell arrays MCAe(3) and MCAf(3). The X-decoders XDECcd(3) and XDECef(3) simultaneously activate word lines associated with the input X-addresses, these word lines belonging to the memory cell arrays MCAc(3), MCAd(3), or MCAe(3), MCAf(3), each arranged at both sides of the X-decoder XDECcd(3) or XDECef(3), respectively.

In this case, since the memory cell arrays MCAa, MCAb, MCAC, MCAd, MCAe, MCAf are of the same memory block, one specific word line WL is selected from XDECab(3), XDECcd(3), and XDECef(3), with respect to MCAa(3) and MCAb(3) or MCAc(3) and MCAd(3) or MCAe(3) and MCAf(3). That is to say, two or more word lines are not selected from XDECab(3), XDECcd(3), and XDECef(3) at the same time. A Y-decoders YDECa(3), YDECb(3), YDECc (3), YDECd(3), YDECe(3), and YDECf(3), each for selecting a Y-selection line YSa(3), YSb(3), YSc(3), YSd(3), YSe(3), and YSf(3), respectively, from a Y-address that has been input, are disposed on one side of the memory cell array MCAa(3), MCAb(3), MCAc(3), MCAd(3), MCAe(3), and MCAf(3), respectively, the Y-decoders being each adjacent to and orthogonal to the associated X-decoder. The Y-decoders YDECa(3), YDECb(3) are activated only when any word line is selected from the X-decoder XDECab(3), and are not activated when a word line is selected from the X-decoder XDECcd(3) or XDECef(3).

Similarly, the Y-decoders YDECc(3), YDECd(3) are activated only when any word line is selected from the X-decoder XDECcd(3), and are not activated when a word line is selected from the X-decoder XDECab(3) or XDECef(3).

Similarly, the Y-decoders YDECe(3), YDECf(3) are activated only when any word line is selected from the X-decoder XDECef(3), and are not activated when a word line is selected from the X-decoder XDECab(3) or XDECcd(3). A main amplifier block MAB2 with main IO lines MIOc(3) and MIOe(3) connected thereto is disposed between Y-decoders YDECc(3) and YDECe(3), respectively.

Similarly, a main amplifier block MAB2 with main IO lines MIOd(3) and MIOf(3) connected thereto is disposed between Y-decoders YDECd(3) and YDECf(3), respectively. In addition, a main amplifier block MAB2 is likewise disposed in a boundary region of the memory block BANK2 adjacent to the Y-decoder YDECa(3), and has a connected main IO line MIOb(2) of the memory block, the main IO line MIOb(2) being adjacent to the main IO line MIOa(3). Similarly, a main amplifier block MAB2 is disposed in a boundary region of the memory block BANK2 adjacent to the Y-decoder YDECb(3), and has a connected main IO line MIOb(2) of the memory block, the main IO line MIOb(2) being adjacent to the main IO line MIOa(3). In the present configuration, since all main IO lines are almost equal in length, variations in operating speed can be reduced, which makes faster operation possible. Other circuit blocks are of the configuration described in the relevant section of this Specification. Advantages of the present configuration are discussed below. In addition to the foregoing advantages of FIG. 5, the present configuration offers the advantages that variations in the main IO line length between the memory cell arrays are reduced and that variations in operating speed can be reduced to facilitate faster columnar cyclic operating speed.

A further modification of the first embodiment is described below using FIG. 9. Although constructed of four memory blocks in the embodiment of FIG. 1, the entire chip is constructed of eight memory blocks in the present modification. In addition to the eight memory blocks, namely, BANK0, BANK1, BANK2, BANK3, BANK4, BANK5, BANK6, BANK7, the chip includes a peripheral circuit region PERI in which an input/output circuit block, a data control circuit block, an internal power supply voltage output circuit, a clock synchronizing circuit, a test circuit, and other sections are arranged, and main amplifier blocks MABs and MAB2's adapted to output data from each memory block to the peripheral circuit region PERI.

Figure 9:
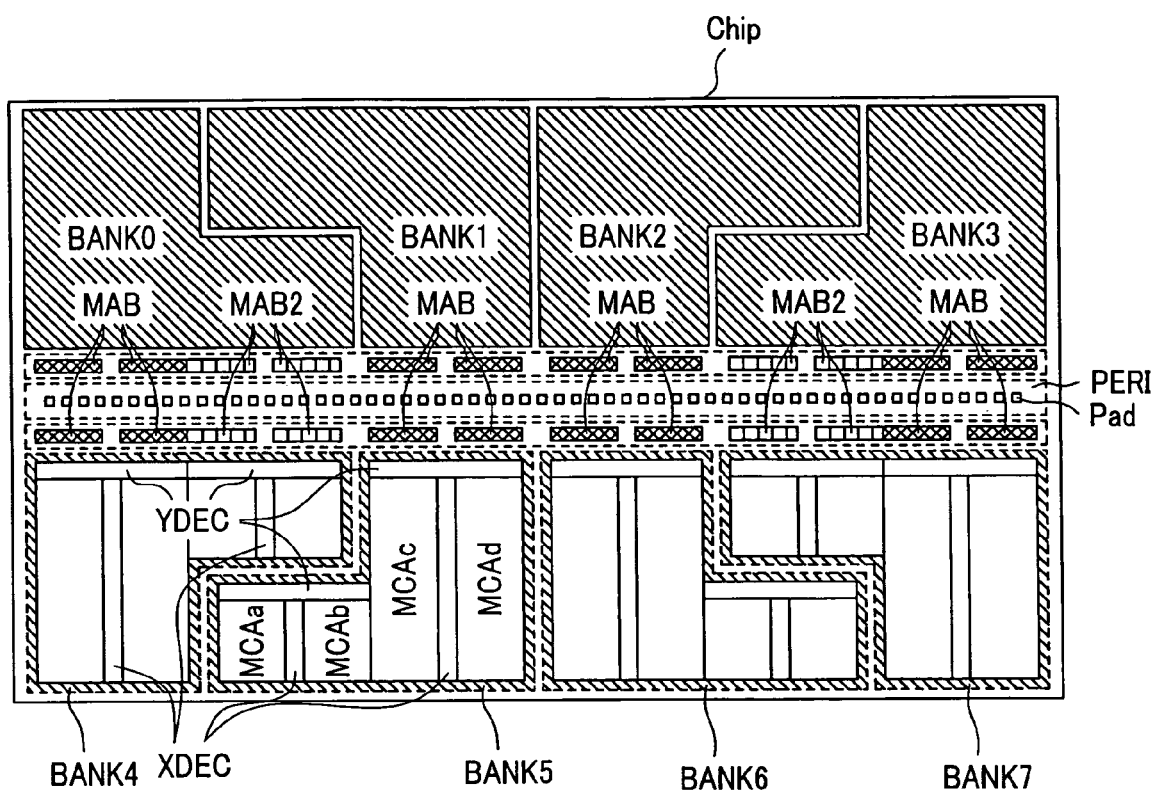
FIG. 9 is a layout view of memory blocks disposed in the chip according to a further modification of the first embodiment of the present invention.

For the memory blocks BANK0 to BANK3, only the shapes thereof are shown in FIG. 9. For the memory blocks BANK4 to BANK7, layout of memory cell arrays in each memory block is shown. Layout of memory cell arrays in each of the memory blocks BANK0 to BANK3 is also the same as in each of the memory blocks BANK4 to BANK7. Each of the eight memory blocks is split into four memory cell arrays, MCAa, MCAb, MCAc, MCAd.

Figure 41A:
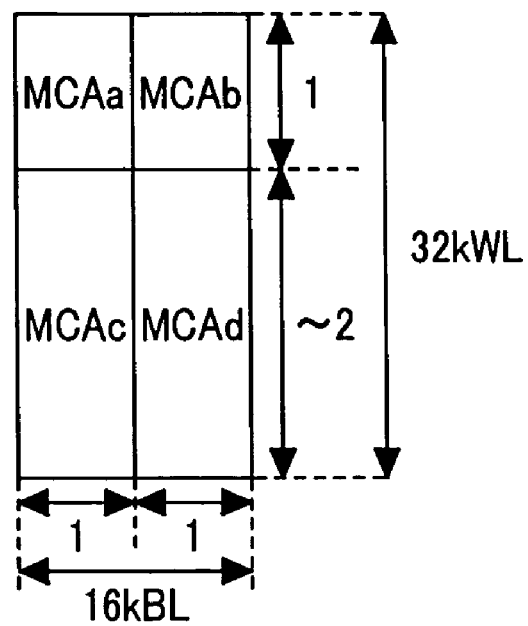
FIG. 41 is a diagram schematically showing a further memory block splitting scheme.

How the memory blocks are each split into these memory cell arrays is shown in FIG. 41A. When the entire chip has the same capacity as that of the embodiment relating to FIG. 1, a total capacity of all memory blocks BANK0, BANK1, BANK2, BANK3, BANK4, BANK5, BANK6, BANK7 is half of the capacity of all memory blocks in the embodiment of FIG. 1. FIG. 41A assumes an arrangement of 32 k logical word lines whose number is same as that of the embodiment of FIG. 1, and shows a splitting method for each memory block with 32 k word lines (WLs) and 16 k bit lines (BLs), based on the above assumption. For a folded memory cell array of an $8F^2$ memory cell size, the memory block has a capacity of 32 k×16 k÷2=256 Mb. As shown, the memory cell arrays MCAa, MCAb have the same number of word lines.

The memory cell arrays MCAc, MCAd have about twice the number of word lines on the memory cell array MCAa, MCAb. The memory cell arrays MCAa, MCAb also have the same number of bit lines. In addition, the memory cell arrays MCAc, MCAd have the same number of bit lines.

It becomes possible, by splitting one memory block to obtain an aspect ratio of about 1:2 in this way, to form each of the memory blocks BANK0, BANK1, BANK2, and BANK3, into an L-shape (or into an inversed or rotated form of L) as shown in FIG. 1. The region constituted by the memory blocks BANK0 to BANK3 in this case takes a shape with an aspect ratio of about 1:4, and combining these memory blocks with the remaining memory blocks BANK4 to BANK7 makes a chip shape with an aspect ratio of about 1:2 achievable. A detailed configuration of each memory block is a configuration with bit lines whose number is half of bit lines in each memory block in the embodiment of FIG. 1, and X-decoders, Y-decoders and main amplifier blocks are laid out in substantially the same form as in the embodiment of FIG. 1. Advantages of the present configuration are discussed below. In addition to the foregoing advantages of FIG. 1, the present configuration offers the advantage that since there are eight memory block regions that can internally operate independently of one another, the chip is suitable for random access operation, compared with the chip of the embodiment relating to FIG. 1.

Figure 10:
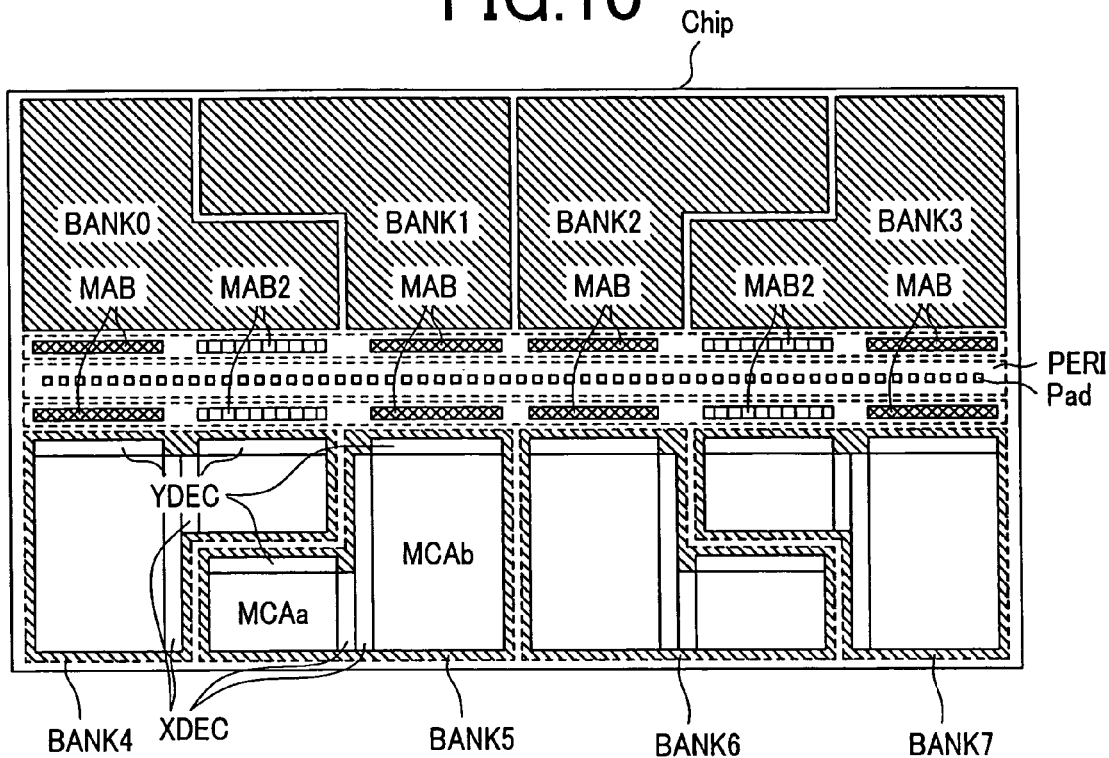
FIG. 10 is a layout view of memory blocks disposed in the chip according to a further modification of the first embodiment of the present invention.

A further modification of the first embodiment is shown in FIG. 10. In terms of configuration, this modification has the same configurational relationship as in FIG. 4 showing the foregoing modification of the first embodiment, and is characterized in that the number of splittings of each memory block is reduced from four to two. Length of the word lines driven by Y-decoders is increased by so doing, and word line speed is thus reduced, whereas the chip can be reduced in area since X-decoders can be reduced in circuit scale. A method of splitting memory blocks BANK0 to BANK7 in the present configuration is described hereunder using FIG. 40A. In the embodiment relating to FIG. 1, each memory block is split vertically so that a ratio of the number of bit lines is 1:1. In the present configuration, however, each memory block is only split into two segments horizontally so that a ratio of the number of word lines is about 1:2. Thus, the number of word lines on memory cell array MCAb becomes about twice that of memory cell array MCAa.

Figure 40A:
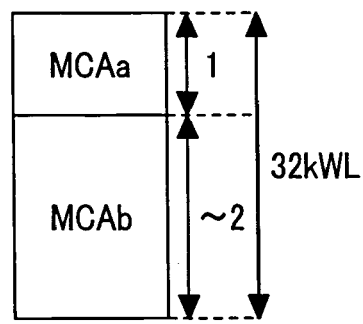
FIG. 40 is a diagram schematically showing yet another memory block splitting scheme.

FIG. 40A shows an example of arrangement of 32 k word lines. In the example, the memory cell array MCAa has 10 k word lines, whereas the memory cell array MCAb is constructed to have 22 k word lines. When the memory cell arrays MCAa, MCAb laid out vertically in FIG. 40A are horizontally laid out, this makes it possible to provide an L-shaped layout of these memory cell arrays. A detailed configuration of each memory block is a configuration with bit lines whose number is half of that of bit lines in each memory block in the embodiment of FIG. 4, and X-decoders, Y-decoders and main amplifier blocks are laid out in substantially the same-form as in the embodiment of FIG. 1. Advantages of the present configuration are discussed below. In addition to the foregoing advantages of FIG. 9, the present configuration offers the advantage that since the number of X-decoders is reduced, the chip area can be correspondingly reduced.

Figure 11:
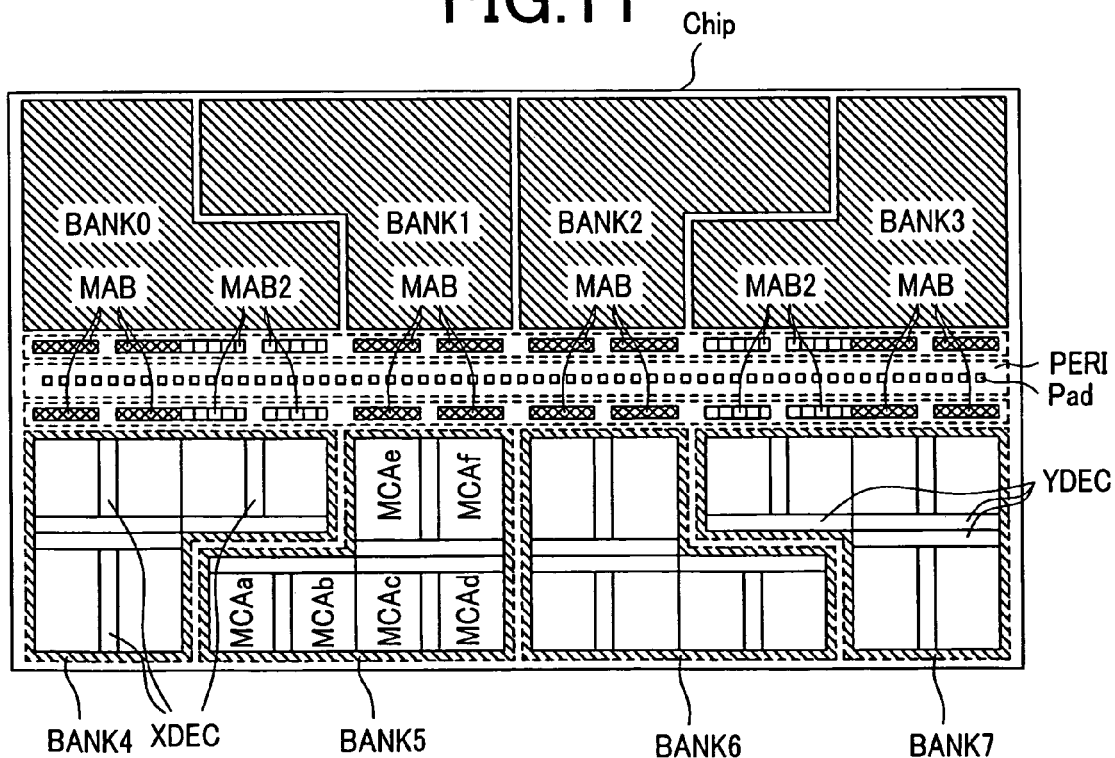
FIG. 11 is a layout view of memory blocks disposed in the chip according to a further modification of the first embodiment of the present invention.

A further modification of the first embodiment is shown in FIG. 11. The present modification is of much the same configuration as that of FIG. 5 showing the foregoing modification of the embodiment relating to FIG. 1. That is to say, the present modification is characterized in that each memory block, although constructed of four split segments shown in FIG. 1, is almost equally split into six segments. Wiring length of the Y-selection lines YS driven by Y-decoders is reduced by such splitting, and columnar operation speed can thus be improved. In addition, although the configuration shown in FIG. 1 differs by a factor of two in Y-selection line length between memory cell arrays, the configuration shown in FIG. 11 becomes almost equal in Y-selection line length and can thus reduce variations in columnar operating cycles and hence achieve faster operation.

Figure 41B:
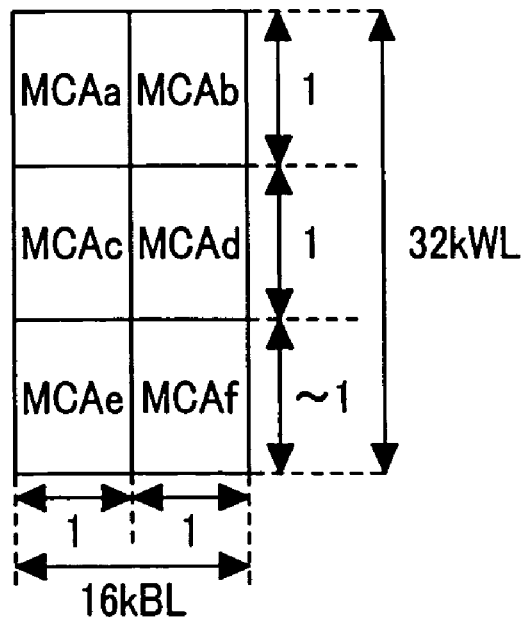

A method of splitting memory blocks BANK0 to BANK7 in the present configuration is described hereunder using FIG. 41B. In FIG. 9, each memory block is split vertically so that a ratio of the number of bit lines is 1:1 and further split into two segments horizontally so that a ratio of the number of word lines is 1:2. In the present configuration, however, each memory block is almost equally split into three segments horizontally so that a ratio of the number of word lines is 1:1:1. Thus, memory cell arrays MCAa, MCAb, MCAc, MCAd, MCAe, MCAf become almost equal to one another in the number of word lines. FIG. 41B shows an example of arrangement of 32 k word lines. In the example, the memory cell arrays MCAa-MCAd are each constituted by 5 k word lines, and MCAe, MCAf, by 6 k word lines each.

Although the memory cell arrays MCAa, MCAb, MCAC, MCAd, MCAe, MCAf are arranged so that there are three memory cell arrays in the vertical direction and two memory cells in the horizontal direction as shown in FIG. 41B, the memory block can be disposed in an L-shape by moving the memory cell arrays MCAb and MCAb in a horizontal direction of the memory cell arrays MCAc, MCAd, MCAe, MCAf. Next, a detailed configuration of each memory block is described below. In the present configuration, the number of bit lines is half of that of bit lines in each memory block in the foregoing configuration of FIG. 5, and X-decoders, Y-decoders, and main amplifier blocks are laid out in substantially the same form as adopted in the embodiment of FIG. 1.

Advantages of the present configuration are discussed below. In addition to the foregoing advantages of FIG. 9, the present configuration offers the advantage that fast columnar cyclic operation can be realized because of short wiring length of the Y-selection lines and because of insignificant differences in the Y-selection line length between the memory cell arrays.

Figure 12:
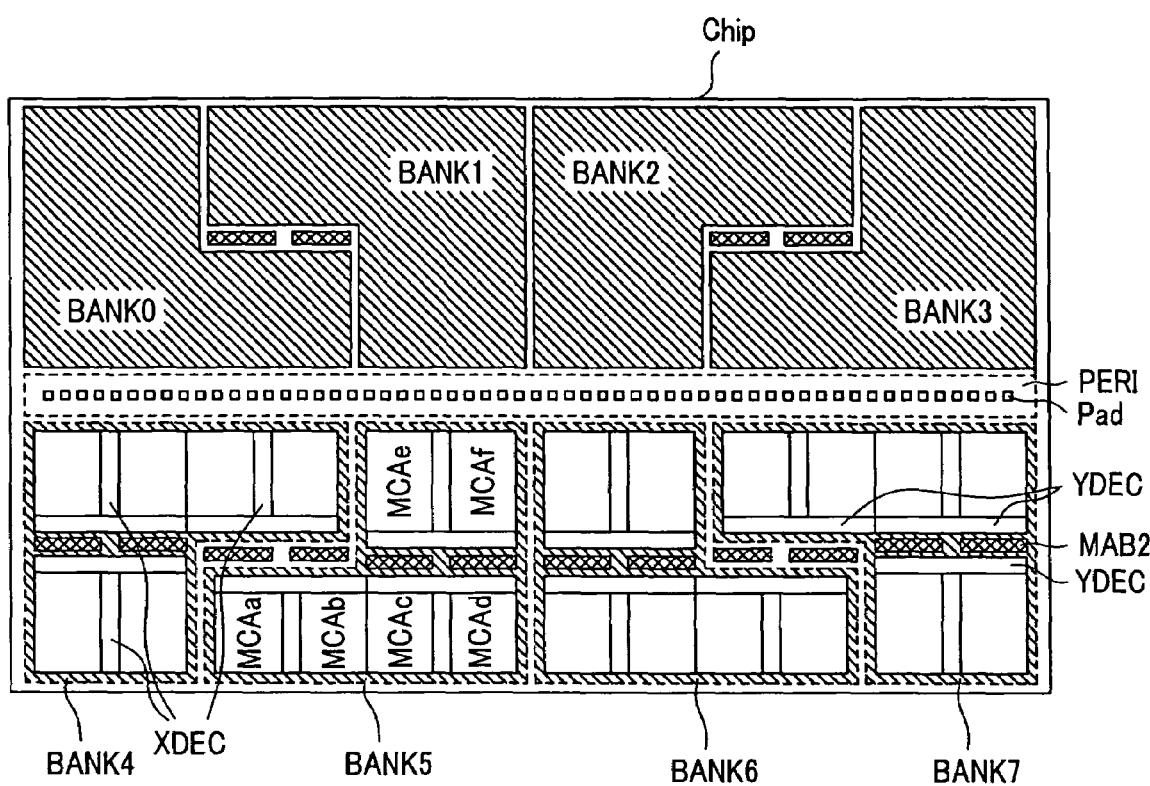
FIG. 12 is a layout view of memory blocks disposed in the chip according to a further modification of the first embodiment of the present invention.

Next, a further modification of the first embodiment is shown in FIG. 12. The present modification is of much the same configuration as that of FIG. 7 showing the foregoing modification of the embodiment relating to FIG. 1. That is to say, the present modification is characterized in that each memory block, although constructed of four split segments in FIG. 1, is almost equally split into six segments, and in that although the main amplifier blocks in the embodiment of FIG. 1 are arranged adjacently to the peripheral circuit region PERI in the central section of the chip, main amplifier blocks in the present modification are each arranged between Y-decoders. This arrangement provides advantages in that similarly to the foregoing configuration of FIG. 11, since length of the Y-selection lines driven by the Y-decoders, and the number of transistors connected become almost equal between memory cell arrays and since main IO line length also becomes equal therebetween, variations in columnar cyclic operating speed can be reduced and even faster columnar cyclic operation can thus be achieved. Next, a detailed configuration of each memory block is described below. In the present configuration, the number of bit lines is half of that of bit lines in each memory block in the foregoing configuration of FIG. 7, and X-decoders, as well as the Y-decoders and the main amplifier blocks, are laid out in substantially the same form as adopted in the embodiment of FIG. 1.

Advantages of the present configuration are discussed below. In addition to the foregoing advantages of FIG. 9, the present configuration offers the advantage that fast columnar cyclic operation can be realized because of short wiring length of the Y-selection lines and because of insignificant variations in the Y-selection line length between the memory cell arrays.

Figure 13:
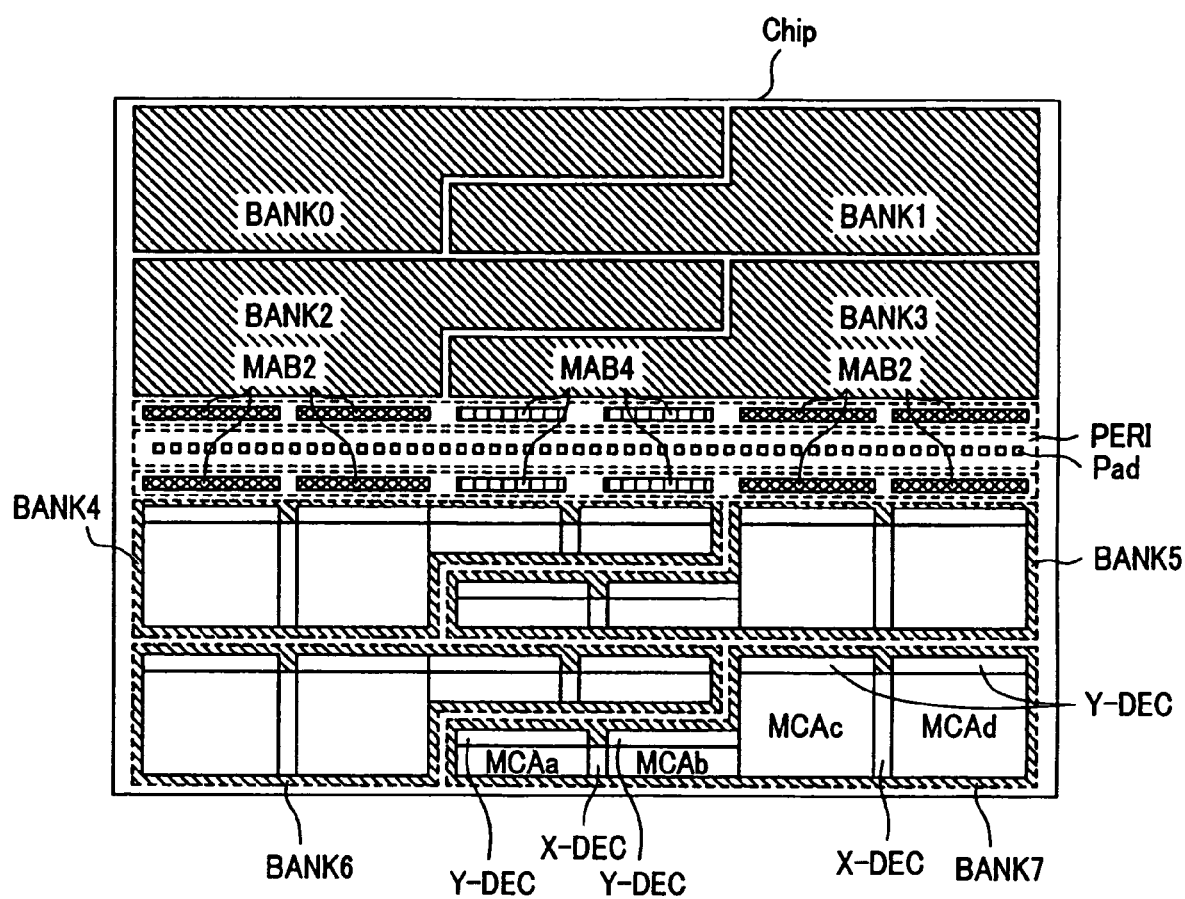
FIG. 13 is a layout view of memory blocks disposed in the chip according to a further modification of the first embodiment of the present invention.
Figure 40B:
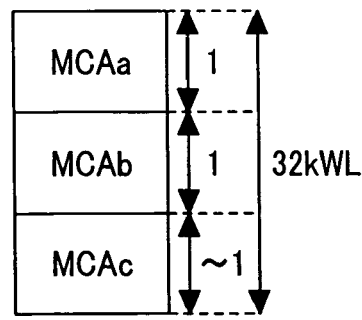
Figure 40C:
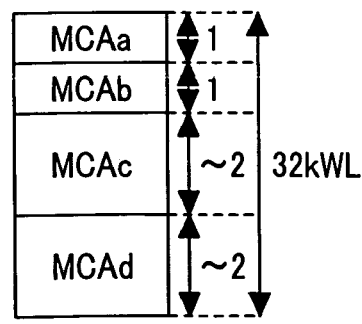

Next, a further modification of the first embodiment is shown in FIG. 13. A chip configuration in the present modification includes eight independent memory blocks, BANK0 to BANK7, a peripheral circuit region PERI in which an input/output circuit block, a data control circuit block, an internal power supply voltage output circuit, a clock synchronizing circuit, a test circuit, and other sections are arranged, and main amplifier blocks MAB2's and MAB4's adapted to output data from each memory block to the peripheral circuit region PERI. Each memory block is split into four memory cell arrays, MCAa, MCAb, MCAc, MCAd. FIG. 40C shows how the memory block constructed of 32 k word lines (WLs) and 16 k bit lines (BLs) is split. As shown in the figure, the memory cell arrays MCAa, MCAb have the same number of word lines.

The memory cell arrays MCAc, MCAd have about twice the number of word lines on the memory cell array MCAa, MCAb. The memory cell arrays MCAa, MCAb also have the same number of bit lines. In addition, the memory cell arrays MCAc, MCAd have the same number of bit lines. It becomes possible, by splitting one memory block with an aspect ratio of about 1:2 in this way, to form each of the memory blocks BANK0 to BANK7 into an L-shape (or into an inversed or rotated form of L) as shown in FIG. 13. The region constituted by the memory blocks BANK0 to BANK3 at this time takes a shape of about 1:4 in aspect ratio, and combining these memory blocks with the remaining memory blocks BANK4 to BANK7 makes a chip shape of about 1:2 achievable.

Figure 14:
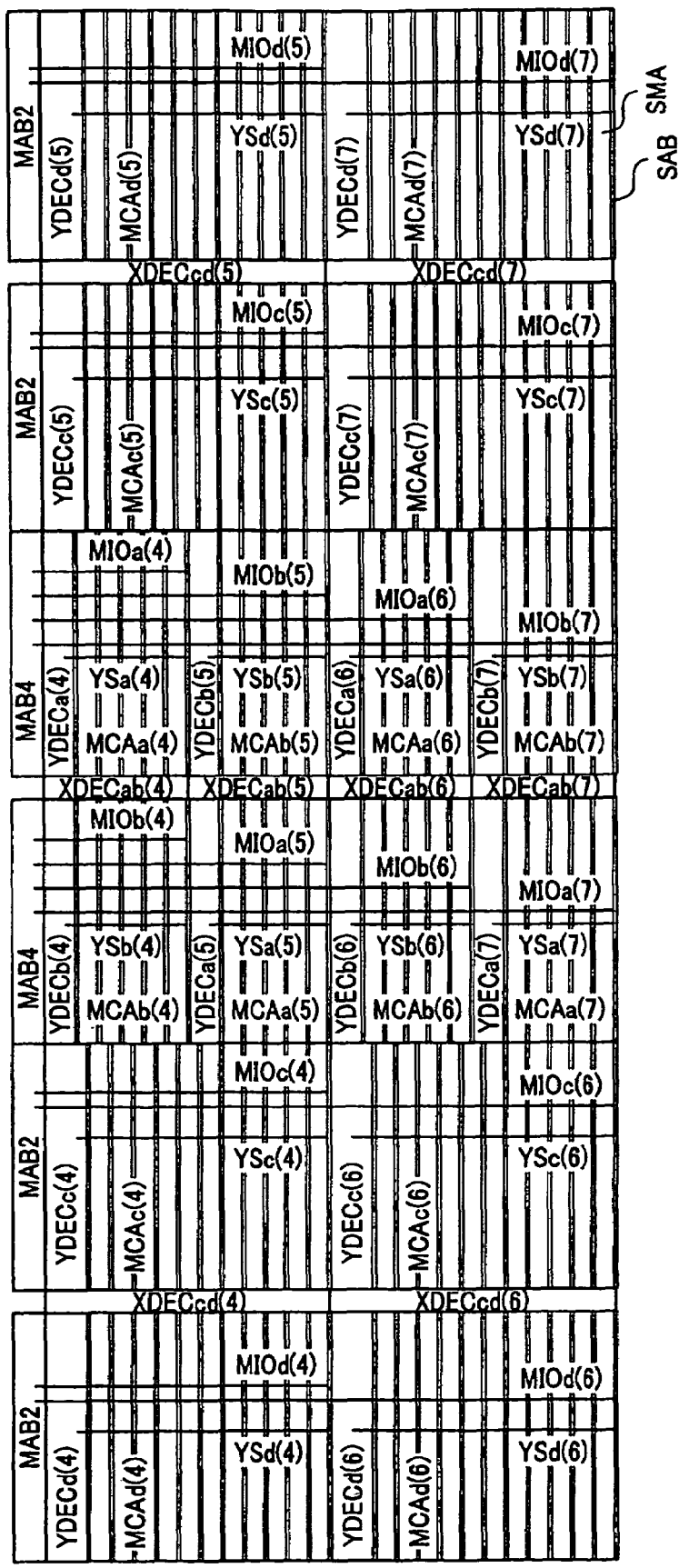
FIG. 14 is a diagram showing the memory blocks 4, 5, 6, 7 shown in FIG. 13.

FIG. 14 shows an example of an array configuration which presupposes a multi-segment bit line arrangement of memory blocks BANK4 to BANK7 in the chip. As shown in FIG. 40C, the number of word lines on memory cell arrays MCAc and MCAd is each twice that of memory cell arrays MCAa and MCAb. Accordingly, in the multi-segment bit line arrangement with bit lines split to divide each memory cell array into sub-memory arrays SMAs in units of a required number of word lines, the number of sub-memory arrays on the memory cell arrays MCAc and MCAd each is also about twice that of the memory cell arrays MCAa and MCAb.

In FIG. 14, the number of sub-memory arrays SMAs on the memory cell arrays MCAa and MCAb each is 10, whereas that of the memory cell arrays MCAe and MCAf each is 22. The number of sub-memory arrays is not limited to these values. One feature is that a sub-memory array ratio between the two sets of memory cell arrays is roughly 1:2. A sense amplifier block SAB in which a plurality of sense amplifiers each connected to a bit line or for each pair of bit lines are arranged is interposed between the sub-memory arrays.

Next, a description will be given with attention focused on the memory block BANK7. Other memory blocks are also of the same configuration. An X-decoder XDECab(7) for selecting an associated word line from an X-address that has been input is disposed between memory cell arrays MCAa(7) and MCAb(7). The X-decoder XDECab(7) simultaneously activates the memory cell arrays MCAa(7) and MCAb(7) arranged at both sides of the X-decoder. Similarly, an X-decoder XDECcd(7) for selecting an associated word line from an X-address that has been input is disposed between memory cell arrays MCAc(7) and MCAd(7). The X-decoder XDECcd(7) simultaneously activates the memory cell arrays MCAc(7) and MCAd(7) arranged at both sides of the X-decoder. In this case, since the memory cell arrays MCAa(7), MCAb(7), MCAc(7), MCAd(7) are of the same memory block, one specific word line WL is selected from XDECab(7) and XDECcd(7), with respect to MCAa(7) and MCAb(7) or MCAc(7) and MCAd(7). That is to say, word lines are not selected from XDECab(7) and XDECcd(7) at the same time.

A Y-decoder YDECa(7), YDECb(7), YDECc(7), YDECd (7), each for selecting a Y-selection line YSa(7), YSb(7), YSc(7), YSd(7), respectively, from a Y-address that has been input, are disposed on one sides of the memory cell array MCAa(7), MCAb(7), MCAc(7), or MCAd(7), respectively, which are adjacent to and orthogonal to the associated X-decoder. The Y-decoders YDECa(7), YDECb(7) are activated only when any word line is selected from the X-decoder XDECab(7), and are not activated when a word line is selected from the X-decoder XDECcd(7). Conversely, the Y-decoders YDECc(7), YDECd(7) are activated only when any word line is selected from the X-decoder XDECcd(7), and are not activated when a word line is selected from the X-decoder XDECab(7). Main amplifier blocks MAB2's with main IO lines MIOc(7) and MIOd(7) connected thereto for transferring, among all data going out from the memory cell arrays to a sense amplifier SA, only data selected by Y-selection line driving, are disposed adjacently to a peripheral circuit region PERI in a central section of the chip. In addition to the main IO lines MIOc(7) and MIOd(7) from the memory block BANK7, main IO lines MIOc(5) and MIOd(5) are connected to the main amplifier blocks MAB2's, the main IO lines MIOc(5) and MIOd(5) being routed from the memory block BANK5 disposed between the memory block BANK7 and the main amplifier blocks MAB2s.

Main IO lines MIOa(7) and MIOb(7) each connected at one end to the memory cell arrays MCAa(7) and MCAb(7), respectively, are connected at the other end to main amplifier blocks MAB4's adjacent to the main amplifier blocks MAB2's described above. At this time, wiring is conducted midway on memory cell arrays MCAa(4), MCAb(4), MCAa (5), MCAb(5), MCAa(6), and MCAb(6) of the adjacent memory block BANK4 to BANK6, and the wiring is provided simply as pass-through wiring. In addition to the main IO lines MIOc(7) and MIOd(7) from the memory blocks BANK4 to BANK7, main IO lines MIOa(4), MIOb(4), MIOa (5), MIOb(5), MIOa(6), and MIOb(6) are connected to the main amplifier blocks MAB4's, the main IO lines MIOa(4), MIOb(4), MIOa(5), MIOb(5), MIOa(6), and MIOb(6) being routed from the memory blocks BANK4-BANK6 disposed between the memory block BANK7 and the main amplifier blocks MAB4s.

In the present configuration, although a wiring load differs between the main IO lines MIOa(7), MIOb(7), and MIOc(7), MIOd(7), no problems occur since larger signals are generated in the main IO lines MIOa(7) and MIOb(7) by driving the main amplifier in the timing that high enough signals are output through the main IO lines MIOc(7) and MIOd(7) that are large in wiring load. The main amplifier blocks MAB2s and MAB4s are also characterized in that similarly to selection from one of the above-described Y-decoders, selection of a word line from the X-decoder XDECab(7) activates the associated main amplifier block MAB2, and that selection of a word line from the X-decoder XDECcd(7) does not activate the associated main amplifier block MAB2. Conversely, selection of a word line from the X-decoder XDECcd(7) activates the associated Y-decoder main amplifier block MAB2, and selection of a word line from the X-decoder XDECab(7) does not activate the associated Y-decoder main amplifier block MAB2.

Figure 32:
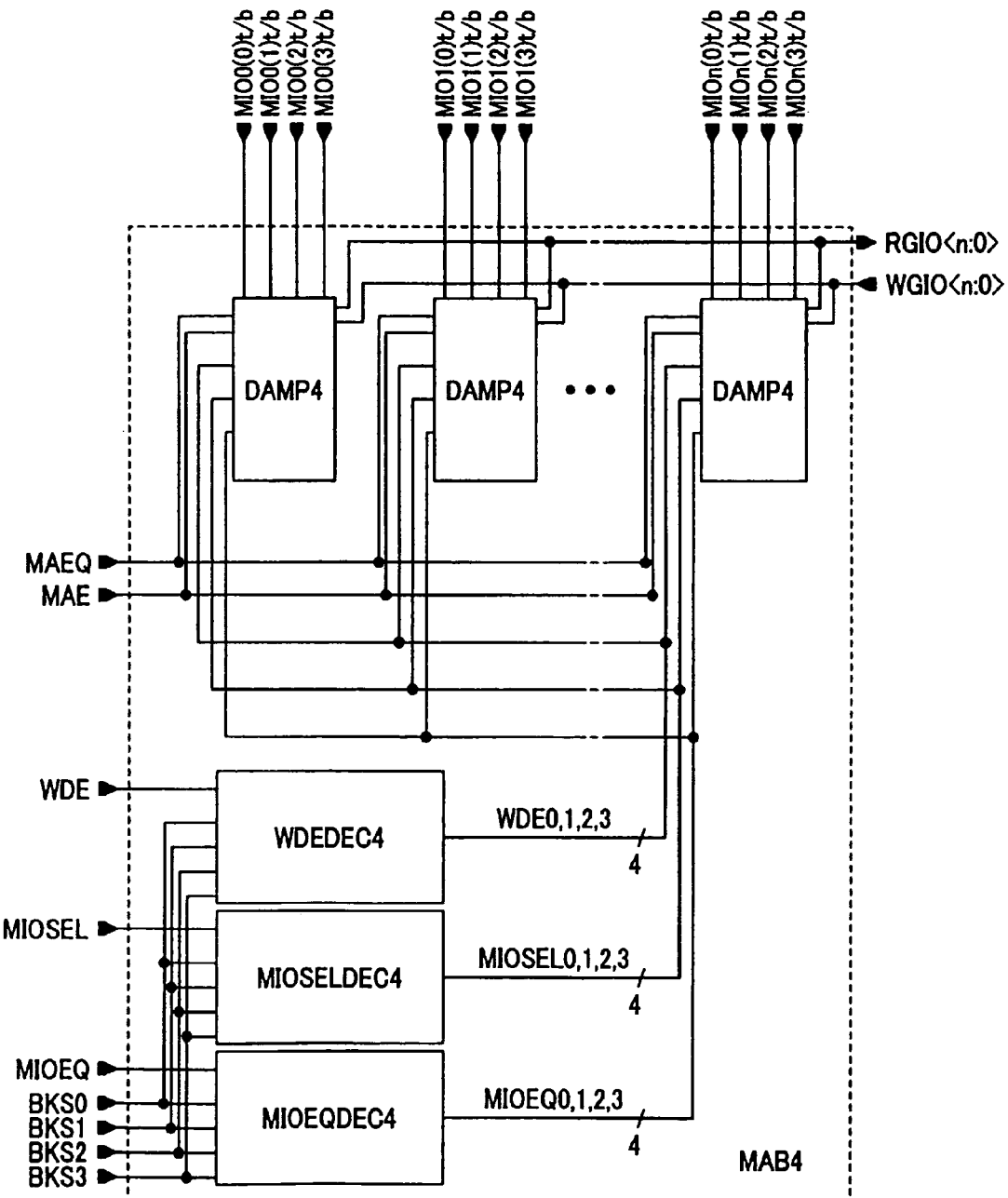
FIG. 32 shows another example of main circuit configuration of a main amplifier block.
Figure 36:
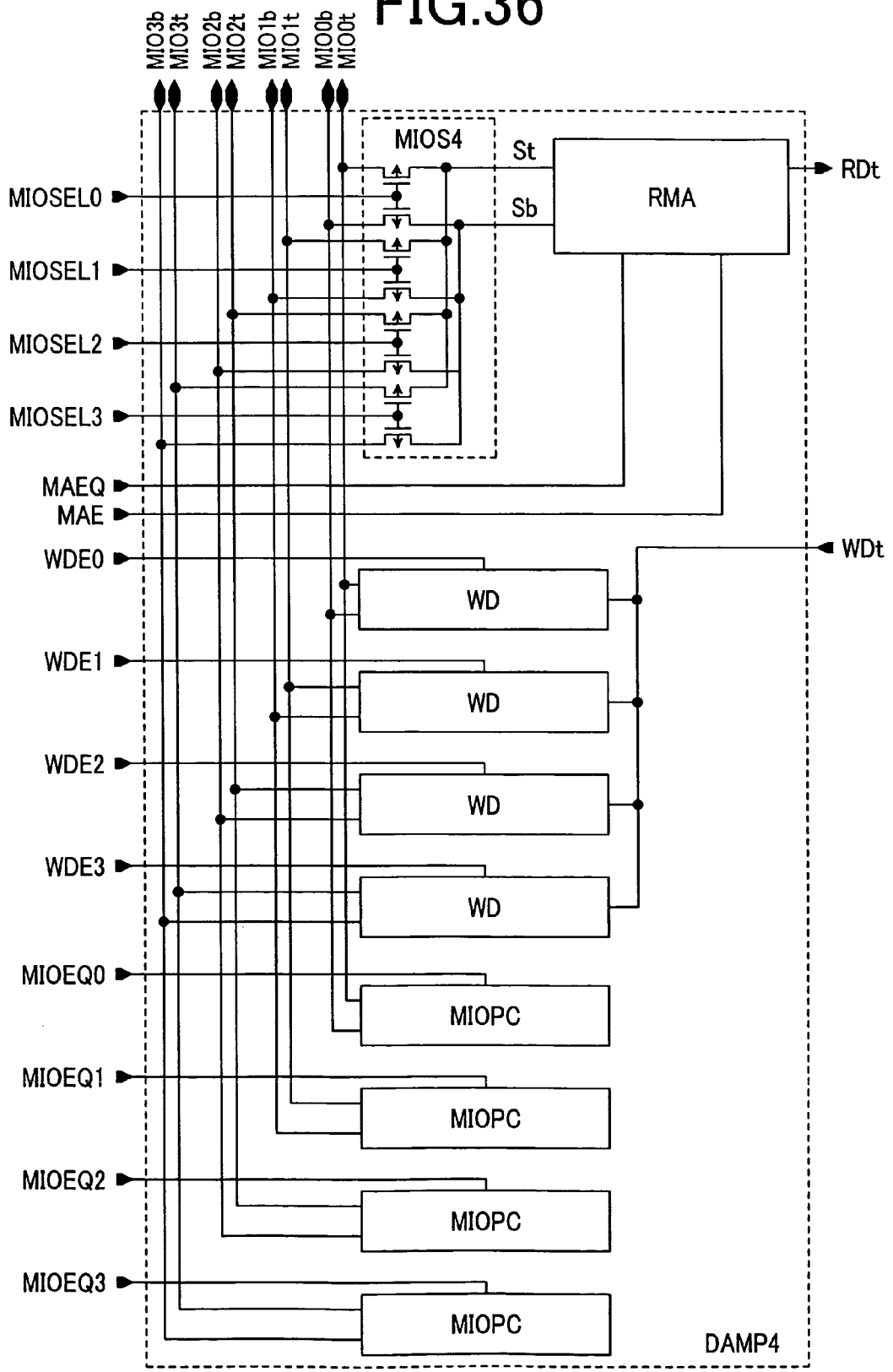
FIG. 36 shows yet another example of data amplifier circuit configuration.

Next, a configuration of the main amplifier blocks MAB4s to which the main IO lines MIOa(7) and MIOb(7) of the memory cell arrays MCAa(7) and MCAb(7) are connected is described below using FIG. 32. Both main amplifier blocks MAB4s have a plurality of data amplifiers DAMP4s. The number of data amplifiers DAMP4s arranged is desirably the same as the number of above-described data amplifiers DAMPs, DAMP2s. Next, circuit composition of one data amplifier DAMP4 is described below using FIG. 36. This circuit includes a main IO line selector MIOS4 that selects one pair of main IO lines from four sets of main IO line pairs, a read data main amplifier RMA connected to an output of the main IO line selector, write amplifiers WDs each connected to one of the main IO lines, and a main IO line precharger MIOPC.

In the present configuration, either of the four sets of main IO line pairs, namely, MIO0t/b, MIO1t/b, MIO2t/b, MIO3t/b, is selected in accordance with a main IO line selection signal MIOSEL0, MIOSEL1, MIOSEL2, or MIOSEL3, by the main IO line selector MIOS4, and then connected to an internal node St/b of the read data main amplifier RMA. To realize this configuration of sharing the data amplifier DAMP4, it is necessary that no reading or writing should occur simultaneously to the main IO line pair connected to the main IO line selector.

In FIGS. 13 and 14, not only the main IO lines MIOa(7) and MIOb(7) of the memory cell arrays MCAa(7) and MCAb(7) in the memory block BANK7, but also the main IO lines MIOb(4), MIOa(5), and MIOb(6) of the memory cell arrays MCAb(4), MCAa(5), and MCAb(6) in the memory blocks BANK4-BANK6 are connected in the main amplifier blocks MAB4s. In addition, the main IO lines MIOa(4), MIOb(5) and MIOa(6) of the memory cell arrays MCAa(4), MCAb(5) and MCAa(6) are connected in the main amplifier blocks MAB4s. Since both of the Y-decoders of the memory blocks BANK4, BANK5, BANK6, and BANK7 are not activated at the same time, a common amplifier DAMP4 can be used for the main IO lines MIOb(4), MIOa(5), MIOb(6), and MIOa (7). For the same reason, a common data amplifier DAMP4 can be used for the main IO lines MIOb(4), MIOa(5), MIOb (6), and MIOa(7). The read main amplifier RMA, the write amplifiers WD, and the main IO prechargers MIOPC can be the same as those of FIG. 33 in terms of circuit configuration. However, those write amplifier enable signals WDE0 to WDE3 and main IO equalize signals MIOEQ0 to MIOEQ3 that are input to each such circuit, and the main IO line selection signals MIOSEL0 to MIOSEL3 are output from such decoder circuits as shown in FIG. 37A to 37C.

Figure 37A:
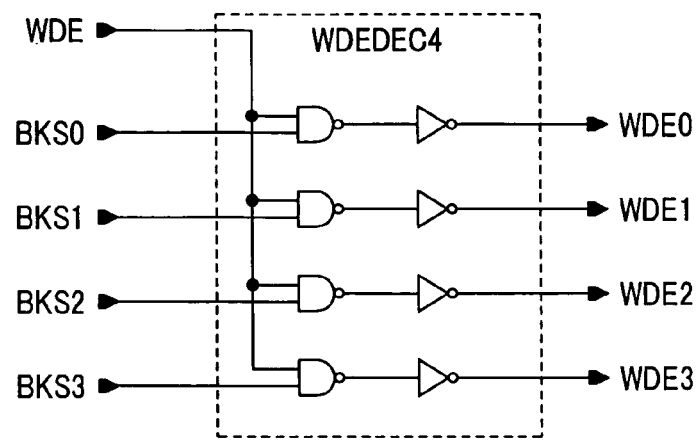
FIG. 37 shows another example of data amplifier control signal decoder circuit configuration.
Figure 37B:
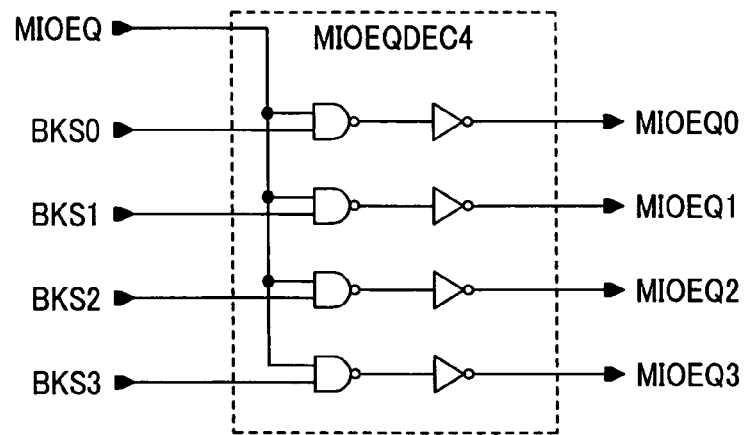
Figure 37C:
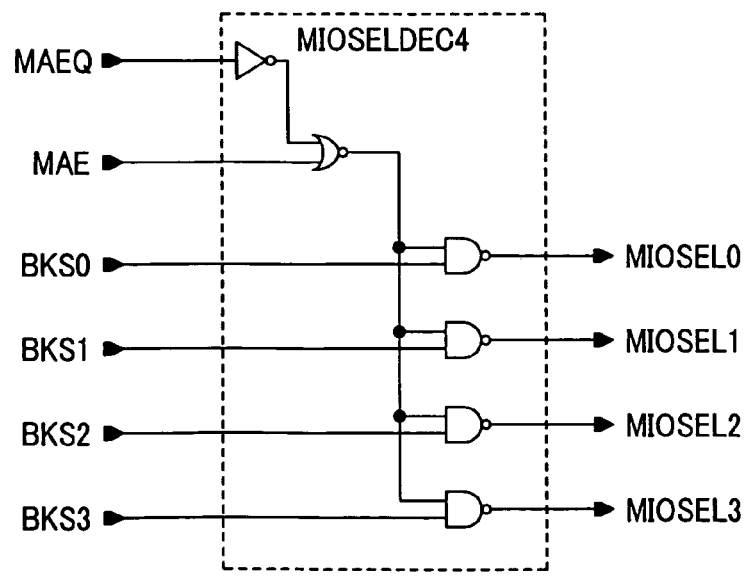

FIGS. 37A-37C respectively show examples of configuration of a write amplifier enable signal decoder circuit WDEDEC4 that outputs the write amplifier enable signals WDE0-WDE3, configuration of a main IO equalize signal decoder circuit MIOEQDEC4 that outputs the main IO equalize signals MIOEQ0-MIOEQ3, and configuration of a main IO line selection signal decoder circuit MIOSELDEC4 that outputs the main IO line selection signals MIOSEL0-MIOSEL3. The write amplifier enable signal decoder circuit WDEDEC2 takes the circuit configuration that outputs the write amplifier enable signal WDE0-WDE1 according to particular results of logical ANDing between a write amplifier enable signal WDE and a memory block selection signal BKS0-BKS3.

The memory block selection signals BKS0-BKS3 here are selected when reading/writing occurs to the associated main IO lines MIO0t/b, MIO1t/b, MIO2t/b, MIO3t/b. For example, in FIG. 14, when a word line of the memory cell array MCAa (4), MCAb(4) in the memory block BANK4 is selected from the X-decoder XDECab(4) and the Y-selection lines YSa(4) and YSb(4) are further activated from the Y-decoders YDECa (4) and YDECb(4), the memory block selection signal BKS0 is activated by the above selection and activation.

Similarly, in FIG. 14, when a word line of the memory cell array MCAa(5), MCAb(5) in the memory block BANK5 is selected from the X-decoder XDECab(5) and the Y-selection lines YSa(5) and YSb(5) are further activated from the Y-decoders YDECa(5) and YDECb(5), the memory block selection signal BKS1 is activated by the above selection and activation. Similarly, in FIG. 14, when a word line of the memory cell array MCAa(6), MCAb(6) in the memory block BANK6 is selected from the X-decoder XDECab(6) and the Y-selection lines YSa(6) and YSb(6) are further activated from the Y-decoders YDECa(6) and YDECb(6), the memory block selection signal BKS2 is activated by the above selection and activation.

Similarly, in FIG. 14, when a word line of the memory cell array MCAa(7), MCAb(7) in the memory block BANK7 is selected from the X-decoder XDECab(7) and the Y-selection lines YSa(7) and YSb(7) are further activated from the Y-decoders YDECa(7) and YDECb(7), the memory block selection signal BKS3 is activated by the above selection and activation. The configuration of this circuit can be realized since, as described above, the Y-decoders YDECa(4), YDECb (4), YDECa(5), YDECb(5), YDECa(6), YDECb(6), YDECa (7), and YDECb(7) of the memory blocks BANK4 to BANK7, respectively, are not activated at the same time. The main IO equalize signal decoder circuit MIOEQDEC4 outputs the main IO equalize signal MIOEQ0-MIOEQ3 according to particular results of logical ANDing between the main IO equalize signal MIOEQ and the memory block selection signal BKS0-BKS3. The main IO line selection signal decoder circuit MIOSELDEC4 conducts a logical ANDing operation between the main amplifier equalize signal MAEQ, the main amplifier enable signal MAE, and the memory block selection signal BKS0-BKS3, and correspondingly outputs the main IO line selection signal MIOSEL0-MIOSEL3.

Sharing one data amplifier circuit among memory blocks adjacent to one another in this way enables reduction in circuit scale and hence, reduction in area. Variations in transistor threshold voltage against an input signal become a problem in the amplifier circuit represented by a cross-coupling read amplifier. Sharing makes it possible to use such transistors of a large area that reduce the variations, even for the same area as obtained in a non-sharing state.

Advantages of the present configuration are discussed below. In addition to the foregoing advantages of FIG. 1, the present configuration offers the advantage that since there are eight memory block regions that can internally operate independently of one another, the chip is suitable for random access operation, compared with the chip of the embodiment relating to FIG. 1.

Figure 15:
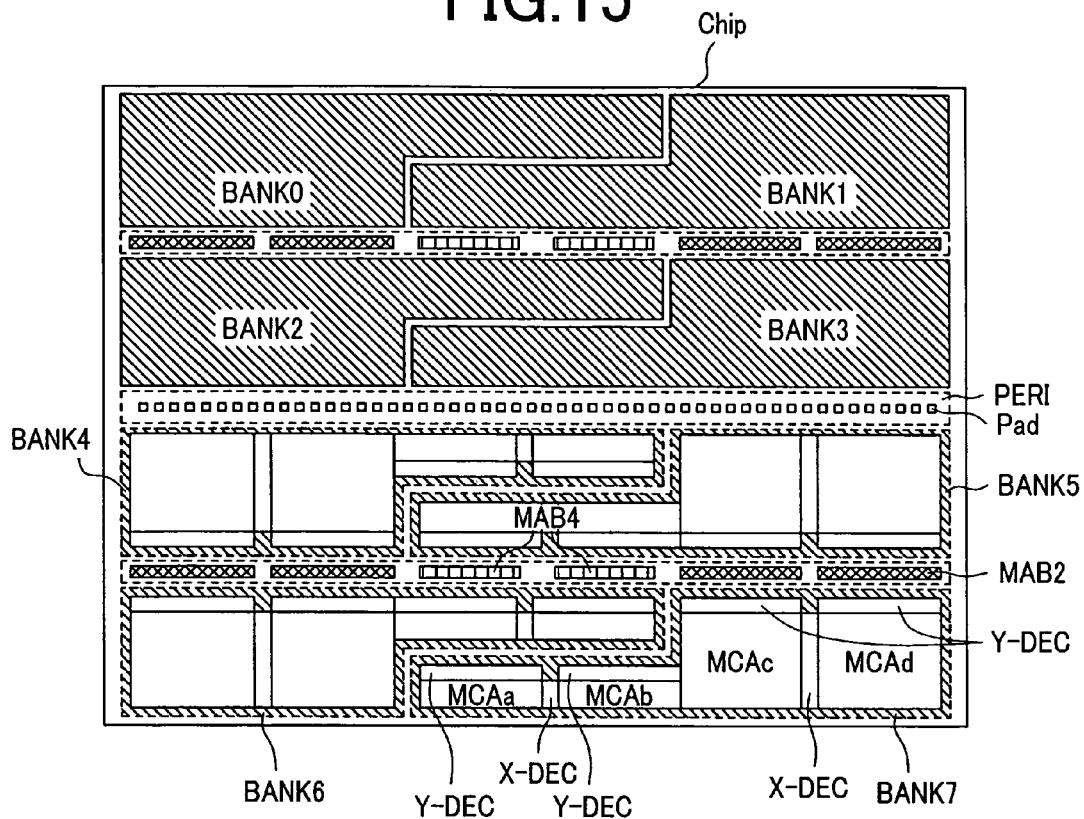
FIG. 15 is a layout view of memory blocks disposed in the chip according to a further modification of the first embodiment of the present invention.

A further modification of the first embodiment is shown in FIG. 15. In the present modification, memory blocks are each split in the same way as that of FIG. 13. The main amplifier blocks, although arranged adjacently to the peripheral circuit region PERI in the central section of the chip in other modifications of the first embodiment, are each located between Y-decoders in the present modification. This arrangement provides advantages in that since length of Y-selection lines selected by the Y-decoders, and the number of transistors connected become almost equal between memory cell arrays and since main IO line length also becomes equal therebetween, variations in columnar cyclic operating speed can be reduced and even faster columnar cyclic operation can thus be achieved.

Figure 16:
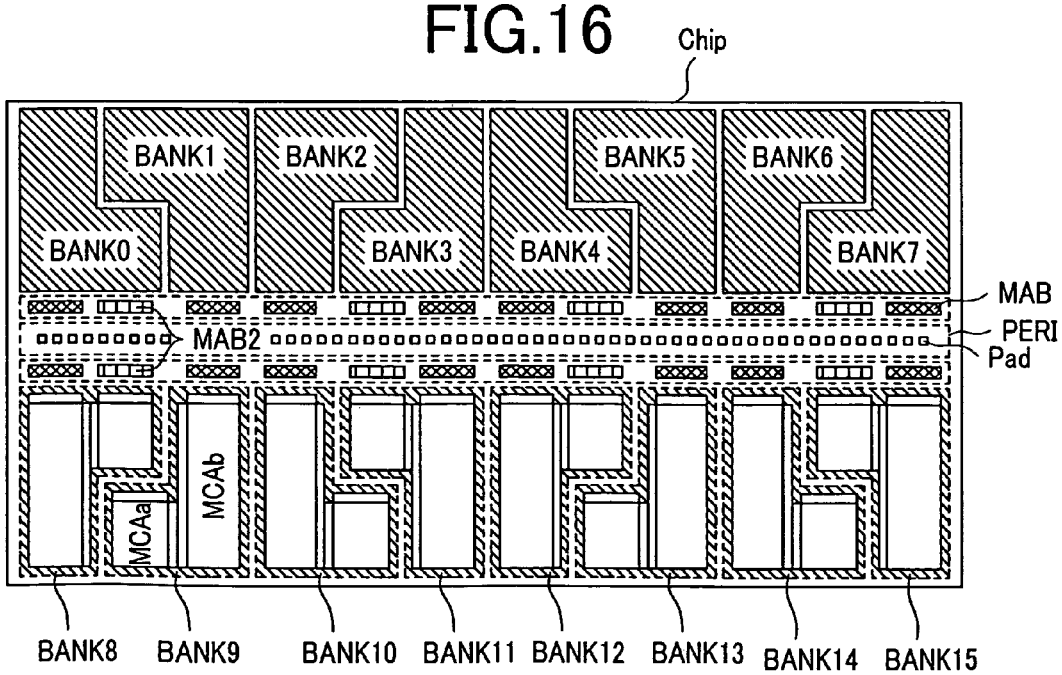
FIG. 16 is a layout view of memory blocks disposed in the chip according to a further modification of the first embodiment of the present invention.
Figure 42A:
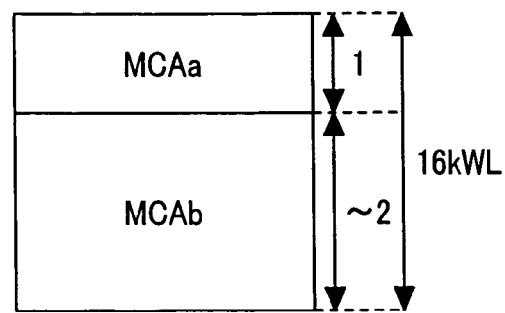
FIG. 42 is a diagram schematically showing a further memory block splitting scheme.
Figure 42B:
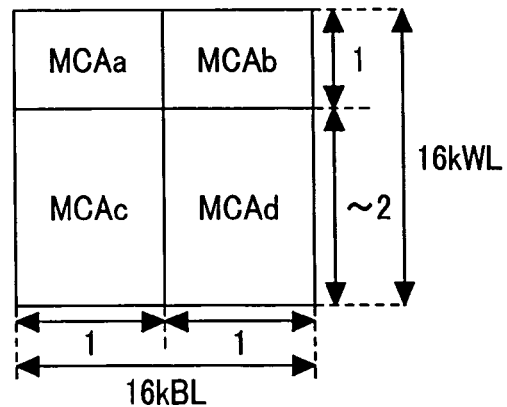
Figure 42C:
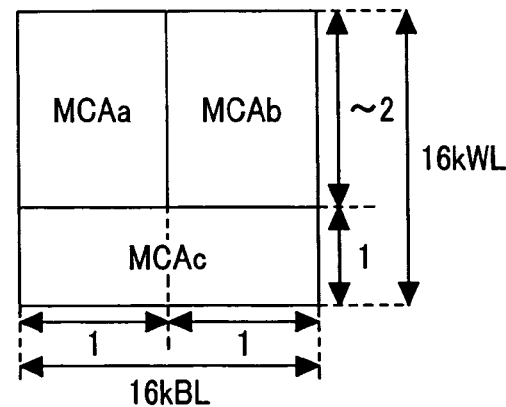
Figure 42D:
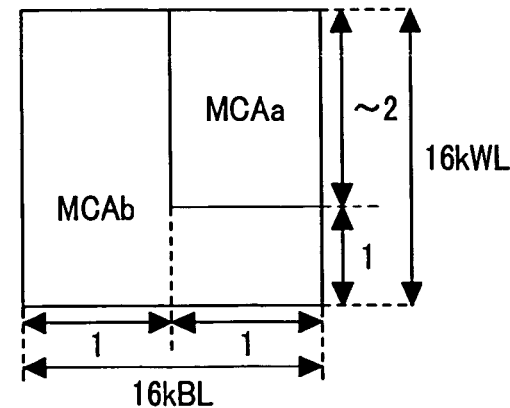

Next, a further modification of the first embodiment is shown in FIG. 16. In the present configuration, the number of bit lines in each memory block in the embodiment of FIG. 1 is reduced to ¼. How the memory blocks are split in the present configuration is shown in FIG. 42D. In the present configuration, a memory cell array MCAb is split into two regions, but the memory cell array MCAb is deformed to have 22 k word lines and 8 k bit lines. This formation splits the memory cell array MCAb to have word lines twice as many as there actually are word lines on a memory cell array MCAa. Additionally, arranging the memory cell arrays MCAb and MCAa next to each other makes it possible to realize an L-shaped memory block BANK. Combining two such L-shaped memory blocks into the L-shaped memory block BANK8, BANK9 arrangement format shown in FIG. 16 makes it possible to provide an essentially square memory area. In the present modification, since the chip is split into 16 memory blocks, these memory blocks can be combined to obtain a 1:2 chip shape. A detailed internal configuration of the memory blocks is essentially the same as for the embodiment described above. Advantages of the present configuration are discussed below. The present configuration has 16 independent memory blocks, so the configuration is suitable for random access operation, compared with any of the foregoing modifications. In addition, since the chip is split into 16 memory blocks, there are also advantages in that the region activated during one access operation is narrowed and in that electric power consumption during the access operation can be reduced as a result.

Figure 17:
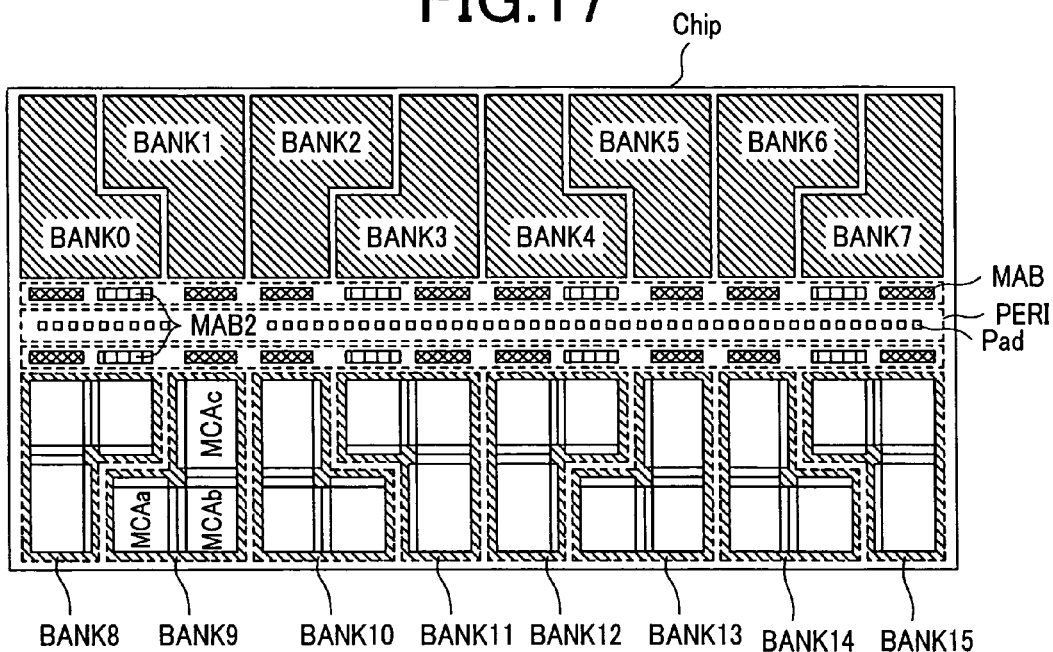
FIG. 17 is a layout view of memory blocks disposed in the chip according to a further modification of the first embodiment of the present invention.

Next, a further modification of the first embodiment is shown in FIG. 17. The present configuration is characterized in that although each memory block in the foregoing configuration of FIG. 16 is split into two segments with a ratio of 1:2, memory blocks in the present configuration are each almost equally split into three segments with a ratio of 1:1:1. How the memory blocks are split in the present configuration is shown in FIG. 42C. In the present configuration, the memory cell array MCAb described above is further split in a word line direction to have two regions of space. Memory cell arrays MCAa, MCAb, MCAc are arranged so that MCAc is above MCAb and so that MCAa is located to the left of MCAb, whereby L-shaped memory cell blocks can be created. Combining these memory blocks into an L-shaped memory block BANK8, BANK9 arrangement format similarly to FIG. 16 makes it possible to provide an essentially square memory area. In the present modification, since the chip is split into 16 memory blocks, these memory blocks can be combined to obtain a 1:2 chip shape. A detailed internal configuration of the memory blocks is essentially the same as for the embodiment described above. Advantages of the present configuration are discussed below. In addition to the foregoing advantages of the configuration in FIG. 16, the present configuration has essentially the same advantages as those of the configuration in FIG. 1. That is to say, since wiring length of Y-selection lines becomes equal on all memory cell arrays, variations in columnar cyclic operating speed between the memory cell arrays can be reduced and faster columnar operation can thus be achieved.

Figure 18:
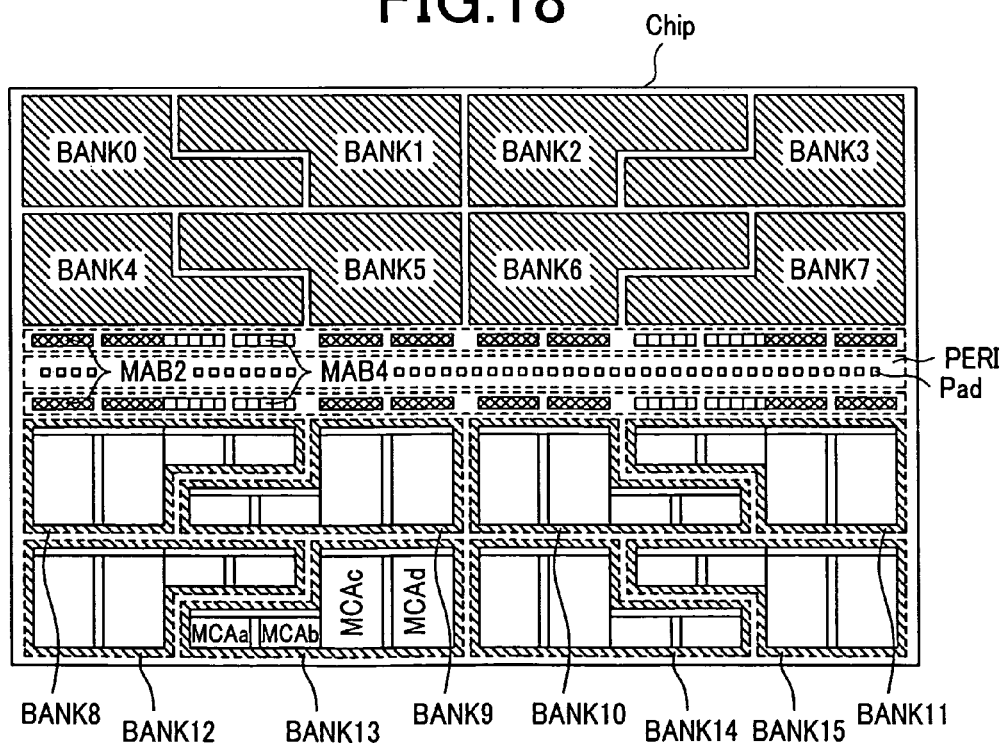
FIG. 18 is a layout view of memory blocks disposed in the chip according to a further modification of the first embodiment of the present invention.

Next, a further modification of the first embodiment is described below using FIG. 18. As with FIG. 16, FIG. 18 shows a chip configuration split into 16 memory blocks. Each memory block is constructed to have half as many as there actually are word lines and bit lines in each memory block of the embodiment relating to FIG. 1. How the chip is split into the memory blocks in the present configuration is shown in FIG. 42B. FIG. 42B shows a way of splitting a memory block constructed of 16 k word lines (WLs) and 16 k bit lines (BLs). For a folded memory cell array of an $8F^2$ memory cell size, the memory block has a capacity of 16 k×16 k÷2=128 Mb.

As shown, memory cell arrays MCAa, MCAb have the same number of word lines. Memory cell arrays MCAc, MCAd have about twice the number of word lines on the memory cell array MCAa, MCAb. The memory cell arrays MCAa, MCAb also have the same number of bit lines. In addition, the memory cell arrays MCAc, MCAd have the same number of bit lines. It becomes possible, by splitting one memory block with a ratio of about 1:2 in this way, to form each memory block into an L-shape (or into an inversed or rotated form of L) as shown in FIG. 18. Combining these memory blocks makes a 1:2 chip shape achievable. The configuration of each memory block in FIG. 18 has bit lines half as many as those formed in each memory block in FIG. 12, and details are substantially the same as in FIG. 12. Advantages of the present configuration are discussed below. In addition to the advantages of the embodiment relating to FIG. 1, the present configuration offers the advantage that since 16 independent memory blocks can be constructed, the chip is suitable for random access operation.

Figure 19:
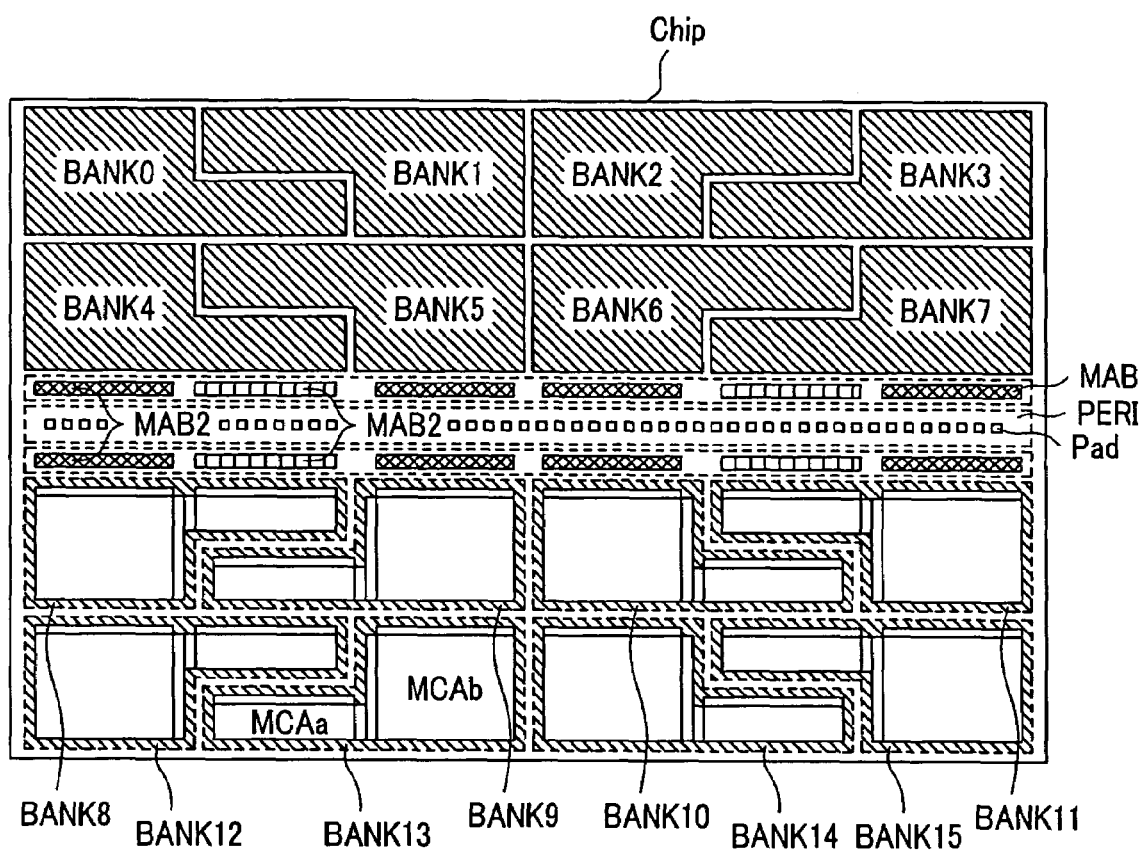
FIG. 19 is a layout view of memory blocks disposed in the chip according to a further modification of the first embodiment of the present invention.

A further modification of the first embodiment is shown in FIG. 19. In terms of configuration, this modification is characterized in that the number of splittings of each memory block in FIG. 18 is reduced from four to two. Length of the word lines driven by X-decoders is increased by such splitting, and word line speed is thus reduced, whereas the chip can be reduced in area since the X-decoders can be reduced in circuit scale. A method of splitting memory blocks BANK0 to BANK15 in the present configuration is described hereunder using FIG. 42A. In the embodiment relating to FIG. 1, each memory block is split vertically so that a ratio of the number of bit lines is 1:1. In the present configuration, however, each memory block is only split into two segments horizontally for a word line ratio of about 1:2.

Thus, the number of word lines on memory cell array MCAb becomes about twice that of memory cell array MCAa. FIG. 42A shows an example of arrangement of 16 k word lines. In the example, the memory cell array MCAa has 5 k word lines, whereas the memory cell array MCAb is constructed to have 11 k word lines. Arranging the memory cell arrays MCAa, MCAb next to each other makes L-shaped layout of memory cell arrays possible, and combining the memory blocks makes a 1:2 chip shape achievable. The configuration of each memory block in FIG. 19 is a configuration with bit lines half as many as there actually are bit lines in each memory block in FIG. 13, and details are essentially the same as those shown in FIG. 13. Advantages of the present configuration are discussed below. In addition to the foregoing advantages of FIG. 18, the present configuration offers the advantage that since the number of X-decoders is reduced, the chip area can be correspondingly reduced.

Figure 20:
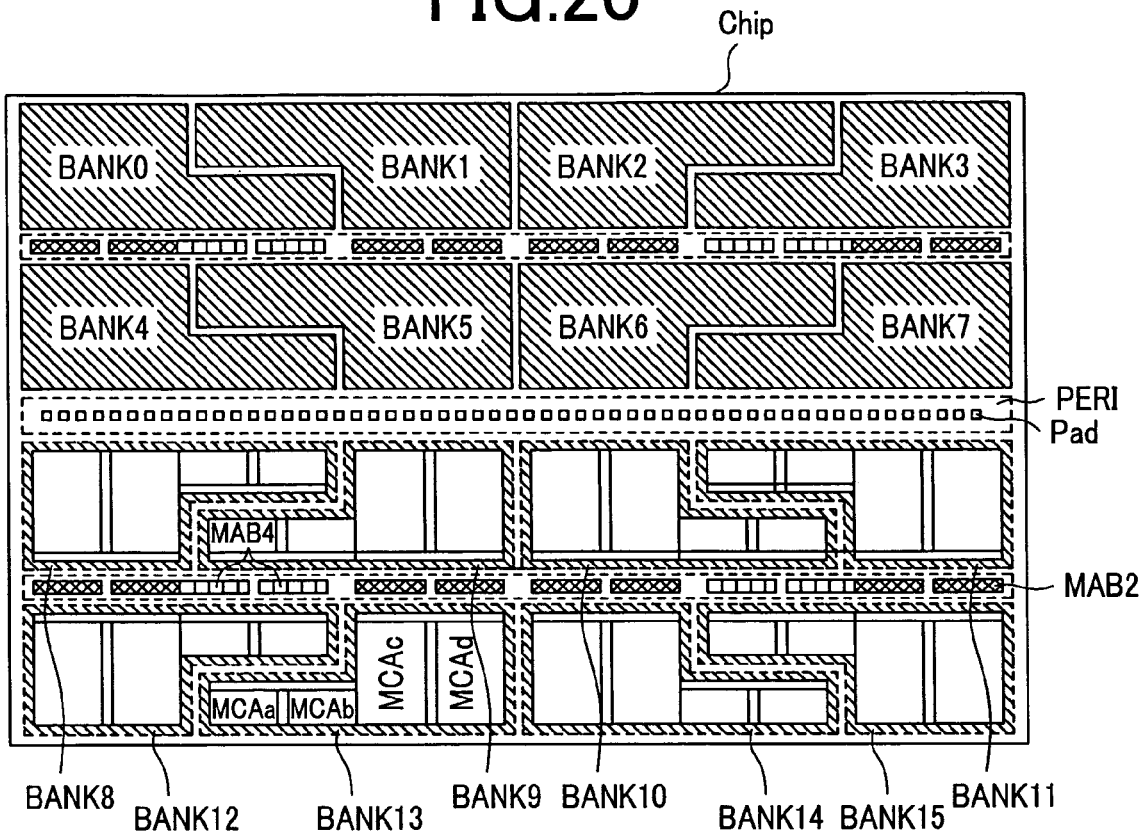
FIG. 20 is a layout view of memory blocks disposed in the chip according to a further modification of the first embodiment of the present invention.

A further modification of the first embodiment is shown in FIG. 20. In the present modification, unlike the configuration of FIG. 18 in which the main amplifier blocks MAB2s, MAB4s are arranged in the central section of the chip, each of these amplifier blocks is arranged between memory blocks. This arrangement offers advantages in that variations in wiring length of main IO lines between memory cell arrays are reduced and thus in that columnar cyclic operation, compared with that of FIG. 18, can be made fast. In the present configuration, the number of bit lines in each memory block of the configuration of FIG. 15 is reduced by half, and details are essentially the same as those shown in FIG. 15.

Second Embodiment

Figure 21:
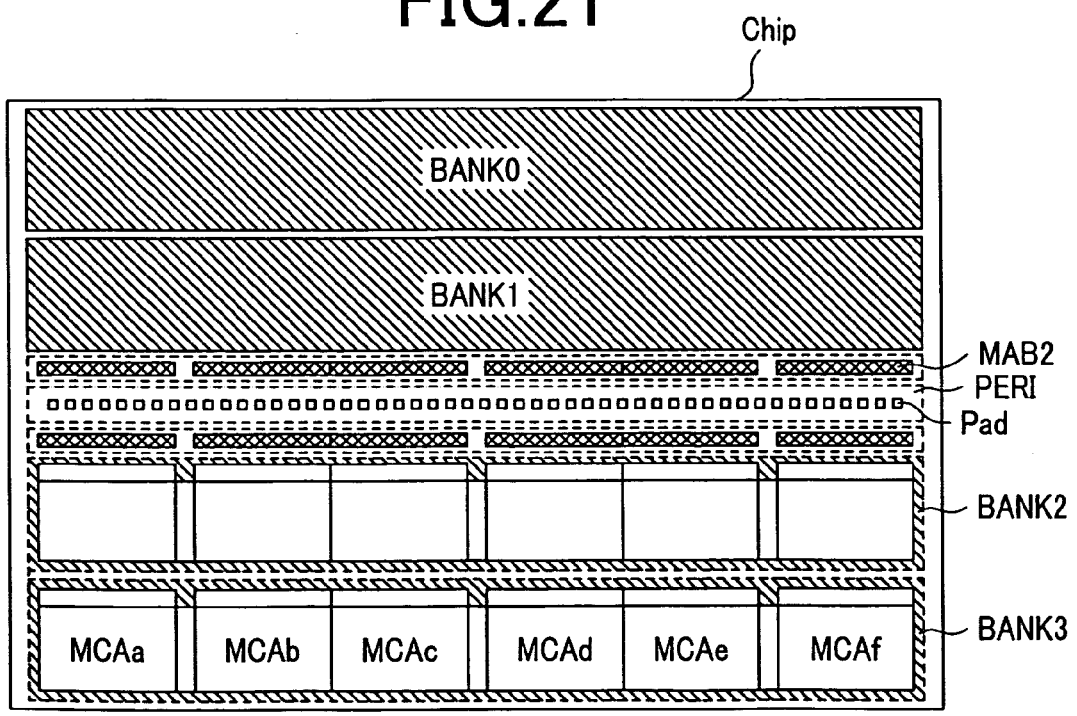
FIG. 21 is a layout view of memory blocks disposed in the chip according to a second embodiment of the present invention.

A second embodiment is described hereunder using FIG. 21. A chip of the present configuration is constructed of four memory blocks, BANK0, BANK1, BANK2, BANK3 stacked on one another in a short-side direction of the chip, a peripheral circuit region PERI, main amplifier blocks MAB2s, and other sections. Each memory block is, as shown in FIG. 39B, split into six memory cell arrays, MCAa, MCAb, MCAc, MCAd, MCAe, MCAf, which are almost equal to one another in the number of bit lines and in the number of word lines. Consider an example of splitting each memory block of FIG. 39B into 32 k word lines and 32 k bit lines. In this example, the memory cell arrays MCAa, MCAb, MCAe, MCAf may be constructed to form 5 k word lines each and 16 k bit lines in all, and the memory cell arrays MCAc, MCAd may be constructed to form 6 k word lines each and 16 k bit lines in all. It becomes possible to, by constructing the six memory cell arrays essentially equal in the number of word lines in this manner, to arrange each memory cell array over entire length of a long side of the chip for such layout of each block as in FIG. 21. The memory blocks can be formed into a 1:8 shape by arranging the split memory cell arrays laterally as shown in FIG. 21, and the chip can be formed into a 1:2 shape by stacking the four memory blocks. Configurations of each memory block and each memory cell array are essentially the same as those discussed in the foregoing description.

Also, circuit configuration of the main amplifier blocks MAB2s is as discussed in the foregoing description. Advantages of the present configuration are discussed below. Since each memory cell array is substantially the same in the number of word lines and in the number of bit lines, wiring length of Y-selection lines YS driven by Y-decoders, and the number of transistors connected become almost equal between the memory cell arrays. Consequently, variations in wiring length between the memory cell arrays are reduced, which makes columnar cyclic operation possible during fast operation. A 1:2 chip shape with stacked memory blocks can be formed by splitting the internal memory cell arrays of each memory block into six equal segments.

Figure 22:
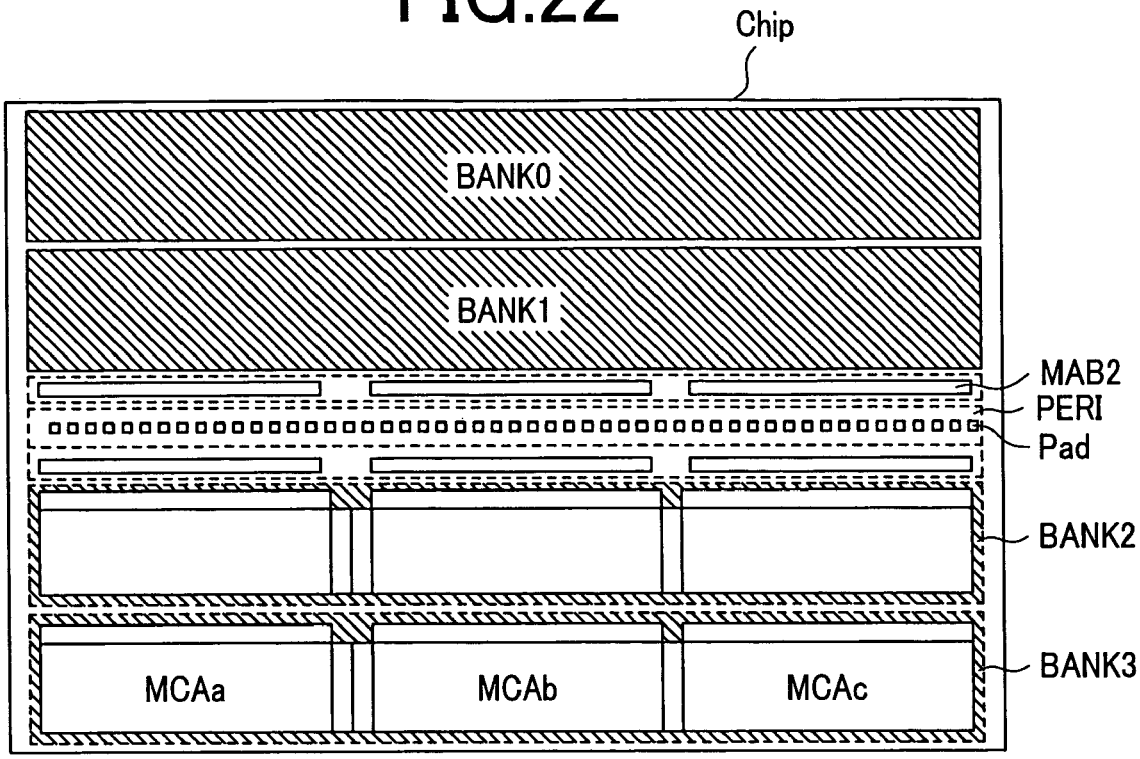
FIG. 22 is a layout view of memory blocks disposed in the chip according to a modification of the second embodiment of the present invention.
Figure 38B:
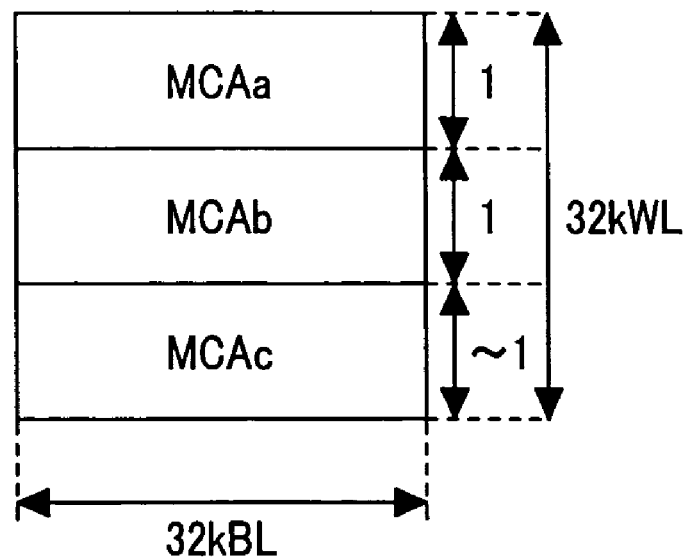

Next, a modification of the second embodiment is shown in FIG. 22. The present configuration has the advantage that for the same structural reasons as those relating to FIGS. 1 and 3, reducing the number of memory block splittings from six to three makes it possible to reduce the number of X-decoder circuits and hence to reduce the chip in area. How the chip is split into memory blocks in the present configuration is shown in FIG. 38B. As shown therein, memory cell arrays are constructed so that each is almost equal in the number of word lines. In FIG. 38B, for example, since one memory block has 32 k word lines, one possible way of splitting would be by constructing both memory cell arrays MCAa and MCAc of 11 k word lines and constructing a memory cell array MCAb of 10 k word lines. Memory blocks of a 1:8 shape can be constructed by arranging split memory cell arrays horizontally as shown in FIG. 22, and a 1:2 chip shape can be formed by stacking four memory blocks. Other aspects of the circuit configuration are as discussed in the foregoing description. Advantages of the present configuration are discussed below. In addition to the foregoing advantages of the second embodiment, the chip area can be reduced since it is possible to reduce the number of X-decoder circuits instead of increasing word line length.

Figure 23:
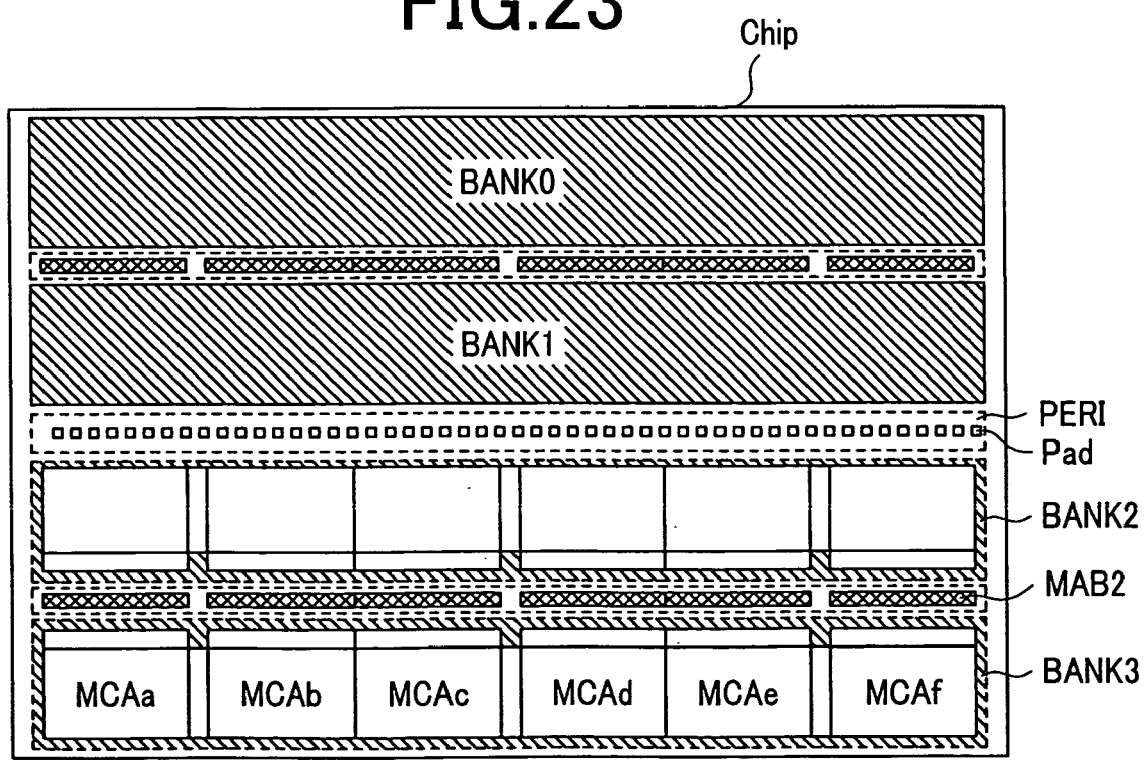
FIG. 23 is a layout view of memory blocks disposed in the chip according to another modification of the second embodiment of the present invention.

Another modification of the second embodiment is shown in FIG. 23. In the present configuration, the main amplifier blocks MAB2s arranged adjacently to the peripheral circuit region in a central region of the chip in the second embodiment described above are each disposed between memory blocks. How each of the memory blocks is split is, as shown in FIG. 39B, substantially the same as in FIG. 21. The configuration in FIG. 23, compared with that of FIG. 21, reduces wiring length of the main IO lines routed from memory cell arrays and makes it possible to reduce variations in wiring load between the memory cell arrays and thus to implement faster columnar cyclic operation. Other aspects of the circuit configuration are as described for the second embodiment above.

Figure 24:
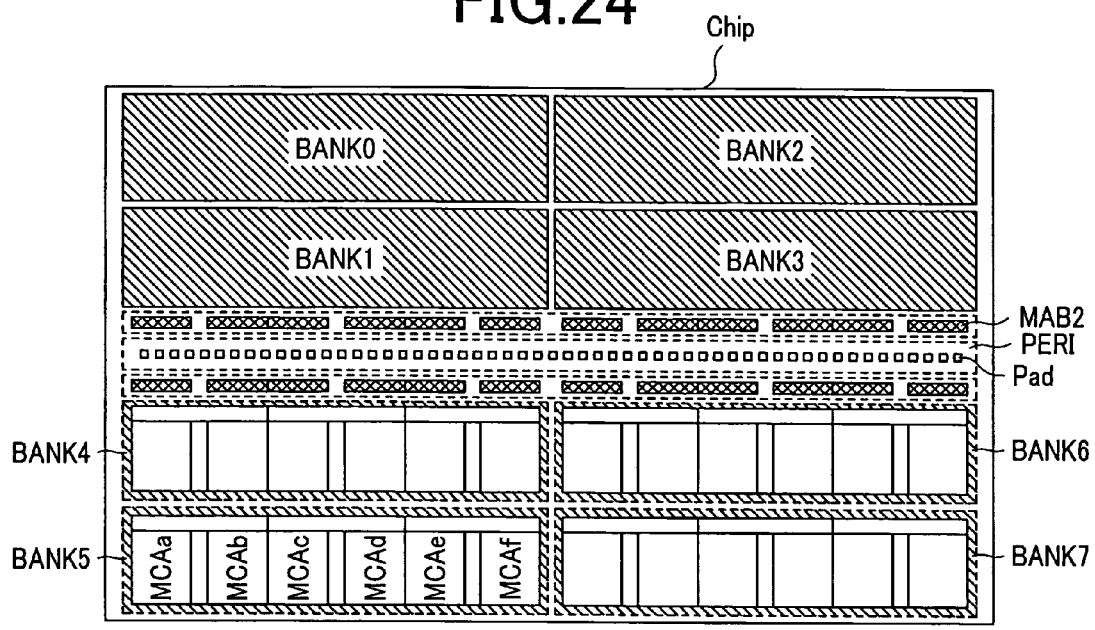
FIG. 24 is a layout view of memory blocks disposed in the chip according to yet another modification of the second embodiment of the present invention.

Next, yet another modification of the second embodiment is described below using FIG. 24. The chip shown in FIG. 24 is split into four segments in a short-side direction thereof and two segments in a long-side direction thereof, whereby the chip is constructed of eight memory blocks. Memory blocks BANK0 to BANK7 are all of a rectangular shape with an aspect ratio of 1:2. How each of the memory blocks is split is shown in FIG. 41B. In this splitting scheme, each memory block is split so that respective memory cell arrays MCAa, MCAb, MCAc, MCAd, MCAe, MCAf are equal to one another in the number of bit lines and are essentially equal in the number of word lines. In FIG. 41B, since one entire memory block has 32 k word lines, one possible way of splitting the memory block by way of example would be by constructing both memory cell arrays MCAa and MCAc of 11 k word lines and constructing a memory cell array MCAb of 10 k word lines. Arranging six such memory cell arrays horizontally to form the memory block BANK5 shown in FIG. 24, for example, makes it possible to form one memory block into a 1:2 shape. Additionally, arranging memory blocks of the 1:2 shape into such a form as in FIG. 24 makes it possible to form a 1:2 chip shape. This provides the advantages that the chip can be enclosed in a standard package and that during packaging, lead wires and bonding wires can be reduced in wiring pitch and easy wiring becomes possible. Furthermore, in the present modification, compared with the embodiment relating to FIG. 1, variations in wiring length of Y-selection signal lines between the memory cell arrays and in wiring load therebetween are reduced, so the present modification is suitable for high-speed columnar cyclic operation.

Figure 25:
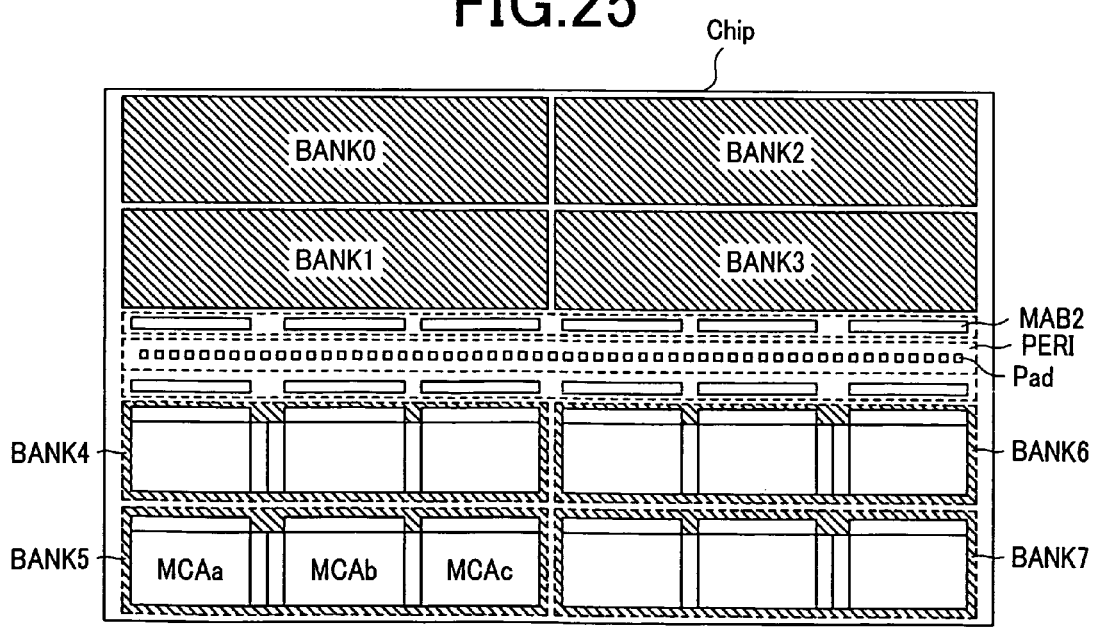
FIG. 25 is a layout view of memory blocks disposed in the chip according to a further modification of the second embodiment of the present invention.

Next, a further modification of the second embodiment is described below using FIG. 25. As with the chip of FIG. 24, the chip shown in FIG. 25 is split into four segments in a short-side direction thereof and two segments in a long-side direction thereof, whereby the chip is constructed of eight memory blocks. Memory blocks BANK0 to BANK7 are all of a rectangular shape with an aspect ratio of 1:2. How each of the memory blocks is split differs from that of FIG. 24, as shown in FIG. 40B. That is to say, each memory block is split into three segments so that respective memory cell arrays MCAa, MCAb, MCAc are essentially equal in the number of word lines.

In FIG. 40B, since one entire memory block has 32 k word lines, one possible way of splitting the memory block by way of example would be by constructing both memory cell arrays MCAa and MCAc of 11 k word lines and constructing a memory cell array MCAb of 10 k word lines. Arranging three such memory cell arrays horizontally to form the memory block BANK5 shown in FIG. 25, for example, makes it possible to form one memory block into a 1:2 shape.

Additionally, arranging memory blocks of the 1:2 shape into such a form as in FIG. 25 makes it possible to form a 1:2 chip shape. This provides the advantages that the chip can be enclosed in a standard package and that during packaging, lead wires and bonding wires can be reduced in wiring pitch and easy wiring becomes possible. Furthermore, in the present modification, compared with the embodiment relating to FIG. 1, variations in wiring length of Y-selection signal lines between the memory cell arrays and in wiring load therebetween are reduced, so the present modification is suitable for high-speed columnar cyclic operation.

Figure 26:
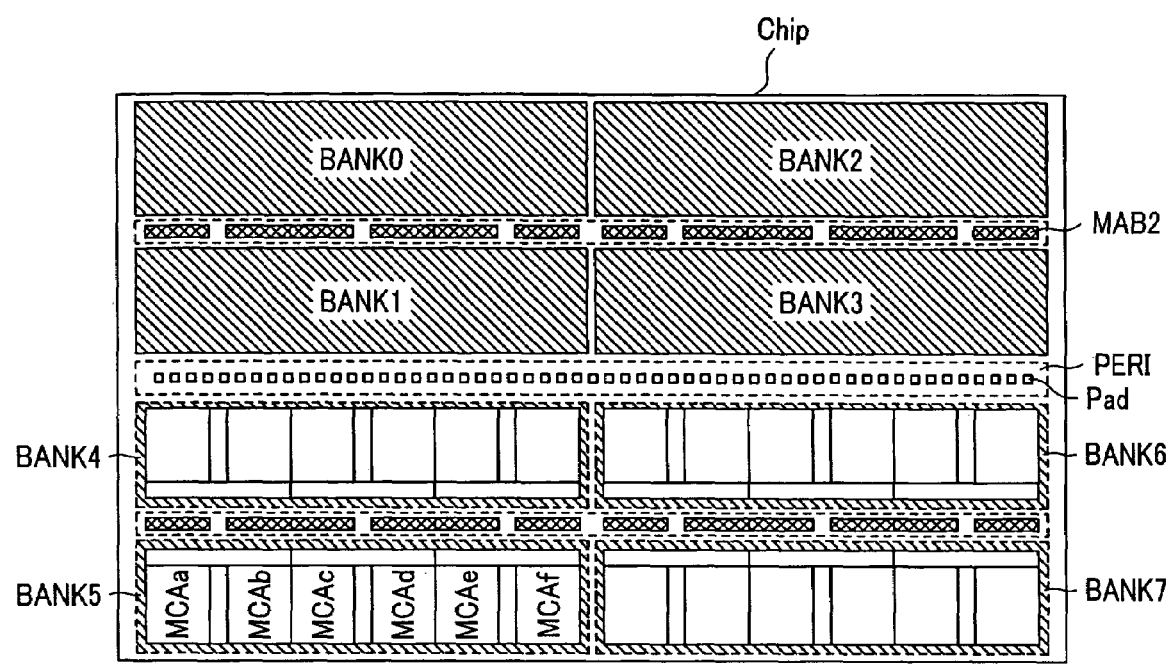
FIG. 26 is a layout view of memory blocks disposed in the chip according to a further modification of the second embodiment of the present invention.

Next, a further modification of the second embodiment is described below using FIG. 26. The configuration shown in FIG. 26 differs from the configuration of FIG. 24 in that the main amplifier blocks MAB2s arranged in the peripheral circuit region PERI in the latter configuration are each arranged between memory blocks. A method of splitting other memory blocks, and a method of arranging memory cell arrays are essentially the same as those shown in FIG. 24. In addition, arranging memory blocks of a 1:2 shape into such a form as in FIG. 25 makes it possible to form a 1:2 chip shape. This provides the advantages that the chip can be enclosed in a standard package and that during packaging, lead wires and bonding wires can be reduced in wiring pitch and easy wiring becomes possible. Furthermore, in the present modification, compared with the embodiment relating to FIG. 1, variations in wiring length of Y-selection signal lines between the memory cell arrays and in wiring load therebetween are reduced, so the present modification is suitable for high-speed columnar cyclic operation.

Figure 27:
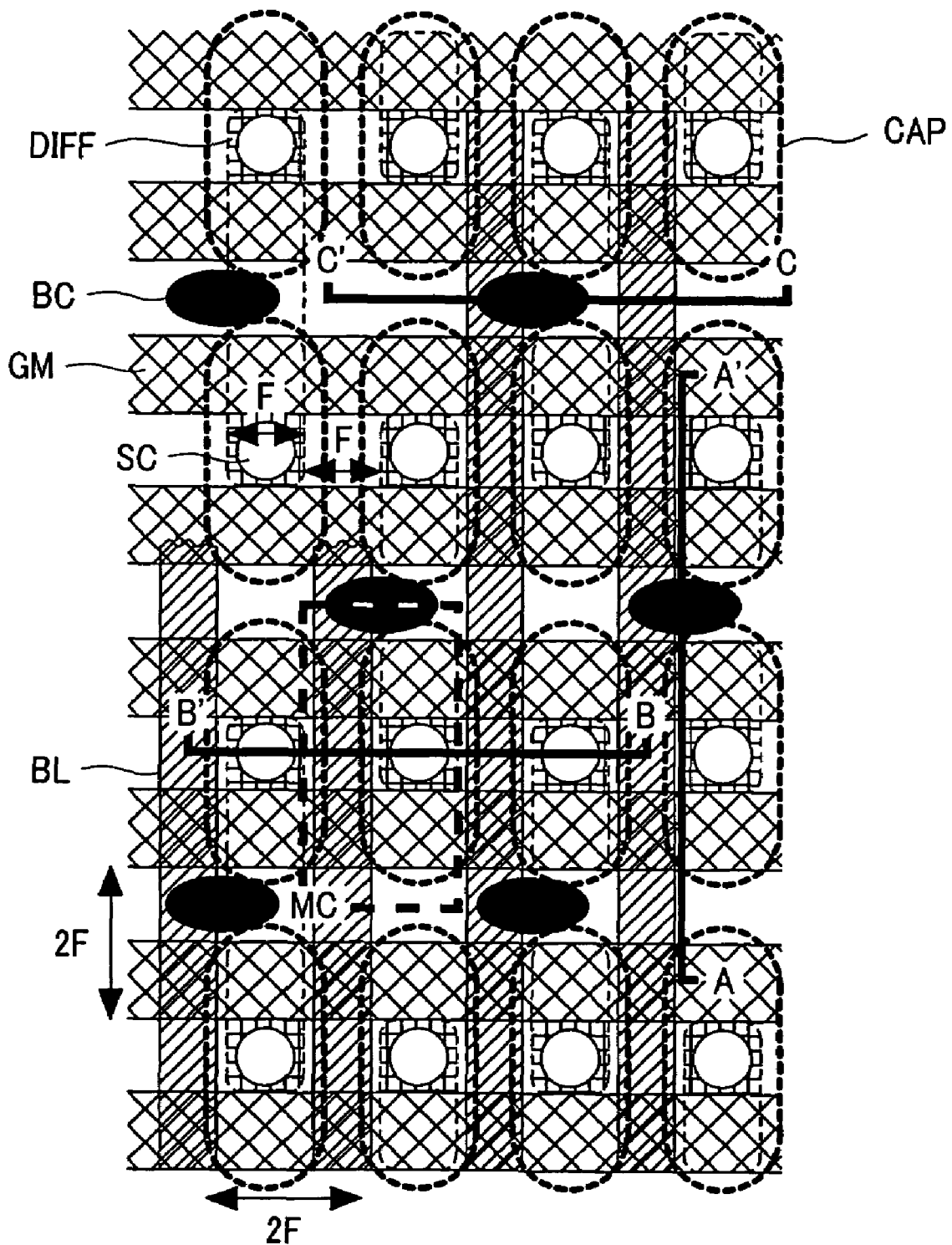
FIG. 27 shows an example of layout of memory cells in a DRAM which is applied to the present invention.

An example of memory cell layout of a DRAM which applies the present invention is shown in FIG. 27. This figure shows memory cells having a memory cell aspect ratio of 1:2 and a memory cell area of $8F^2$. This example of layout is characterized in that the coupling noise occurring during operation can be reduced because of a folded bit line configuration in which adjacent bit lines at one side constitute paired bit lines connected to a sense amplifier. If a minimum process dimension of the DRAM is expressed as F, word lines that use gate wiring layers GM are wired at pitches of 2F. Similarly, bit lines BL that use first metal wiring are also wired at 2F pitches. Diffusion layers DIFF are arranged in parallel with respect to bit lines, and are isolated for every two transistors. Gate length and gate width of the transistors are essentially equal to F. Bit line contacts BC are elliptic since memory cells MCs establish electrical contact with other memory cells MC that are adjacent to one another in a bit line direction, and with diffusion layers DIFF that are not directly below the bit lines BL sharing one bit line contact BC. A storage node contact SC is disposed on a diffusion layer DIFF that constitutes source-drain terminals of a transistor with respect to a bit line contact BC. The storage node contact SC is provided to establish electrical contact between an electrode at one side of a capacitor CAP for information storage, and a diffusion layer of a memory cell transistor. The memory cell capacitor CAP is formed at an aspect ratio of 1:2 to incorporate the memory cell layout.

Figure 28:
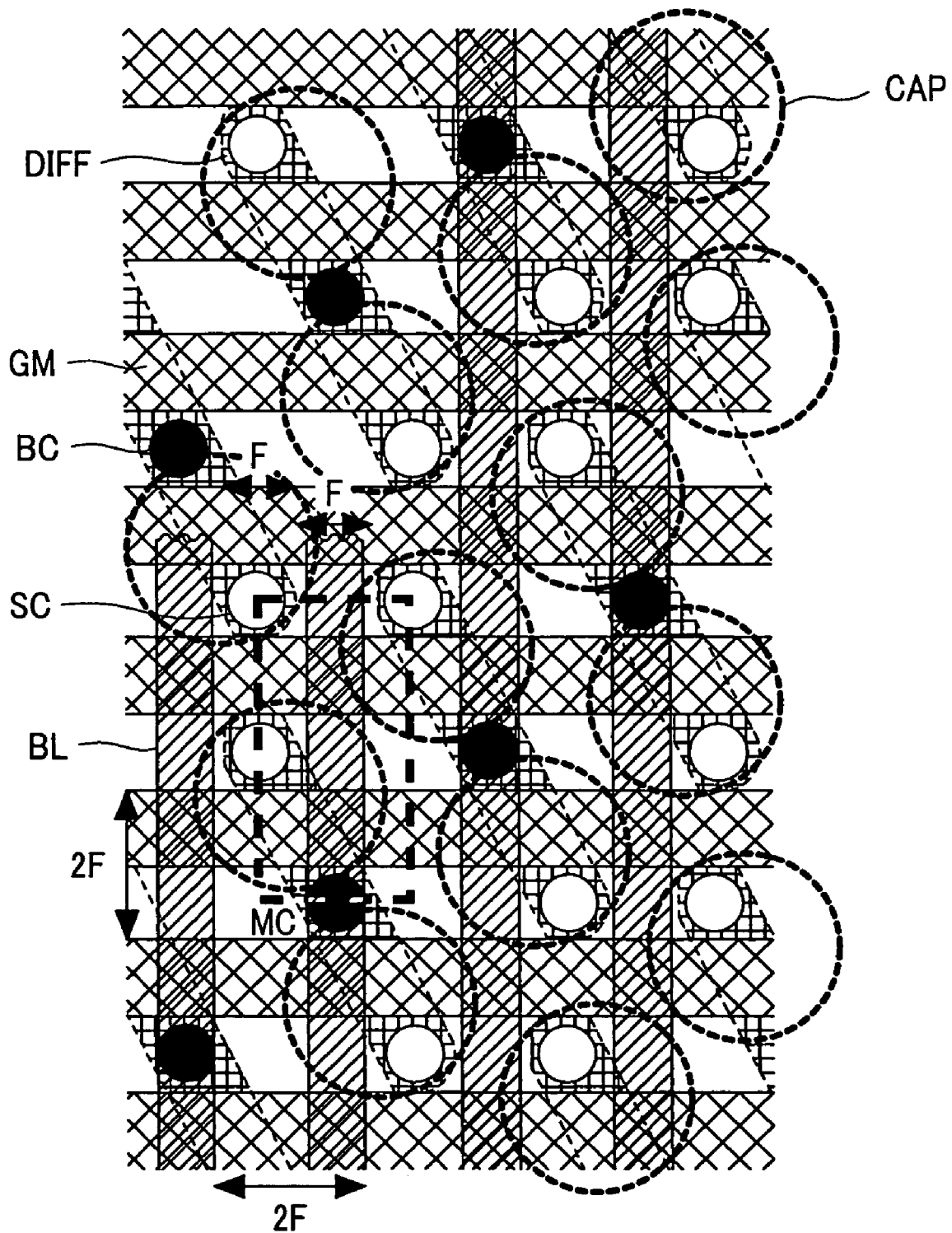
FIG. 28 shows another example of layout of memory cells in a DRAM which is applied to the present invention.

Another example of memory cell layout is shown in FIG. 28. This figure also shows memory cells having an effective memory cell aspect ratio of 1:2 and a memory cell area of $8F^2$. This example of layout is characterized in that simple circular bit line contacts SC can be formed, instead of the elliptic ones in FIG. 27, by arranging diffusion layers DIFF obliquely to word lines WL and bit lines BL, and in that gate width of memory cell transistors can be made about 1.4 times as large as F shown in FIG. 27. Additionally, since capacitors can be formed into circularity, the capacitors, even if fine-structured, are easy to be processed, compared with the capacitors in FIG. 27. Other structural aspects are essentially the same as for FIG. 27.

Next, a sectional view of a memory array is described below. A cross-sectional construction of the section A-A' shown in FIG. 27 is described using FIG. 29A. NMOS/PMOS transistors of a sense amplifier block SAM are also shown as a peripheral circuit region in FIG. 29A. The present configuration is an example in which capacitors CAP for storing information are disposed above bit lines. A configuration with capacitors disposed below a bit line-wiring layer can also be applied to the layout forms shown in FIGS. 27, 28. Memory cell array MCA is disposed in a P-type semiconductor region PWEL. As shown, this P-type semiconductor region PWEL is disposed above an N-type semiconductor region DWEL. The P-type semiconductor region PWEL and the N-type semiconductor region DWEL are disposed on a P-type substrate p-Sub using a technique such as impurities diffusion during a normal CMOS process. The P-type semiconductor region PWEL may be disposed directly on a P-type substrate p-Sub, instead of being disposed according to the present embodiment described above. The P-type semiconductor region PWEL is formed so that a desired substrate potential VBB is supplied at a sub-word driver block SWDB or a sense amplifier block SAB adjacent to the memory cell array MCA. In the figure, the substrate potential VBB is supplied by disposing a P-type diffusion region PDIFF with respect to the P-type semiconductor region PWEL in the P-type semiconductor region PWEL. In order to set a threshold voltage of a memory cell transistor to a desired voltage value, the substrate potential VBB uses a negative power supply if the memory cell transistor is an NMOS transistor. The P-type semiconductor region of the sense amplifier block SAB and the P-type semiconductor region of the memory cell array MCA may be electrically connected or electrically isolated. Common connection of both regions provides an area reduction effect since a region isolation area is unnecessary.

Conversely, if the P-type semiconductor region of the memory cell array MCA and the P-type semiconductor region of the sense amplifier block SAB are isolated in terms of potential, there is an advantage in that fast operation can be achieved since the substrate potential of the NMOS transistor in the sense amplifier block SAB can be set separately from that of the memory cell array MCA and since the sense amplifier transistor can be prevented from increasing in threshold voltage. Although this is not shown in the figure, a gate GM of the memory cell transistor is constructed of polysilicon doped with N-type impurities, the polysilicon being lined with tungsten (W), for example. Lining with tungsten (W) reduces resistance. A gate GN of the NMOS transistor in the sense amplifier block SAB or the sub-word driver block is also of the same construction. A gate GP of the PMOS transistor in the sense amplifier block SAB or the sub-word driver block, however, may be of the same construction as that of the gate GM of the above-described memory cell transistor or as the construction of the GN gate of the NMOS transistor, or may be constructed of polysilicon doped with P-type impurities, the polysilicon being lined with tungsten (W), for example, for reduced resistance. If the gate GP of the PMOS transistor is constructed of the polysilicon doped with N-type impurities, this will offer an advantage in that processes can be simplified.

If the gate GP of the PMOS transistor is constructed of the polysilicon doped with P-type impurities, this will offer an advantage in that since the transistor will be of a surface channel arrangement, the transistor can be improved in current-driving force and/or in short-channel characteristics.

Additionally, if the gate GM of the memory cell transistor is constructed at this time similarly to the gate of the PMOS transistor, the resulting significant difference in work function between the gate GM and the substrate will provide the advantage that the construction, compared with the construction based on the polysilicon doped with N-type impurities, makes it possible to set a high threshold voltage without doping with the impurities required for the substrate. The bit line contact BC and storage node contact SC disposed in a source or drain of the memory cell transistor is desirably formed in a self-matching manner with respect to the gate GM. This forming method makes it possible to shorten a distance between centers of the contacts and the gate GM, thus reducing the memory cell area and hence the chip area.

Figure 29A:
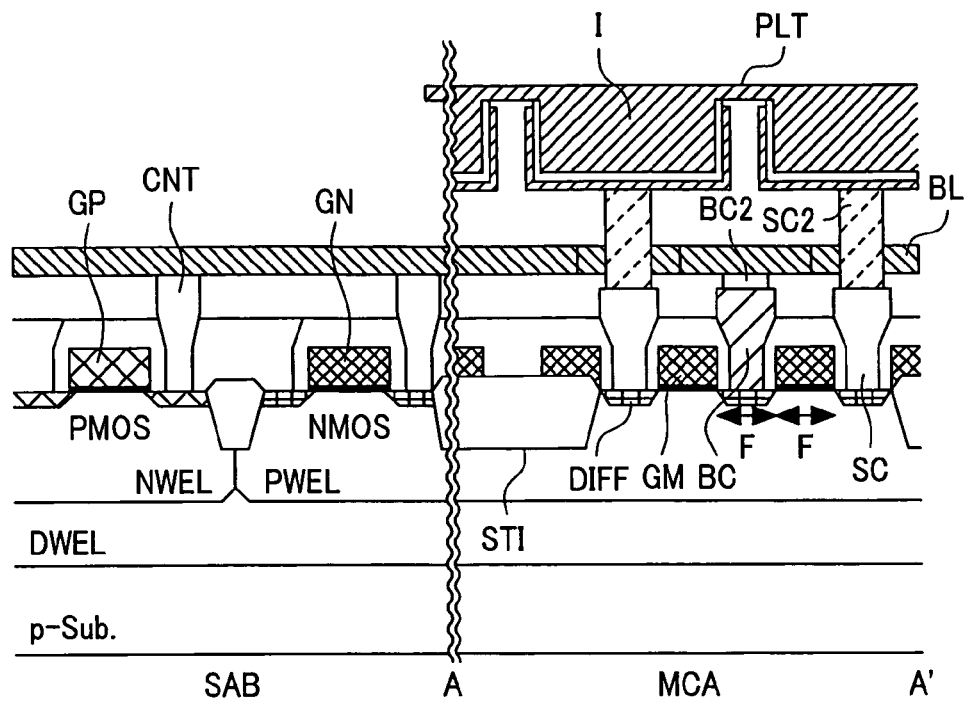
FIGS. 29A to 29C are cross-sectional views of a memory cell block and peripheral circuit block of a DRAM which is applied to the present invention.

The bit line contact BC and the storage node contact SC are also formed in a self-matching manner with respect to the diffusion layer, so the memory cell area can be reduced. In addition, both the bit line contact BC and the storage node contact SC may be simultaneously formed in one process, whereby processes can be simplified. Further, since either a bit line contact or a storage node contact is present in all diffusion layers, patterns of the diffusion layers can be used during formation of each bit line contact and each storage node contact. The bit line contact BC has on a second bit line contact BC2 disposed thereon. The second bit line contact BC2 has a bit line BL disposed thereon. For faster operation, the bit line is desirably constructed of a lower-resistance metal such as tungsten (W). The wiring layer used as the bit line BL on the memory cell array is also used as a bit line BL in the sense amplifier block SAB. In the sense amplifier block SAB, a contact CNT formed in a normal CMOS process is used to connect the diffusion layer and the bit line BL. The storage node contact SC has a second storage node contact SC2 disposed thereon. Since the second storage node contact SC2 is disposed between two bit lines, the contact SC2 is desirably formed in a self-matching manner with respect to the bit lines. Alternatively, the bit lines are desirably formed so that their wiring width is smaller than minimum process dimension F. A capacitor for storing information is formed on the second storage node contact SC2. Three-dimensional construction of the capacitor allows a surface area thereof to be increased for greater capacity. FIG. 29A shows concave-shaped capacitor construction. A high-permittivity material such as tantalum pentoxide ($Ta_2O_5$), silicon nitride (SiN), alumina (AlO), or hafnium oxide (HfO), is used in a dielectric layer of the capacitor, and electrodes with the dielectric layer interposed therebetween are formed of a metal such as titanium nitride (TiN) or ruthenium (Ru), or polysilicon (Poly-Si) or the like. An electrode at an opposite side to an electrode to which the storage node contact is connected is constructed of a common plate PLT on the memory cell array MCA. The plate PLT is desirably constructed of a lower-resistance material such as a metallic material. With this construction, it becomes possible to reduce bit line/word line noise due to any changes in plate power supply voltage that may be caused by operation of the memory cell array.

Figure 29B:
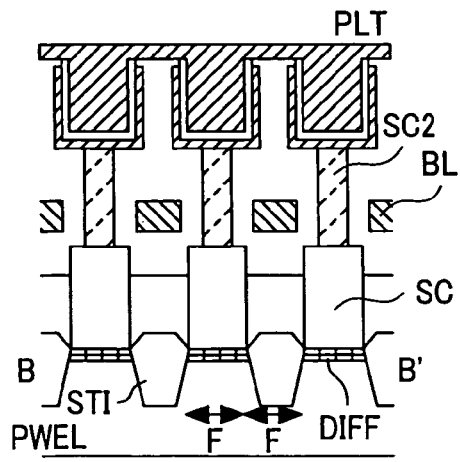
Figure 29C:
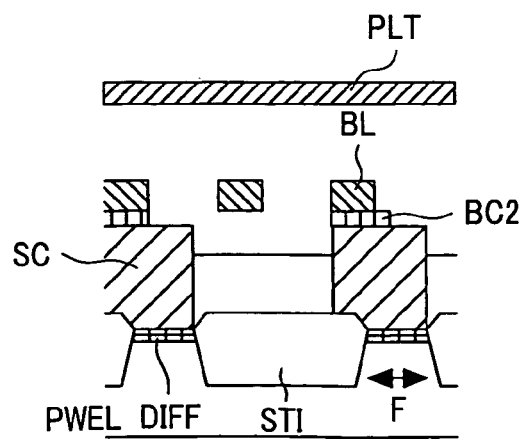

Sections B-B' and C-C' in FIG. 27 are shown by way of example in FIGS. 29B and 29C, respectively. Section B-B' extends through storage node contacts SC, SC2. As shown in FIG. 29A, a diffusion layer and an element isolation region STI are arranged at pitches of respective minimum process dimensions F. The storage node contacts SC are disposed on the diffusion layer whose width equals F. The bit line contacts BC, however, unlike the storage node contacts, are disposed at pitches of 4F as shown in FIG. 29B. The bit line contacts BC are disposed on a diffusion layer whose width equals F.

Figure 30A:
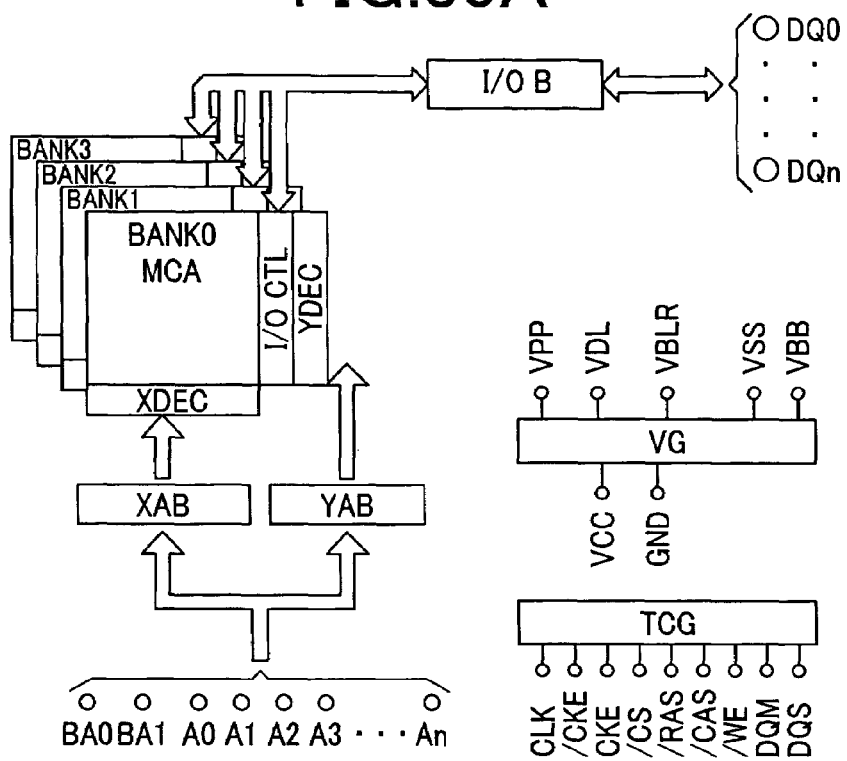
FIG. 30 is a block diagram of a DRAM chip of the present invention.
Figure 30B:
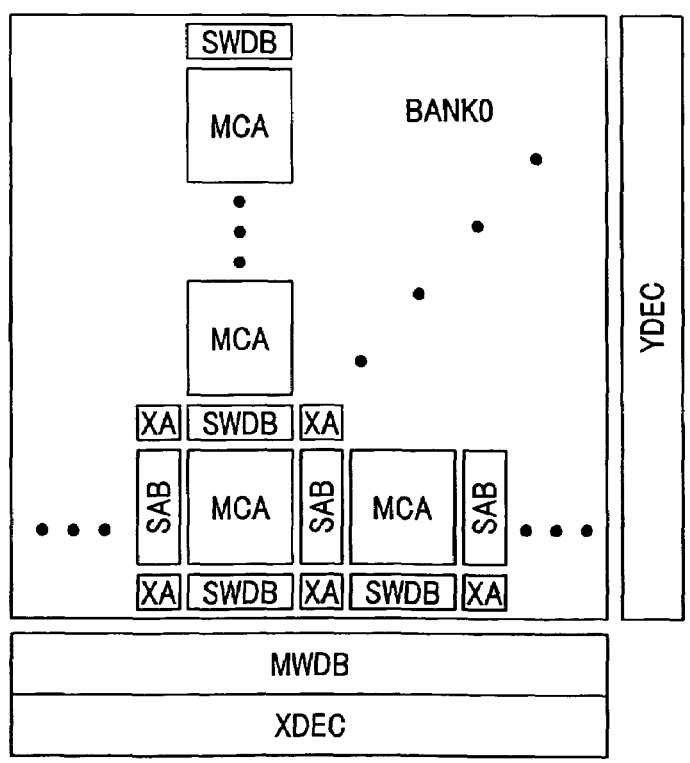

A chip configuration of a synchronous DRAM (SDRAM) which applies the present invention is described below. FIG. 30A is a total block diagram of the SDRAM. The present configuration can also be applied to a double data rate SDRAM (DDR-SDRAM) whose data rate is about twice that of the above SDRAM, and to a DDR2-SDRAM whose data rate is twice that of the DDR-SDRAM. Various circuit blocks operate in timing of internal control signals formed by a timing signal generator TCG to which control signals are input. The kinds of control signals input to the timing signal generator TCG include a chip selector signal CS, row address strobe signal RAS, a column address strobe signal CAS, and a write enable signal WE, all kinds of which signals being input in timing of a clock signal CLK. Combinations between these control signals and address signals are called commands. A clock enable signal CKE determines whether the clock signal is effective or ineffective. Also, an input/output masking signal DQM controls a data input/output buffer I/O B to mask the data that is input/output via input/output terminals (DQ0 to DQn). A power supply voltage generator VG supplies a word line voltage boosting level (VPP), a substrate potential (VBB), an array voltage (VDL), a peripheral circuit voltage (VCL), and more, to each circuit. The SDRAM employs an address-multiplexing scheme in which row addresses XA0, XA1, etc. up to XAn, and column addresses YA0, YA1, etc. up to YAn are input in a time sharing form from address input terminals (A0, A1, etc. up to An). The row address, XA0, XA1, . . . XAn, that has been input from the appropriate address input terminal to a row address buffer XAB is decoded by a row address decoder XDEC, and specific word lines in one memory array (MA) are selected. One word of memory cell space is correspondingly selected. When this is followed by input of a column address to a column address buffer YAB, a memory cell for reading or writing is further selected via a column address decoder YDEC. The SDRAM has a plurality of memory arrays (or memory banks) usually specified by bank addresses. For example, a 16-Mb SDRAM has two banks, and an SDRAM with a capacity of 64 Mb or more has four banks. If the SDRAM is a DDR-SDRAM, it has four banks, or if the SDRAM is a DDR2-SDRAM, it has four banks for a capacity of 512 Mb or less, or eight banks for a capacity of 1 Gb or more. One memory array MA (BANK0) is only shown as a typical example in FIG. 30A. FIG. 30B shows logical disposition of one memory block (bank) in a DRAM to which the present invention is applied. One bank in the DRAM is constructed of plural memory regions surrounded by an XDEC which selects word lines from a row address, and by a YDEC which selects a data line from a column address, the memory regions each including a plurality of sub-memory arrays (MCAs) arranged in a matrix form. Although not limited, these memory arrays employ a hierarchical word line scheme, in which a main word driver block MWDB is disposed on one side of the MA. Main word lines connected to the main word driver block MWDB are provided on an upper-level metallic wiring layer so as to span over more than one sub-memory array (SMA). Also, selection of data lines in a columnar direction employs a common Y-decoder scheme in which a plurality of Y-selection lines (YS lines) output from a Y-decoder YDEC are provided over more than one sub-memory array (SMA). The sub-memory array SMA here is indicative of a minimum memory array block surrounded by a sub-word driver block SWDB which includes a plurality of sub-word driver blocks SWDB, and by a sense amplifier block SAB including a plurality of sense amplifier circuits.

Figure 43:
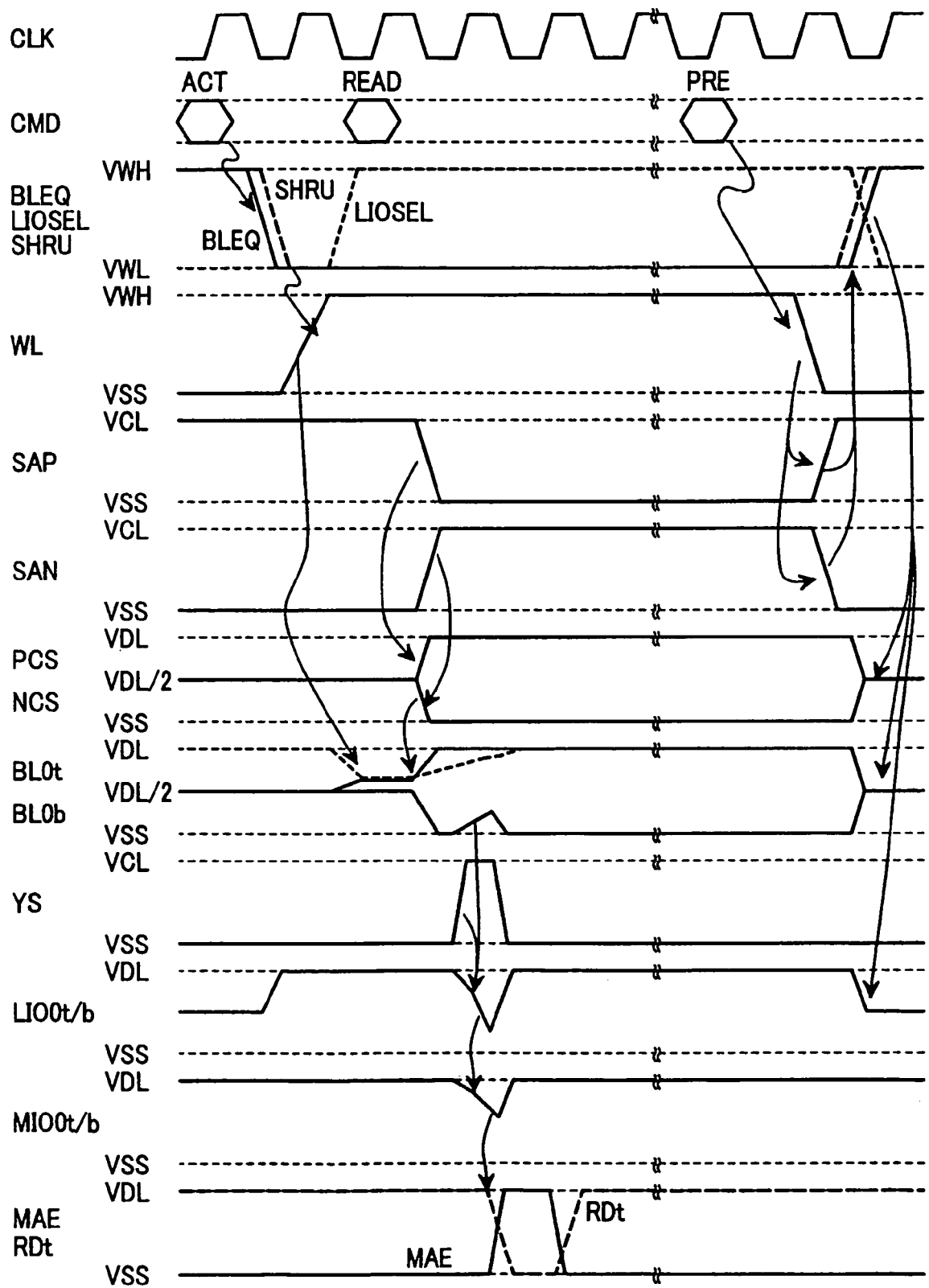
FIG. 43 is a diagram that shows readout operation timing in an array.

Memory array operation is described below using FIG. 43. FIG. 43 shows an example of a readout operation waveform of a semiconductor memory device which applies the present invention. When an active command ACT is input together with a row address, the address is internally decoded. This changes an activated bit line precharger signal BLEQ to an deactivated state in the sense amplifier block of the associated address. In this case, since an associated precharger PC is constructed of an NMOS, the activated precharger state changes from a high potential level, for example, a word line voltage-boosting power supply voltage level VWH or a bit line amplitude voltage level VDL, to a ground level VSS. This change stops bit line precharging of the appropriate memory cell array and common source line precharging of the sense amplifier block. Word lines associated with the input address are next selected.

At this time, the word lines WL change from their standby level, for example, the ground level VSS, to the word line selection level VWH. Accordingly, gates of two transistors in the memory cell MC are selected, the appropriate storage node SN and bit line are connected, and data of the memory cell is read out onto the bit line. FIG. 43 indicates that data associated with an 'H' (high) level is saved in the memory cell storage node SN. At this time, the bit line is released from its precharging level and increased in voltage according to an electrical charge that has been stored within the storage node SN. When the bit line is activated, after a required period has elapsed, the NMOS sense amplifier activation signal SAN changes from the ground level VSS of the non-selected state to the high potential level VDL of the activated state, the word line voltage level VWH, or the like, whereby a cross coupler of the NMOS is activated. At essentially the same time, the cross coupler is activated, or with a delay behind this, a PMOS sense amplifier activation signal SAP changes from a high potential level VDL of a non-selected state or a word line voltage level VWH to a ground level VSS of an activated state, whereby a cross coupler of the PMOS is activated.

Thus, the very weak signal voltage that has been developed at the bit line is amplified to a bit line amplitude voltage. Simultaneously with or prior to an arrival of the bit line amplitude at a sufficient value, input of a column command becomes possible. An example of input of a readout command READ from outside is shown in FIG. 43. A column address to be read out is input simultaneously with input of the readout command READ. After the readout command has been input, a Y-selection line YS selected by a Y-decoder changes from a ground level VSS of a standby state to, for example, a bit line amplitude voltage level VDL of a selected state according to the simultaneously input address, and thus the Y-selection line is activated. Data that has been held in the sense amplifier is read out onto a local IO line LIOt/b. After this, the data is output, although not shown in FIG. 43, to outside via a main amplifier and an input/output section. Next, the operation occurring when a precharging command PRE is input is described hereunder. When the precharging command is input under a command input waiting state of the memory device, the selected word lines change to the word line standby level of their non-selected state. This change returns the sense amplifier activation signals SAN, SAP to the non-selected state. After the sense amplifier has been deactivated, the bit line precharger signal BLEQ is activated to set all bit lines and reference bit lines of the activated memory cell array MCA to the bit line-precharging level. In FIG. 43, the bit line-precharging level is set to be equal to VDL/2 that is ½ of the bit line amplitude voltage level. The precharging sequence is now completed.

Figure 44:
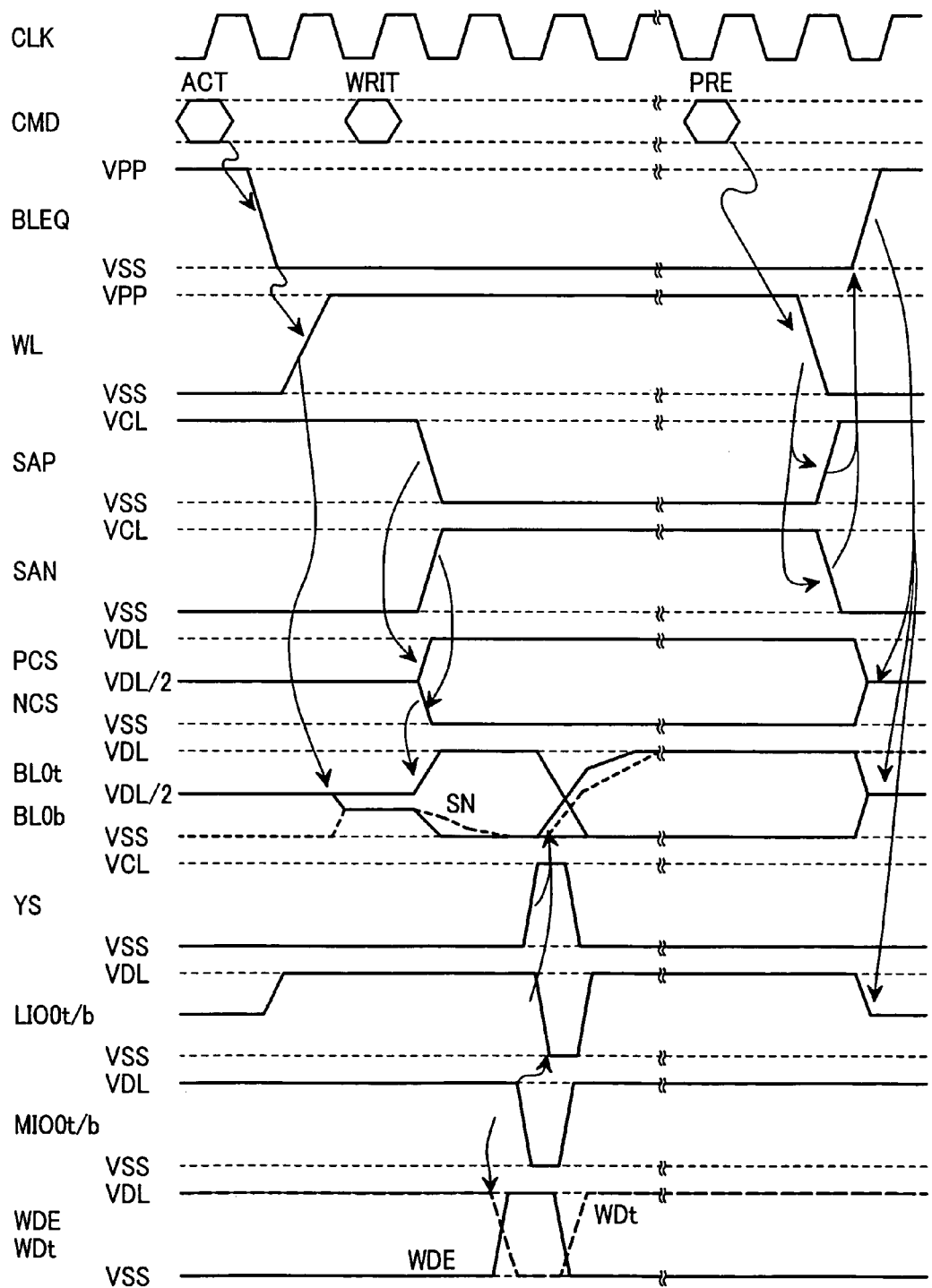
FIG. 44 is a diagram that shows write operation timing in an array.
Figure 45A:
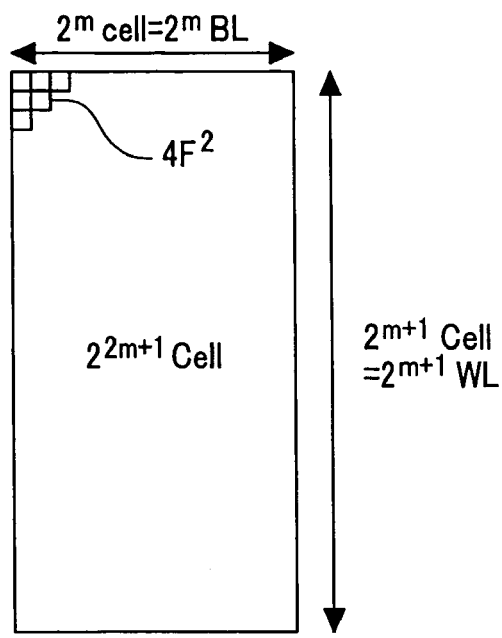
FIG. 45 is a diagram that shows the number of cells and a memory array shape.
Figure 45B:
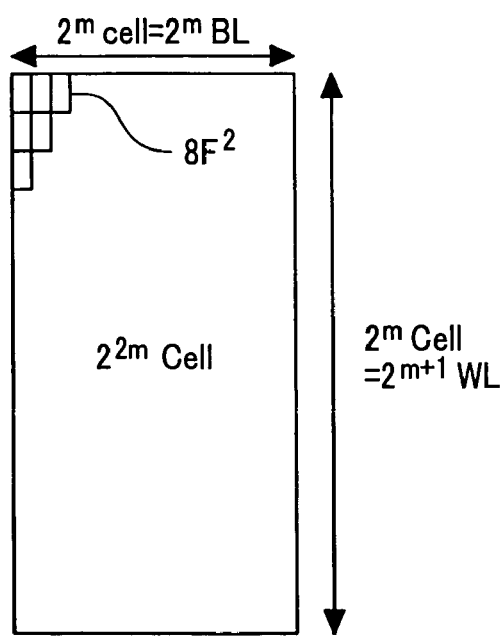

Next, write operation is described below using FIG. 44. The operational sequence from completion of input of an active command to activation of a sense amplifier and before a start of input of a column address is the same as for the readout operation described above. For the write operation, a write command WRIT and a write address are input at the same time during column access. Also, write data is input simultaneously with input of the command and the address or at a rising edge or falling edge of the clock signal after one clock cycle of time. The write data is input from an input/output pin DQ, then sent from an input buffer to a write amplifier WD via a global IO line WGIOt, and further transferred from the write amplifier WD to a main IO line MIOt/b and a local IO line LIOt/b. The transferred data is written into the sense amplifier circuit connected to an associated write cell, via the Y-selection line YS selected according to the write address that was input together with the write command. In accordance with the data written from the local IO line LIOt/b, the sense amplifier drives appropriate bit lines and writes the data into the storage node of the memory cell. FIG. 15 is a waveform diagram showing an example of writing 'H' data into a cell associated with readout data 'L'. Internal operation of the memory device after the precharging command has been input thereto is the same as the operation discussed in the description of the above readout operation.

A voltage relationship in the present embodiment is next described below. A desirable external power supply voltage is 2.6 V or less. The bit line amplitude voltage VDL is desirably controlled below 1.5 V. These offer advantages in that bit line charging and discharging current levels can be reduced and in that it becomes unnecessary to provide an internal voltage boosting power supply circuit for decreases in external voltage VCC. The word line voltage boosting power supply voltage VWH is desirably about 1.7 V higher than the bit line amplitude voltage. Reducing the word line voltage boosting power supply voltage has advantages in that reliability of the memory cell transistors can be improved and in that the voltage boosting power supply circuit block can be reduced in area. The word line non-selection voltage is desirably controlled to about the ground level VSS or to nearly a negative power supply voltage, −0.5 V. Use of a negative power supply makes it possible to reduce the word line voltage boosting power supply voltage VWH. The use of the negative power supply also makes it possible to reduce sub-threshold leakage current levels of the memory cell transistors under the non-selected state of the word lines, and thus to achieve improvement in retention time and hence, reduction in standby power consumption.

Explanation of the reference numbers and symbols used in the drawings accompanying the present application is show below. BANK0, BANK1, BANK2, BANK3, BANK4, BANK5, BANK6, BANK7, BANK8, BANK9, BANK10, BANK11, BANK12, BANK13, BANK14, BANK15, . . . Memory cell blocks MAB, MAB2, MAB4 . . . Main amplifier CA, MCAa, MCAb, MCAc, MCAd, MCAe, MCAf . . . Memory cell arrays, SMA . . . Sub-memory array, Chip . . . Chip, PKG . . . Package, LEAD . . . Lead frame, WIRE . . . Bonding wire, Pad . . . Pad, PERI . . . Peripheral circuit region, MIOa, MIOb, MIOc, MIOd, MIOe, MIOf, MIO0t/b, MIO1t/b, . . . , MIOnt/b, MIO0(0)t/b, . . . MIOn(0)t/b, MIO0(1)t/b, . . . , MIOn(1)t/b, MIO0(2)t/b, . . . , MIOn(2)t/b, MIO0(3)t/b, . . . , MIOn(3)t/b . . . Main IO lines, YS, YSa, YSb, YSc, YSd, YSe, YSf . . . Y-selection lines, XDEC, XDECa, XDECb, XDECc, XDECd, XDECe, XDECf . . . X-decoders, YDEC, YDECa, YDECb, YDECc, YDECd, YDECe, YDECf . . . Y-decoders, CC . . . Cross coupler, PC . . . Bit line precharger, SHR . . . Shared gate, IOG . . . IO gate, BL, BL0t, BL0b, BL1t, BL1b . . . Bit lines in sense amplifier, BLA0, BLA1, BLA2, BLA3, BLA4, BLA5, BLA6, BLA7 . . . Bit lines in array, MC . . . Memory cell, SN . . . Storage node, LIO0t/b, LIO1t/b . . . Local IO lines, SAP, SAN . . . Sense amplifier activation signals, PCS, NCS, Common source lines, BLEQ . . . Bit line equalize signal, SHRU, SHRD . . . Shared gate signal, VBLR . . . Bit line precharging level, WL0, WL1, WL2, WL3, WL4 . . . Word lines, SAB . . . Sense amplifier block, VSS . . . Ground level, VDL . . . Array voltage, LIOSEL . . . Local IO/main IO connect signal, F . . . Minimum process dimension, SC . . . Storage node contact, BC . . . Bit line contact, DIFF . . . Diffusion layer, GM . . . Gate wiring, CAP . . . Memory cell capacitor, PLT . . . Plate, BC2 . . .

Second bit line contact, SC2 . . . Second storage node contact, STI . . . Element isolation, DWEL . . . Substrate NWELL region, p-Sub . . . p-type substrate region, NMOS . . . N-type MOS transistor, PMOS . . . P-type MOS transistor, NWEL . . . N-type substrate region, PWEL . . . P-type substrate region, IOCTL . . . Input/output data controller, I/O B . . . Input/output buffer, XAB . . . X-address buffer, YAB . . . Y-address buffer, A0, . . . , An . . . Addresses, DQ0, . . . , DQn . . . Input/output pins, VPP . . . Word line voltage, VBB . . . Substrate potential, GND . . . Ground level, CLK . . . Clock, CKE, /CKE . . . Clock enable signals, /CS . . . Chip select signal, /RAS, /CAS . . . Command pins, /WE . . . Write enable signal, DQM . . . Data mask, DQS . . . Data strobe signal, SWDB . . . Subword driver block, XA . . . Cross area, MWDB . . . Main word driver block, DAMP, DAMP2, DAMP4 . . . Readout data amplifiers, WDEDEC2, WDEDEC4 . . . Write enable signal decoders, MIOSELDEC2, MIOSELDEC4 . . . Main IO select signal decoders, MIOEQDEC2, MIOEQDEC4 . . . Main IO equalize signal decoders, MAEQ . . . Main amplifier equalize signal, MAE . . . Main amplifier enable signal, WDE . . . Write amplifier enable signal, MIOEQ . . . Main IO equalize signal, BKS0 . . . Memory block-0 select signal, BKS1 . . . Memory block-1 select signal, BKS2 . . . Memory block-2 select signal, BKS3 . . . Memory block-3 select signal, WDE0, WDE1, WDE2, WDE3 . . . Memory block-0, -1, -2, -3 write amplifier enable signals, . . . MIOSEL0, MIOSEL1, MIOSEL2, MIOSEL3 . . . Memory block-0, -1, -2, -3 main IO line selection signals, MIOEQ0, MIOEQ1, MIOEQ2, MIOEQ3 . . . Memory block-0, -1, -2, -3 main IO equialize signals, RGIO(n:0> . . . Read global IO line, WGIO<n:0) . . . Write global IO line, MIOS, MIOS2, MIOS4 . . . Main IO selectors, WD . . . Write amplifier, MIOPC . . . Main IO equalizer, RMA . . . Read main amplifier, St, Sb . . . Read main amplifier internal nodes, RDt . . . Read main amplifier output node, WD . . . Write amplifier data input.

What is claimed is:

1. A semiconductor memory device comprising:
   a plurality of word lines;
   a plurality of bit lines each intersecting the plurality of word lines;
   a plurality of memory cells each arranged at a desired crossing point between any one of the plurality of word lines and any one of the plurality of bit lines;
   first and second memory arrays of a rectangular shape, inclusive of the plurality of memory cells, both the first and second memory arrays having a first memory capacity;
   third and fourth memory arrays of a rectangular shape, inclusive of the plurality of memory cells, both the third and fourth memory arrays having a second memory capacity smaller than the first memory capacity;
   a first memory block including the first and third memory arrays;
   a second memory block including the second and fourth memory arrays; and
   first and second bank addresses for selecting the first and second memory blocks, respectively,
   wherein:
   the first memory block forms an L shape by being disposed such that the third memory array has one side shorter than and opposed to one side of the first memory array;
   the second memory block forms an L shape by being disposed such that the fourth memory array has one side shorter than and opposed to one side of the second memory array; and
   the third and fourth memory arrays are arranged between the first and second memory arrays such that respective long sides of the third and fourth memory arrays face each other, and the first and second memory blocks are arranged so as to be point-symmetrical with respect to each other.

2. The semiconductor memory device according to claim 1, wherein:
   the first memory array further includes a first column decoder;
   the second memory array further includes a second column decoder;
   the third memory array further includes a third column decoder; and
   the first column decoder, the second column decoder, and the third column decoder are arranged on the same straight line.

3. The semiconductor memory device according to claim 2, further comprising:
   a plurality of first input/output lines each for receiving/ sending a plurality of pieces of data from/to the first memory array;
   a plurality of second input/output lines each for receiving/ sending a plurality of pieces of data from/to the second memory array;
   a plurality of third input/output lines each for receiving/ sending a plurality of pieces of data from/to the third memory array;
   a plurality of fourth input/output lines each for receiving/ sending a plurality of pieces of data from/to the fourth memory array;
   a first data amplifier block including a plurality of first data amplifiers arranged adjacently to the first column decoder;
   a second data amplifier block including the plurality of first data amplifiers arranged adjacently to the second column decoder; and
   a third data amplifier block including a plurality of second data amplifiers arranged adjacently to the third column decoder;
   wherein:
   any one of the first input/output lines are connected to the first data amplifier block;
   any one of the second input/output lines are connected to the second data amplifier block;
   any one of the third input/output lines and the fourth input/ output lines are connected to the third data amplifier block; and
   any one of the third input/output lines and any one of the fourth input/output lines are selected using the first and second bank addresses, respectively, and connected to the second data amplifier block.

4. The semiconductor memory device according to claim 2, further comprising:
   a first row decoder disposed in the same direction as that of a short side of the third memory array and at a position where the memory capacity of the first memory array is bisected;
   a second row decoder disposed in the same direction as that of a short side of the fourth memory array and at a position where the memory capacity of the second memory array is bisected;
   a third row decoder disposed in the same direction as that of the short side of the third memory array and at a position where the memory capacity of the third memory array is bisected; and a fourth row decoder disposed in the same direction as that of the short side of the fourth memory array and at a position where the memory capacity of the fourth memory array is bisected.

5. The semiconductor memory device according to claim 2, wherein:
the first memory array further includes a first row decoder;
the second memory array further includes a second row decoder;
the third memory array further includes a third row decoder; and
the fourth memory array further includes a fourth row decoder;
wherein:
the first row decoder and the third row decoder are arranged adjacently to each other; and
the second row decoder and the fourth row decoder are arranged adjacently to each other.

6. The semiconductor memory device according to claim 1, further comprising:
fifth and sixth memory arrays of a rectangular shape, both having a memory capacity equal to the first memory capacity;
seventh and eighth memory arrays of a rectangular shape, both having a memory capacity equal to the second memory capacity;
a third memory block including the fifth and seventh memory arrays;
a fourth memory block including the sixth and eighth memory arrays; and
third and fourth bank addresses for selecting the third and fourth memory blocks, respectively;
wherein:
the seventh and eighth memory arrays are arranged between the fifth and sixth memory arrays such that respective long sides of the seventh and eighth memory arrays face each other;
the third memory block forms an L shape by having the seventh memory array disposed with a short side opposed to one side of the fifth memory array;
the fourth memory block forms an L-shape by having the eighth memory array disposed with a short side opposed to one side of the sixth memory array; and
the third and fourth memory blocks are arranged so as to be point-symmetrical with respect to each other.

7. The semiconductor memory device according to claim 6, wherein:
the first and second memory blocks and the third and fourth memory blocks are arranged at positions horizontally symmetrical to one another via a circuit group which includes a peripheral circuit.

8. The semiconductor memory device according to claim 7, further comprising:
a plurality of first input/output lines each for receiving/sending a plurality of pieces of data from/to the first memory array;
a plurality of second input/output lines each for receiving/sending a plurality of pieces of data from/to the second memory array;
a plurality of third input/output lines each for receiving/sending a plurality of pieces of data from/to the third memory array;
a plurality of fourth input/output lines each for receiving/sending a plurality of pieces of data from/to the fourth memory array;
a plurality of fifth input/output lines each for receiving/sending a plurality of pieces of data from/to the fifth memory array;
a plurality of sixth input/output lines each for receiving/sending a plurality of pieces of data from/to the sixth memory array;
a plurality of seventh input/output lines each for receiving/sending a plurality of pieces of data from/to the seventh memory array;
a plurality of eighth input/output lines each for receiving/sending a plurality of pieces of data from/to the eighth memory array;
a first data amplifier block including a plurality of first data amplifiers;
a second data amplifier block including the plurality of first data amplifiers; and
a third data amplifier block including a plurality of second data amplifiers;
wherein:
any one of the first input/output lines and any one of the fifth input/output lines are connected to the first data amplifier block;
any one of the second input/output lines and any one of the sixth input/output lines are connected to the second data amplifier block; and
any one of the third input/output lines, any one of the fourth input/output lines, any one of the seventh input/output lines, and any one of the eighth input/output lines are connected to the third data amplifier block.

* * * * *